(12) United States Patent
Umezaki

(10) Patent No.: US 12,361,906 B2
(45) Date of Patent: Jul. 15, 2025

(54) DRIVER CIRCUIT, DISPLAY DEVICE, AND ELECTRONIC DEVICE

(71) Applicant: SEMICONDUCTOR ENERGY LABORATORY CO., LTD., Atsugi (JP)

(72) Inventor: Atsushi Umezaki, Kanagawa (JP)

(73) Assignee: Semiconductor Energy Laboratory Co., Ltd., Atsugi (JP)

( * ) Notice: Subject to any disclaimer, the term of this patent is extended or adjusted under 35 U.S.C. 154(b) by 0 days.

(21) Appl. No.: 18/522,347

(22) Filed: Nov. 29, 2023

(65) Prior Publication Data
US 2024/0169951 A1 May 23, 2024

Related U.S. Application Data

(63) Continuation of application No. 18/120,489, filed on Mar. 13, 2023, now Pat. No. 11,837,189, which is a
(Continued)

(30) Foreign Application Priority Data

Jun. 17, 2008 (JP) .................... 2008-157400

(51) Int. Cl.
*G11C 19/28* (2006.01)
*G09G 3/36* (2006.01)
(Continued)

(52) U.S. Cl.
CPC ......... *G09G 3/3677* (2013.01); *G09G 3/3648* (2013.01); *G11C 19/184* (2013.01);
(Continued)

(58) Field of Classification Search
CPC .... G11C 19/184; G11C 19/28; G09G 3/3677; G09G 2310/0286
See application file for complete search history.

(56) References Cited

U.S. PATENT DOCUMENTS 4,104,860 A 8/1978 Stickel
4,123,671 A 10/1978 Aihara et al.
(Continued)

FOREIGN PATENT DOCUMENTS

CN 001320760 C 6/2007
EP 0535569 A 4/1993
(Continued)

OTHER PUBLICATIONS

Korean Office Action (Application No. 2009-0051294) Dated Feb. 23, 2015.
(Continued)

*Primary Examiner* — Patrick O Neill
(74) *Attorney, Agent, or Firm* — Fish & Richardson P.C.

(57) ABSTRACT

To suppress malfunctions in a shift register circuit. A shift register having a plurality of flip-flop circuits is provided. The flip-flop circuit includes a transistor 11, a transistor 12, a transistor 13, a transistor 14, and a transistor 15. When the transistor 13 or the transistor 14 is turned on in a non-selection period, the potential of a node A is set, so that the node A is prevented from entering into a floating state.

12 Claims, 26 Drawing Sheets

Related U.S. Application Data continuation of application No. 17/862,464, filed on Jul. 12, 2022, now Pat. No. 11,620,962, which is a continuation of application No. 17/190,945, filed on Mar. 3, 2021, now Pat. No. 11,455,968, which is a continuation of application No. 16/812,604, filed on Mar. 9, 2020, now Pat. No. 10,971,103, which is a continuation of application No. 16/176,016, filed on Oct. 31, 2018, now Pat. No. 10,665,195, which is a continuation of application No. 15/062,265, filed on Mar. 7, 2016, now Pat. No. 10,121,435, which is a continuation of application No. 14/644,372, filed on Mar. 11, 2015, now Pat. No. 9,311,876, which is a continuation of application No. 14/305,367, filed on Jun. 16, 2014, now Pat. No. 9,036,767, which is a continuation of application No. 13/675,077, filed on Nov. 13, 2012, now Pat. No. 8,774,347, which is a continuation of application No. 12/477,338, filed on Jun. 3, 2009, now Pat. No. 8,314,765.

(51) Int. Cl.
  *G11C 19/18* (2006.01)
  *H10D 86/40* (2025.01)
  *H10D 86/60* (2025.01)

(52) U.S. Cl.
  CPC ........... *G11C 19/28* (2013.01); *H10D 86/423* (2025.01); *H10D 86/60* (2025.01); *G09G 2300/0809* (2013.01); *G09G 2310/0286* (2013.01)

(56) References Cited

U.S. PATENT DOCUMENTS

| | | |
|---|---|---|
| 4,211,942 A | 7/1980 | Aoki et al. |
| 4,264,872 A | 4/1981 | Suzuki |
| 5,550,503 A | 8/1996 | Garrity et al. |
| 5,731,856 A | 3/1998 | Kim et al. |
| 5,744,864 A | 4/1998 | Cillessen et al. |
| 5,812,284 A | 9/1998 | Mizutani et al. |
| 5,949,398 A | 9/1999 | Kim |
| 6,052,426 A | 4/2000 | Maurice |
| 6,144,466 A | 11/2000 | Mizutani et al. |
| 6,214,684 B1 | 4/2001 | Shoji |
| 6,294,274 B1 | 9/2001 | Kawazoe et al. |
| 6,323,708 B1 | 11/2001 | Uemura |
| 6,501,307 B1 | 12/2002 | Yen |
| 6,515,528 B1 | 2/2003 | Tohsche |
| 6,563,174 B2 | 5/2003 | Kawasaki et al. |
| 6,674,106 B2 | 1/2004 | Tanaka et al. |
| 6,693,044 B1 | 2/2004 | Yamazaki et al. |
| 6,727,522 B1 | 4/2004 | Kawasaki et al. |
| 6,750,087 B2 | 6/2004 | Morita et al. |
| 6,834,095 B2 | 12/2004 | Yu |
| 6,845,140 B2 | 1/2005 | Moon et al. |
| 6,937,687 B2 | 8/2005 | Yu |
| 7,049,190 B2 | 5/2006 | Takeda et al. |
| 7,061,014 B2 | 6/2006 | Hosono et al. |
| 7,064,346 B2 | 6/2006 | Kawasaki et al. |
| 7,105,868 B2 | 9/2006 | Nause et al. |
| 7,106,292 B2 | 9/2006 | Moon |
| 7,145,545 B2 | 12/2006 | Zebedee et al. |
| 7,146,585 B2 | 12/2006 | Blodgett |
| 7,211,825 B2 | 5/2007 | Shih et al. |
| 7,250,788 B2 | 7/2007 | Lee et al. |
| 7,279,935 B2 | 10/2007 | Hamdan et al. |
| 7,282,782 B2 | 10/2007 | Hoffman et al. |
| 7,283,116 B2 | 10/2007 | Shih et al. |
| 7,297,977 B2 | 11/2007 | Hoffman et al. |
| 7,310,402 B2 | 12/2007 | Wei et al. |
| 7,323,356 B2 | 1/2008 | Hosono et al. |
| 7,327,169 B2 | 2/2008 | Osame |
| 7,342,568 B2 | 3/2008 | Wei et al. |
| 7,385,224 B2 | 6/2008 | Ishii et al. |
| 7,402,506 B2 | 7/2008 | Levy et al. |
| 7,411,209 B2 | 8/2008 | Endo et al. |
| 7,436,923 B2 | 10/2008 | Tobita |
| 7,443,944 B2 | 10/2008 | Tobita et al. |
| 7,446,570 B2 | 11/2008 | Lee et al. |
| 7,447,292 B2 | 11/2008 | Hsu et al. |
| 7,450,681 B2 | 11/2008 | Wei et al. |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,477,226 B2 | 1/2009 | Kim et al. |
| 7,486,269 B2 | 2/2009 | Moon |
| 7,492,203 B2 | 2/2009 | Kim |
| 7,492,853 B2 | 2/2009 | Tobita |
| 7,501,293 B2 | 3/2009 | Ito et al. |
| 7,515,121 B2 | 4/2009 | Sato et al. |
| 7,525,361 B2 | 4/2009 | Kim |
| 7,528,820 B2 | 5/2009 | Yoon et al. |
| 7,535,259 B2 | 5/2009 | Osame et al. |
| 7,633,477 B2 | 12/2009 | Jang et al. |
| 7,664,218 B2 | 2/2010 | Tobita |
| 7,674,650 B2 | 3/2010 | Akimoto et al. |
| 7,675,498 B2 | 3/2010 | Ku |
| 7,687,808 B2 | 3/2010 | Umezaki |
| 7,697,655 B2 | 4/2010 | Chan et al. |
| 7,732,819 B2 | 6/2010 | Akimoto et al. |
| 7,738,623 B2 | 6/2010 | Tobita |
| 7,791,582 B2 | 9/2010 | Chang et al. |
| 7,859,510 B2 | 12/2010 | Umezaki |
| 7,910,490 B2 | 3/2011 | Akimoto et al. |
| 7,932,521 B2 | 4/2011 | Akimoto et al. |
| 7,964,876 B2 | 6/2011 | Umezaki |
| 7,978,274 B2 | 7/2011 | Umezaki et al. |
| 8,054,279 B2 | 11/2011 | Umezaki et al. |
| 8,134,156 B2 | 3/2012 | Akimoto |
| 8,194,026 B2 | 6/2012 | Lee et al. |
| 8,264,254 B2 | 9/2012 | Osame et al. |
| 8,274,077 B2 | 9/2012 | Akimoto et al. |
| 8,314,765 B2 | 11/2012 | Umezaki |
| 8,330,492 B2 | 12/2012 | Umezaki |
| 8,432,385 B2 | 4/2013 | Osame et al. |
| 8,456,396 B2 | 6/2013 | Umezaki |
| 8,462,100 B2 | 6/2013 | Umezaki |
| 8,466,463 B2 | 6/2013 | Akimoto et al. |
| 8,493,309 B2 | 7/2013 | Tobita |
| 8,520,159 B2 | 8/2013 | Umezaki et al. |
| 8,598,591 B2 | 12/2013 | Umezaki |
| 8,629,069 B2 | 1/2014 | Akimoto et al. |
| 8,643,586 B2 | 2/2014 | Umezaki |
| 8,669,550 B2 | 3/2014 | Akimoto et al. |
| 8,742,811 B2 | 6/2014 | Umezaki |
| 8,743,044 B2 | 6/2014 | Umezaki et al. |
| 8,774,347 B2 | 7/2014 | Umezaki |
| 8,790,959 B2 | 7/2014 | Akimoto et al. |
| 8,796,069 B2 | 8/2014 | Akimoto et al. |
| 8,816,949 B2 | 8/2014 | Tobita |
| 8,902,145 B2 | 12/2014 | Umezaki et al. |
| 8,908,115 B2 | 12/2014 | Umezaki et al. |
| 8,921,858 B2 | 12/2014 | Yamazaki et al. |
| 9,036,767 B2 | 5/2015 | Umezaki |
| 9,070,593 B2 | 6/2015 | Umezaki |
| 9,176,353 B2 | 11/2015 | Yamazaki et al. |
| 9,184,183 B2 | 11/2015 | Umezaki |
| 9,214,473 B2 | 12/2015 | Umezaki |
| 9,245,891 B2 | 1/2016 | Umezaki |
| 9,263,468 B2 | 2/2016 | Umezaki et al. |
| 9,311,876 B2 | 4/2016 | Umezaki |
| 9,335,599 B2 | 5/2016 | Umezaki |
| 9,406,699 B2 | 8/2016 | Umezaki |
| 9,461,071 B2 | 10/2016 | Umezaki |
| 9,467,133 B2 | 10/2016 | Chong |
| 9,583,513 B2 | 2/2017 | Umezaki |
| 9,606,408 B2 | 3/2017 | Umezaki et al. |
| 9,954,010 B2 | 4/2018 | Umezaki |
| 10,062,716 B2 | 8/2018 | Umezaki |
| 10,121,435 B2 | 11/2018 | Umezaki |

(56) References Cited

U.S. PATENT DOCUMENTS

| | | |
|---|---|---|
| 10,134,775 B2 | 11/2018 | Umezaki |
| 10,304,868 B2 | 5/2019 | Umezaki |
| 10,325,932 B2 | 6/2019 | Umezaki |
| 10,553,618 B2 | 2/2020 | Umezaki |
| 10,665,195 B2 | 5/2020 | Umezaki |
| 10,685,987 B2 | 6/2020 | Umezaki |
| 10,971,103 B2 | 4/2021 | Umezaki |
| 10,978,497 B2 | 4/2021 | Umezaki |
| 11,133,335 B2 | 9/2021 | Umezaki |
| 11,455,968 B2 | 9/2022 | Umezaki |
| 11,563,037 B2 | 1/2023 | Umezaki |
| 11,620,962 B2 | 4/2023 | Umezaki |
| 11,837,189 B2 * | 12/2023 | Umezaki ............ G11C 19/184 |
| 12,027,532 B2 | 7/2024 | Umezaki |
| 2001/0024186 A1 | 9/2001 | Kane et al. |
| 2001/0046027 A1 | 11/2001 | Tai et al. |
| 2002/0056838 A1 | 5/2002 | Ogawa |
| 2002/0132454 A1 | 9/2002 | Ohtsu et al. |
| 2002/0158666 A1 | 10/2002 | Azami et al. |
| 2002/0167026 A1 | 11/2002 | Azami et al. |
| 2003/0043104 A1 | 3/2003 | Lee et al. |
| 2003/0186478 A1 | 10/2003 | Morita et al. |
| 2003/0189401 A1 | 10/2003 | Kido et al. |
| 2003/0218222 A1 | 11/2003 | Wager, III et al. |
| 2003/0227433 A1 | 12/2003 | Moon |
| 2003/0231735 A1 | 12/2003 | Moon et al. |
| 2004/0038446 A1 | 2/2004 | Takeda et al. |
| 2004/0127038 A1 | 7/2004 | Carcia et al. |
| 2004/0140839 A1 | 7/2004 | Nagao et al. |
| 2004/0165692 A1 | 8/2004 | Moon et al. |
| 2004/0253781 A1 | 12/2004 | Kimura et al. |
| 2005/0008114 A1 | 1/2005 | Moon |
| 2005/0017302 A1 | 1/2005 | Hoffman |
| 2005/0104647 A1 | 5/2005 | Choi et al. |
| 2005/0195179 A1 | 9/2005 | Kobayashi et al. |
| 2005/0199959 A1 | 9/2005 | Chiang et al. |
| 2005/0220262 A1 | 10/2005 | Moon |
| 2005/0220263 A1 | 10/2005 | Moon |
| 2005/0264514 A1 | 12/2005 | Kim et al. |
| 2005/0285840 A1 | 12/2005 | Jang et al. |
| 2006/0001637 A1 | 1/2006 | Pak et al. |
| 2006/0007216 A1 | 1/2006 | Sato et al. |
| 2006/0035452 A1 | 2/2006 | Carcia et al. |
| 2006/0043377 A1 | 3/2006 | Hoffman et al. |
| 2006/0044247 A1 | 3/2006 | Jang. et al. |
| 2006/0050043 A1 | 3/2006 | Kawagoe |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0145998 A1 | 7/2006 | Cho et al. |
| 2006/0145999 A1 | 7/2006 | Cho et al. |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara. et al. |
| 2006/0284171 A1 | 12/2006 | Levy et al. |
| 2006/0284172 A1 | 12/2006 | Ishii |
| 2006/0290390 A1 | 12/2006 | Jang et al. |
| 2006/0292777 A1 | 12/2006 | Dunbar |
| 2007/0024187 A1 | 2/2007 | Shin et al. |
| 2007/0035505 A1 | 2/2007 | Lin et al. |
| 2007/0046191 A1 | 3/2007 | Saito |
| 2007/0046608 A1 | 3/2007 | Chung |
| 2007/0052025 A1 | 3/2007 | Yabuta |
| 2007/0054507 A1 | 3/2007 | Kaji et al. |
| 2007/0090365 A1 | 4/2007 | Hayashi et al. |
| 2007/0108446 A1 | 5/2007 | Akimoto |
| 2007/0115245 A1 | 5/2007 | Nakao et al. |
| 2007/0152217 A1 | 7/2007 | Lai et al. |
| 2007/0164970 A1 | 7/2007 | Oh |
| 2007/0164971 A1 | 7/2007 | Chang et al. |
| 2007/0172591 A1 | 7/2007 | Seo et al. |
| 2007/0187678 A1 | 8/2007 | Hirao. et al. |
| 2007/0187760 A1 | 8/2007 | Furuta et al. |
| 2007/0188436 A1 | 8/2007 | Wei et al. |
| 2007/0194379 A1 | 8/2007 | Hosono et al. |
| 2007/0247932 A1 | 10/2007 | Tobita |
| 2007/0252928 A1 | 11/2007 | Ito et al. |
| 2007/0272922 A1 | 11/2007 | Kim et al. |
| 2007/0287296 A1 | 12/2007 | Chang |
| 2008/0006877 A1 | 1/2008 | Mardilovich et al. |
| 2008/0007296 A1 | 1/2008 | Umezaki |
| 2008/0008855 A1 | 1/2008 | D'Evelyn et al. |
| 2008/0016139 A1 | 1/2008 | Tsai et al. |
| 2008/0038882 A1 | 2/2008 | Takechi et al. |
| 2008/0038929 A1 | 2/2008 | Chang |
| 2008/0050595 A1 | 2/2008 | Nakagawara. et al. |
| 2008/0054974 A1 | 3/2008 | Kim |
| 2008/0073653 A1 | 3/2008 | Iwasaki |
| 2008/0079001 A1 | 4/2008 | Umezaki et al. |
| 2008/0079685 A1 | 4/2008 | Umezaki et al. |
| 2008/0083950 A1 | 4/2008 | Pan et al. |
| 2008/0088555 A1 | 4/2008 | Shin et al. |
| 2008/0101529 A1 | 5/2008 | Tobita |
| 2008/0106191 A1 | 5/2008 | Kawase |
| 2008/0119030 A1 | 5/2008 | Kunii |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0182358 A1 | 7/2008 | Cowdery-Corvan et al. |
| 2008/0219401 A1 | 9/2008 | Tobita |
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0296568 A1 | 12/2008 | Ryu et al. |
| 2008/0308805 A1 | 12/2008 | Akimoto et al. |
| 2009/0001375 A1 | 1/2009 | Yamazaki et al. |
| 2009/0002591 A1 | 1/2009 | Yamazaki et al. |
| 2009/0041177 A1 | 2/2009 | Chien et al. |
| 2009/0068773 A1 | 3/2009 | Lai et al. |
| 2009/0073325 A1 | 3/2009 | Kuwabara et al. |
| 2009/0114910 A1 | 5/2009 | Chang |
| 2009/0134399 A1 | 5/2009 | Sakakura et al. |
| 2009/0152506 A1 | 6/2009 | Umeda et al. |
| 2009/0152541 A1 | 6/2009 | Maekawa et al. |
| 2009/0278122 A1 | 11/2009 | Hosono et al. |
| 2009/0280600 A1 | 11/2009 | Hosono et al. |
| 2009/0305461 A1 | 12/2009 | Akimoto et al. |
| 2010/0065844 A1 | 3/2010 | Tokunaga |
| 2010/0092800 A1 | 4/2010 | Itagaki et al. |
| 2010/0109002 A1 | 5/2010 | Itagaki et al. |
| 2011/0104851 A1 | 5/2011 | Akimoto et al. |
| 2011/0121290 A1 | 5/2011 | Akimoto et al. |
| 2015/0137118 A1 | 5/2015 | Umezaki et al. |
| 2015/0171115 A1 | 6/2015 | Yamazaki et al. |
| 2016/0238916 A1 | 8/2016 | Umezaki |
| 2017/0176794 A1 | 6/2017 | Umezaki et al. |
| 2021/0320129 A1 | 10/2021 | Umezaki |

FOREIGN PATENT DOCUMENTS

| | | |
|---|---|---|
| EP | 0766294 A | 4/1997 |
| EP | 0801376 A | 10/1997 |
| EP | 1050964 B | 12/2003 |
| EP | 1408614 A | 4/2004 |
| EP | 1445775 A | 8/2004 |
| EP | 1737044 A | 12/2006 |
| EP | 1755103 A | 2/2007 |
| EP | 1770788 A | 4/2007 |
| EP | 1887554 A | 2/2008 |
| EP | 1895545 A | 3/2008 |
| EP | 1906414 A | 4/2008 |

(56) References Cited

FOREIGN PATENT DOCUMENTS

| | | |
|---|---|---|
| EP | 1995787 A | 11/2008 |
| EP | 1998373 A | 12/2008 |
| EP | 1998374 A | 12/2008 |
| EP | 1998375 A | 12/2008 |
| EP | 2226847 A | 9/2010 |
| EP | 2538561 A | 12/2012 |
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 08-264794 A | 10/1996 |
| JP | 09-092840 A | 4/1997 |
| JP | 10-056180 A | 2/1998 |
| JP | 10-270701 A | 10/1998 |
| JP | 11-505377 | 5/1999 |
| JP | 11-204435 A | 7/1999 |
| JP | 2000-044236 A | 2/2000 |
| JP | 2000-150900 A | 5/2000 |
| JP | 2001-242803 A | 9/2001 |
| JP | 2002-008388 A | 1/2002 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2003-234355 A | 8/2003 |
| JP | 2003-297850 A | 10/2003 |
| JP | 2004-078172 A | 3/2004 |
| JP | 2004-103957 A | 4/2004 |
| JP | 2004-227751 A | 8/2004 |
| JP | 2004-273614 A | 9/2004 |
| JP | 2004-273732 A | 9/2004 |
| JP | 2004-348940 A | 12/2004 |
| JP | 2005-050502 A | 2/2005 |
| JP | 2005-167051 A | 6/2005 |
| JP | 2006-024350 A | 1/2006 |
| JP | 2006-032735 A | 2/2006 |
| JP | 2006-189762 A | 7/2006 |
| JP | 2007-004167 A | 1/2007 |
| JP | 2007-114781 A | 5/2007 |
| JP | 2007-123861 A | 5/2007 |
| JP | 2007-188079 A | 7/2007 |
| JP | 2007-207413 A | 8/2007 |
| JP | 2007-250052 A | 9/2007 |
| JP | 2008-003611 A | 1/2008 |
| JP | 2008-009393 A | 1/2008 |
| JP | 2008-083692 A | 4/2008 |
| JP | 2008-089874 A | 4/2008 |
| JP | 2008-107807 A | 5/2008 |
| JP | 2008-108374 A | 5/2008 |
| JP | 2008-112550 A | 5/2008 |
| JP | 2008-124408 A | 5/2008 |
| JP | 2008-130139 A | 6/2008 |
| JP | 2008-217902 A | 9/2008 |
| JP | 2008-251094 A | 10/2008 |
| JP | 2009-044133 A | 2/2009 |
| JP | 2009-044134 A | 2/2009 |
| KR | 2005-0113967 A | 12/2005 |
| KR | 2006-0020325 A | 3/2006 |
| KR | 2007-0070087 A | 7/2007 |
| KR | 2007-0093912 A | 9/2007 |
| KR | 2007-0105271 A | 10/2007 |
| KR | 2008-0002571 A | 1/2008 |
| KR | 2008-0013280 A | 2/2008 |
| KR | 2008-0021557 A | 3/2008 |
| KR | 2008-0029807 A | 4/2008 |
| KR | 2008-0033565 A | 4/2008 |
| KR | 2008-0081822 A | 9/2008 |
| TW | 567452 | 12/2003 |
| TW | 200405237 | 4/2004 |
| TW | 200509026 | 3/2005 |
| TW | 200625261 | 7/2006 |
| TW | 1259658 | 8/2006 |
| TW | 200807121 | 2/2008 |
| TW | 1297142 | 5/2008 |
| TW | 200826030 | 6/2008 |
| TW | 200826052 | 6/2008 |
| WO | WO-1995/031804 | 11/1995 |
| WO | WO-2004/001714 | 12/2003 |
| WO | WO-2004/006435 | 1/2004 |
| WO | WO-2004/114391 | 12/2004 |
| WO | WO-2007/080813 | 7/2007 |

OTHER PUBLICATIONS

Jang. Y et al., "P-5: A—Si TFT Integrated Gate Driver With AC-Driven Single Pull-Down Structure", SID Digest '06 : SID International Symposium Digest of Technical Papers, Jun. 6, 2006, vol. 37, pp. 208-211.

Taiwanese Office Action (Application No. 098119080) Dated Dec. 25, 2014.

Taiwanese Office Action (Application No. 102136333) DATED Jul. 9, 2015.

Asakuma.N et al., "Crystallization and Reduction of Sol-Gel-Derived Zinc Oxide Films By Irradiation With Ultraviolet Lamp", Journal of Sol-Gel Science and Technology, 2003, vol. 26, pp. 181-184.

Asaoka. Y et al., "29.1: Polarizer-Free Reflective LCD Combined With Ultra Low-Power Driving Technology", SID Digest '09 : SID International Symposium Digest of Technical Papers, May 31, 2009, pp. 395-398.

Chern.H et al., "An Analytical Model for the Above-Threshold Characteristics of Polysilicon Thin-Film Transistors", IEEE Transactions On Electron Devices, Jul. 1, 1995, vol. 42, No. 7, pp. 1240-1246.

Cho.D et al., "21.2:AL and Sn-Doped Zinc Indium Oxide Thin Film Transistors for AMOLED Back-Plane", SID Digest '09 : SID International Symposium Digest of Technical Papers, May 31, 2009, pp. 280-283.

Clark.S et al., "First Principles Methods Using CASTEP", Zeitschrift fur Kristallographie, 2005, vol. 220, pp. 567-570.

Coates.D et al., "Optical Studies of the Amorphous Liquid-Cholesteric Liquid Crystal Transition: the "Blue Phase"", Physics Letters, Sep. 10, 1973, vol. 45A, No. 2, pp. 115-116.

Costello.M et al., "Electron Microscopy of a Cholesteric Liquid Crystal and Its Blue Phase", Phys. Rev. a (Physical Review. A), May 1, 1984, vol. 29, No. 5, pp. 2957-2959.

Dembo.H et al., "RFCPUS on Glass and Plastic Substrates Fabricated By TFT Transfer Technology", IEDM 05: Technical Digest of International Electron Devices Meeting, Dec. 5, 2005, pp. 1067-1069.

Fortunato.E et al., "Wide-Bandgap High-Mobility ZnO Thin-Film Transistors Produced at Room Temperature", Appl. Phys. Lett. (Applied Physics Letters) , Sep. 27, 2004, vol. 85, No. 13, pp. 2541-2543.

Fung.T et al., "2-D Numerical Simulation of High Performance Amorphous In—Ga—Zn—O TFTs for Flat Panel Displays", AM-FPD '08 Digest of Technical Papers, Jul. 2, 2008, pp. 251-252, The Japan Society of Applied Physics.

Godo.H et al., "P-9:Numerical Analysis on Temperature Dependence of Characteristics of Amorphous In—Ga—Zn-Oxide TFT", SID Digest '09 : SID International Symposium Digest of Technical Papers, May 31, 2009, pp. 1110-1112.

Godo.H et al., "Temperature Dependence of Characteristics and Electronic Structure for Amorphous In—Ga—Zn-Oxide TFT", AM-FPD '09 Digest of Technical Papers, Jul. 1, 2009, pp. 41-44.

Hayashi.R et al., "42.1: Invited Paper: Improved Amorphous In—Ga—Zn—O TFTS", SID Digest '08 : SID International Symposium Digest of Technical Papers, May 20, 2008, vol. 39, pp. 621-624.

Hirao.T et al., "Novel Top-Gate Zinc Oxide Thin-Film Transistors (ZNO TFTS) for AMLCDS", J. Soc. Inf. Display (Journal of the Society for Information Display), 2007, vol. 15, No. 1, pp. 17-22.

(56) References Cited

OTHER PUBLICATIONS

Hosono.H et al., "Working hypothesis to explore novel wide band gap electrically conducting amorphous oxides and examples", J. Non-Cryst. Solids (Journal of Non-Crystalline Solids), 1996, vol. 198-200, pp. 165-169.

Hosono.H, "68.3:Invited Paper:Transparent Amorphous Oxide Semiconductors for High Performance TFT", SID Digest '07 : SID International Symposium Digest of Technical Papers, 2007, vol. 38, pp. 1830-1833.

Hsieh.H et al., "P-29:Modeling of Amorphous Oxide Semiconductor Thin Film Transistors and Subgap Density of States", SID Digest '08 : SID International Symposium Digest of Technical Papers, May 20, 2008, vol. 39, pp. 1277-1280.

Ikeda.T et al., "Full-Functional System Liquid Crystal Display Using Cg-Silicon Technology", SID Digest '04 : SID International Symposium Digest of Technical Papers, 2004, vol. 35, pp. 860-863.

Janotti.A et al., "Native Point Defects in ZnO", Phys. Rev. B (Physical Review. B), Oct. 4, 2007, vol. 76, No. 16, pp. 165202-1-165202-22.

Janotti.A et al., "Oxygen Vacancies in ZnO", Appl. Phys. Lett. (Applied Physics Letters) , 2005, vol. 87, pp. 122102-1-122102-3.

Jeong.J et al., "3.1 : Distinguished Paper: 12.1-Inch WXGA AMOLED Display Driven by Indium-Gallium-Zinc Oxide TFTs Array", SID Digest '08 : SID International Symposium Digest of Technical Papers, May 20, 2008, vol. 39, No. 1, pp. 1-4.

Jin.D et al., "65.2:DISTINGUISHED Paper:World-Largest (6.5") Flexible Full Color Top Emission AMOLED Display on Plastic Film and Its Bending Properties", SID Digest '09 : SID International Symposium Digest of Technical Papers, May 31, 2009, pp. 983-985.

Kanno.H et al., "White Stacked Electrophosphorecent Organic Light-Emitting Devices Employing MoO3 as a Charge-Generation Layer", Adv. Mater. (Advanced Materials), 2006, vol. 18, No. 3, pp. 339-342.

Kikuchi.H et al., "39.1:Invited Paper:Optically Isotropic Nano-Structured Liquid Crystal Composites for Display Applications", SID Digest '09 : SID International Symposium Digest of Technical Papers, May 31, 2009, pp. 578-581.

Kikuchi.H et al., "62.2:Invited Paper:Fast Electro-Optical Switching in Polymer-Stabilized Liquid Crystalline Blue Phases for Display Application", SID Digest 3 07 : SID International Symposium Digest of Technical Papers, 2007, vol. 38, pp. 1737-1740.

Kikuchi.H et al., "Polymer-Stabilized Liquid Crystal Blue Phases", Nature Materials, Sep. 2, 2002, vol. 1, pp. 64-68.

Kim.S et al., "High-Performance oxide thin film transistors passivated by various gas plasmas", 214th ECS Meeting, 2008, No. 2317, ECS.

Kimizuka.N et al., "SPINEL,YbFe2O4, and Yb2Fe3O7 Types of Structures for Compounds in the In2O3 and Sc2O3—A2O3—BO Systems [A; Fe, Ga, or Al; B: Mg, Mn, Fe, Ni, Cu,Or Zn] At Temperatures Over 1000° C.", Journal of Solid State Chemistry, 1985, vol. 60, pp. 382-384, Elsevier.

Kimizuka.N et al., "Syntheses and Single-Crystal Data of Homologous Compounds, In2O3(ZnO)m (m=3, 4, and 5), InGaO3(ZnO)3, and Ga2O3(ZnO)m (m=7, 8, 9, and 16) in the In2O3—ZnGa2O4—ZnO System", Journal of Solid State Chemistry, Apr. 1, 1995, vol. 116, No. 1, pp. 170-178 Elsevier.

Kitzerow.H et al., "Observation of Blue Phases in Chiral Networks", Liquid Crystals, 1993, vol. 14, No. 3, pp. 911-916.

Kurokawa. Y et al., "UHF RFCPUS on Flexible and Glass Substrates for Secure RFID Systems", Journal of Solid-State Circuits , 2008, vol. 43, No. 1, pp. 292-299.

Lany.S et al., "Dopability, Intrinsic Conductivity, and Nonstoichiometry of Transparent Conducting Oxides", Phys. Rev. Lett. (Physical Review Letters), Jan. 26, 2007, vol. 98, pp. 045501-1-045501-4.

Lee.H et al., "Current Status of, Challenges to, and Perspective View of AM-OLED", IDW '06 : Proceedings of the 13th International Display Workshops, Dec. 7, 2006, pp. 663-666.

Lee.J et al., "World's Largest (15-Inch) XGA AMLCD Panel Using IGZO Oxide TFT", SID Digest '08 : SID International Symposium Digest of Technical Papers, May 20, 2008, vol. 39, pp. 625-628.

Lee.M et al., "15.4:Excellent Performance of Indium-Oxide-Based Thin-Film Transistors by DC Sputtering", SID Digest '09 : SID International Symposium Digest of Technical Papers, May 31, 2009, pp. 191-193.

Li.C et al., "Modulated Structures of Homologous Compounds InMO3(ZnO)m (M=In,Ga; m=Integer) Described by Four-Dimensional Superspace Group", Journal of Solid State Chemistry, 1998, vol. 139, pp. 347-355, Elsevier.

Masuda.S et al., "Transparent thin film transistors using ZnO as an active channel layer and their electrical properties", J. Appl. Phys. (Journal of Applied Physics) , Feb. 1, 2003, vol. 93, No. 3, pp. 1624-1630.

Meiboom.S et al., "Theory of the Blue Phase of Cholesteric Liquid Crystals", Phys. Rev. Lett. (Physical Review Letters), May 4, 1981, vol. 46, No. 18, pp. 1216-1219.

Miyasaka.M, "SUFTLA Flexible Microelectronics on Their Way to Business", SID Digest '07 : SID International Symposium Digest of Technical Papers, 2007, vol. 38, pp. 1673-1676.

Mo.Y et al., "Amorphous Oxide TFT Backplanes for Large Size AMOLED Displays", IDW'08 : Proceedings of the 6th International Display Workshops, Dec. 3, 2008, pp. 581-584.

Nakamura.M et al., "The phase relations in the In2O3—Ga2ZnO4—ZnO system at 1350° C.", Journal of Solid State Chemistry, Aug. 1, 1991, vol. 93, No. 2, pp. 298-315, Eelsevier.

Nakamura.M, "Synthesis of Homologous Compound with New Long-Period Structure", NIRIM Newsletter, Mar. 1, 1995, vol. 150, pp. 1-4.

Nomura.K et al., "Amorphous Oxide Semiconductors for High-Performance Flexible Thin- Film Transistors", Jpn. J. Appl. Phys. (Japanese Journal of Applied Physics) , 2006, vol. 45, No. 5B, pp. 4303-4308.

Nomura.K et al., "Carrier transport in transparent oxide semiconductor with intrinsic structural randomness probed using single-crystalline InGaO3(ZnO)5 films", Appl. Phys. Lett. (Applied Physics Letters) , Sep. 13, 2004, vol. 85, No. 11, pp. 1993-1995.

Nomura.K et al., "Room-Temperature Fabrication of Transparent Flexible Thin-Film Transistors Using Amorphous Oxide Semiconductors", Nature, Nov. 25, 2004, vol. 432, pp. 488-492.

Nomura.K et al., "Thin-Film Transistor Fabricated in Single-Crystalline Transparent Oxide Semiconductor", Science, May 23, 2003, vol. 300, No. 5623, pp. 1269-1272.

Nowatari.H et al., "60.2: Intermediate Connector With Suppressed Voltage Loss for White Tandem OLEDS", SID Digest '09 : SID International Symposium Digest of Technical Papers, May 31, 2009, vol. 40, pp. 899-902.

Oba.F et al., "Defect energetics in ZnO: A hybrid Hartree-Fock density functional study", Phys. Rev. B (Physical Review. B), 2008, vol. 77, pp. 245202-1-245202-6.

Oh.M et al., "Improving the Gate Stability of ZnO Thin-Film Transistors With Aluminum Oxide Dielectric Layers", J. Electrochem. Soc. (Journal of the Electrochemical Society), 2008, vol. 155, No. 12, pp. H1009-H1014.

Ohara.H et al., "21.3:4.0 In. QVGA AMOLED Display Using In—Ga—Zn-Oxide TFTS With a Novel Passivation Layer", SID Digest '09 : SID International Symposium Digest of Technical Papers, May 31, 2009, pp. 284-287.

Ohara.H et al., "Amorphous In—Ga—Zn-Oxide TFTs with Suppressed Variation for 4.0 inch QVGA AMOLED Display", AM-FPD '09 Digest of Technical Papers, Jul. 1, 2009, pp. 227-230, The Japan Society of Applied Physics.

Orita.M et al., "Amorphous transparent conductive oxide InGaO3(ZnO)m (m<4):a Zn4s conductor", Philosophical Magazine, 2001, vol. 81, No. 5, pp. 501-515.

Orita.M et al., "Mechanism of Electrical Conductivity of Transparent InGaZnO4", Phys. Rev. B (Physical Review. B), Jan. 15, 2000, vol. 61, No. 3, pp. 1811-1816.

Osada.T et al., "15.2: Development of Driver-Integrated Panel using Amorphous In—Ga—Zn-Oxide TFT", SID Digest '09 : SID International Symposium Digest of Technical Papers, May 31, 2009, vol. 40, pp. 184-187.

(56) References Cited

OTHER PUBLICATIONS

Osada.T et al., "Development of Driver-Integrated Panel Using Amorphous In—Ga—Zn-Oxide TFT", AM-FPD '09 Digest of Technical Papers, Jul. 1, 2009, pp. 33-36.

Park.J et al., "Amorphous Indium-Gallium-Zinc Oxide TFTS and Their Application for Large Size AMOLED", AM-FPD '08 Digest of Technical Papers, Jul. 2, 2008, pp. 275-278.

Park.J et al., "Dry etching of ZnO films and plasma-induced damage to optical properties", J. Vac. Sci. Technol. B (Journal of Vacuum Science & Technology B), Mar. 1, 2003, vol. 21, No. 2, pp. 800-803.

Park.J et al., "Electronic Transport Properties of Amorphous Indium-Gallium-Zinc Oxide Semiconductor Upon Exposure to Water", Appl. Phys. Lett. (Applied Physics Letters) , 2008, vol. 92, pp. 072104-1-072104-3.

Park.J et al., "High performance amorphous oxide thin film transistors with self-aligned top-gate structure", IEDM 09: Technical Digest of International Electron Devices Meeting, Dec. 7, 2009, pp. 191-194.

Park.J et al., "Improvements in the Device Characteristics of Amorphous Indium Gallium Zinc Oxide Thin-Film Transistors by Ar Plasma Treatment", Appl. Phys. Lett. (Applied Physics Letters) , Jun. 26, 2007, vol. 90, No. 26, pp. 262106-1-262106-3.

Park.S et al., "Challenge to Future Displays: Transparent AM-OLED Driven by PEALD Grown ZnO TFT", IMID '07 Digest, 2007, pp. 1249-1252.

Park.S et al., "42.3: Transparent ZnO Thin Film Transistor for the Application of High Aperture Ratio Bottom Emission AM-OLED Display", SID Digest '08 : SID International Symposium Digest of Technical Papers, May 20, 2008, vol. 39, pp. 629-632.

Prins.M et al., "A Ferroelectric Transparent Thin-Film Transistor", Appl. Phys. Lett. (Applied Physics Letters) , Jun. 17, 1996, vol. 68, No. 25, pp. 3650-3652.

Sakata.J et al., "Development of 4.0-IN. AMOLED Display With Driver Circuit Using Amorphous In—Ga—Zn-Oxide TFTS", IDW'09 : Proceedings of the 16th International Display Workshops, 2009, pp. 689-692.

Son.K et al., "42.4L: Late-News Paper: 4 Inch QVGA AMOLED Driven by the Threshold Voltage Controlled Amorphous GIZO ($Ga_2O_3$—$In_2O_3$—ZnO) TFT", SID Digest '08 : SID International Symposium Digest of Technical Papers, May 20, 2008, vol. 39, pp. 633-636.

Takahashi.M et al., "Theoretical Analysis of IGZO Transparent Amorphous Oxide Semiconductor", IDW'08 : Proceedings of the 15th International Display Workshops, Dec. 3, 2008, pp. 1637-1640.

Tsuda.K et al., "Ultra Low Power Consumption Technologies for Mobile TFT-LCDs ", IDW'02 : Proceedings of the 9th International Display Workshops, Dec. 4, 2002, pp. 295-298.

Ueno.K et al., "Field-Effect Transistor on $SrTiO_3$ With Sputtered $Al_2O_3$ Gate Insulator", Appl. Phys. Lett. (Applied Physics Letters) , Sep. 1, 2003, vol. 83, No. 9, pp. 1755-1757.

Van de Walle.C, "Hydrogen as a Cause of Doping in Zinc Oxide", Phys. Rev. Lett. (Physical Review Letters), Jul. 31, 2000, vol. 85, No. 5, pp. 1012-1015.

Korean Office Action (Application No. 2016-0005764) Dated Apr. 14, 2016.

Taiwanese Office Action (Application No. 104143366) Dated Dec. 21, 2016.

Taiwanese Office Action (Application No. 110104453) Dated Jun. 30, 2021.

\* cited by examiner

DRIVER CIRCUIT, DISPLAY DEVICE, AND ELECTRONIC DEVICE

CROSS-REFERENCE TO RELATED APPLICATIONS

This application is a continuation of U.S. application Ser. No. 18/120,489, filed Mar. 13, 2023, now U.S. Pat. No. 11,837,189, which is a continuation of U.S. application Ser. No. 17/862,464, filed Jul. 12, 2022, now U.S. Pat. No. 11,620,962, which is a continuation of U.S. application Ser. No. 17/190,945, filed Mar. 3, 2021, now U.S. Pat. No. 11,455,968, which is a continuation of U.S. application Ser. No. 16/812,604, filed Mar. 9, 2020, now U.S. Pat. No. 10,971,103, which is a continuation of U.S. application Ser. No. 16/176,016, filed Oct. 31, 2018, now U.S. Pat. No. 10,665,195, which is a continuation of U.S. application Ser. No. 15/062,265, filed Mar. 7, 2016, now U.S. Pat. No. 10,121,435, which is a continuation of U.S. application Ser. No. 14/644,372, filed Mar. 11, 2015, now U.S. Pat. No. 9,311,876, which is a continuation of U.S. application Ser. No. 14/305,367, filed Jun. 16, 2014, now U.S. Pat. No. 9,036,767, which is a continuation of U.S. application Ser. No. 13/675,077, filed Nov. 13, 2012, now U.S. Pat. No. 8,774,347, which is a continuation of U.S. application Ser. No. 12/477,338, filed Jun. 3, 2009, now U.S. Pat. No. 8,314,765, which claims the benefit of a foreign priority application filed in Japan as Serial No. 2008-157400 on Jun. 17, 2008, all of which are incorporated by reference.

BACKGROUND OF THE INVENTION

1. Field of the Invention

The present invention relates to a driver circuit. In particular, the present invention relates to a display device having the driver circuit. Further, the present invention relates to an electronic device having the display device in a display portion.

2. Description of the Related Art

In recent years, with the increase of large display devices such as liquid crystal televisions, display devices such as liquid crystal display devices and light-emitting devices have been actively developed. In particular, a technique for forming a pixel circuit and a driver circuit including a shift register or the like (also referred to as an internal circuit) over the same insulating substrate by using transistors or the like having semiconductor layers has been actively developed, because the technique greatly contributes to reduction in power consumption and cost. The internal circuit formed over the insulating substrate is connected to an external circuit including a controller IC or the like provided outside the insulating substrate through an FPC or the like, and its operation is controlled.

As a driver circuit (also referred to as a driver), which is one of internal circuits, there is a scan line driver circuit or the like, for example. For example, a driver circuit is formed using a shift register including a plurality of flip-flop circuits, as disclosed in Reference 1.

REFERENCE

Reference 1: Japanese Published Patent Application No. 2006-024350.

SUMMARY OF THE INVENTION

In a conventional driver circuit as disclosed in Reference 1, there is a problem in that malfunctions occur because timing of the switching operation of a transistor in a flip-flop circuit deviates from desired timing. As a cause of deviation in timing of the switching operation of a transistor, for example, when a gate terminal of a pull-up transistor in a flip-flop circuit of a shift register enters into a floating state in a non-selection period, noise or the like generated in the non-selection period adversely affects a potential of the gate terminal of the pull-up transistor.

In addition, deterioration of a transistor itself is one of causes of deviation in the timing of the switching operation. Due to the deterioration of the transistor, the threshold voltage of the transistor changes, so that malfunctions occur in the driver circuit. In the case of using a transistor having a semiconductor layer formed using an amorphous semiconductor as a transistor, malfunctions particularly occur easily because the transistor having the semiconductor layer formed using the amorphous semiconductor easily deteriorates.

In an embodiment of the present invention, it is an object to suppress malfunctions in a circuit including a shift register.

An embodiment of the present invention is a driver circuit which includes a shift register including a plurality of flip-flop circuits. At least one of the plurality of flip-flop circuits is a flip-flop circuit to which a first signal, a second signal, and a third signal are input and which outputs an output signal. The at least one of the plurality of flip-flop circuits includes a first transistor, a second transistor, a third transistor, a fourth transistor, and a fifth transistor. The first transistor includes a gate terminal, a source terminal, and a drain terminal. A first potential corresponding to a potential of the first signal is applied to the gate terminal of the first transistor. The first potential or a second potential is applied to one of the source terminal and the drain terminal of the first transistor. The second transistor includes a gate terminal, a source terminal, and a drain terminal. A third potential corresponding to a potential of the second signal is applied to the gate terminal of the second transistor. One of the source terminal and the drain terminal of the second transistor is electrically connected to the other of the source terminal and the drain terminal of the first transistor. A fourth potential is applied to the other of the source terminal and the drain terminal of the second transistor. One of the third transistor and the fourth transistor controls whether to set a potential of the other of the source terminal and the drain terminal of the first transistor to the first potential or the fourth potential. The other of the third transistor and the fourth transistor controls whether to set the potential of the other of the source terminal and the drain terminal of the first transistor to the fourth potential. When the one of the third transistor and the fourth transistor is in an on state, the other of the third transistor and the fourth transistor is in an off state. When the other of the third transistor and the fourth transistor is in an on state, the one of the third transistor and the fourth transistor is in an off state. The fifth transistor includes a gate terminal, a source terminal, and a drain terminal. The gate terminal of the fifth transistor is electrically connected to the other of the source terminal and the drain terminal of the first transistor. A fifth potential corresponding to a potential of the third signal is applied to one of the source terminal and the drain terminal of the fifth transistor. A potential of the other of the source terminal and the drain terminal of the fifth transistor is a potential of the output signal. The fifth transistor is in an off state when the third transistor or the fourth transistor is in an on state.

An embodiment of the present invention is a driver circuit which includes a shift register including a plurality of flip-flop circuits. The flip-flop circuit is a flip-flop circuit to which a first control signal, a second control signal, a first clock signal, and a second clock signal are input and which outputs an output signal. The flip-flop circuit includes a first transistor, a second transistor, a third transistor, a fourth transistor, a fifth transistor, a sixth transistor, and a seventh transistor. The first transistor includes a gate terminal, a source terminal, and a drain terminal. A first potential corresponding to a potential of the first control signal is applied to the gate terminal of the first transistor. The first potential or a second potential is applied to one of the source terminal and the drain terminal of the first transistor. The second transistor includes a gate terminal, a source terminal, and a drain terminal. A third potential corresponding to a potential of the second control signal is applied to the gate terminal of the second transistor. One of the source terminal and the drain terminal of the second transistor is electrically connected to the other of the source terminal and the drain terminal of the first transistor. A fourth potential is applied to the other of the source terminal and the drain terminal of the second transistor. Each of the third transistor and the fourth transistor is a transistor including a gate terminal, a source terminal, and a drain terminal. One of the source terminal and the drain terminal of the third transistor is electrically connected to the other of the source terminal and the drain terminal of the first transistor. One of the source terminal and the drain terminal of the fourth transistor is electrically connected to the other of the source terminal and the drain terminal of the first transistor. The first potential or the fourth potential is applied to the other of the source terminal and the drain terminal of the one of the third transistor and the fourth transistor. One of the source terminal and the drain terminal of the other of the third transistor and the fourth transistor is electrically connected to the other of the source terminal and the drain terminal of the first transistor. The fourth potential is applied to the other of the source terminal and the drain terminal of the other of the third transistor and the fourth transistor. When the one of the third transistor and the fourth transistor is in an on state, the other of the third transistor and the fourth transistor is turned off. When the other of the third transistor and the fourth transistor is in an on state, the one of the third transistor and the fourth transistor is turned off. The fifth transistor includes a gate terminal, a source terminal, and a drain terminal. The gate terminal of the fifth transistor is electrically connected to the other of the source terminal and the drain terminal of the first transistor. A fifth potential corresponding to a potential of the first clock signal is applied to one of the source terminal and the drain terminal of the fifth transistor. A potential of the other of the source terminal and the drain terminal of the fifth transistor is a potential of the output signal. The fifth transistor is in an off state when the third transistor or the fourth transistor is in an on state. The sixth transistor includes a gate terminal, a source terminal, and a drain terminal. The gate terminal of the sixth transistor is electrically connected to the gate terminal of the other of the third transistor and the fourth transistor. One of the source terminal and the drain terminal of the sixth transistor is electrically connected to the other of the source terminal and the drain terminal of the fifth transistor. The fourth potential is applied to the other of the source terminal and the drain terminal of the sixth transistor. The seventh transistor includes a gate terminal, a source terminal, and a drain terminal. A sixth potential corresponding to a potential of the second clock signal is applied to the gate terminal of the seventh transistor. One of the source terminal and the drain terminal of the seventh transistor is electrically connected to the other of the source terminal and the drain terminal of the fifth transistor. The fourth potential is applied to the other of the source terminal and the drain terminal of the seventh transistor.

Note that in the above embodiment of the present invention, the flip-flop circuit can include a first capacitor, an eighth transistor, a second capacitor, and a ninth transistor. The first capacitor includes at least two terminals. The fifth potential is applied to one of the terminals of the first capacitor. The other of the terminals of the first capacitor is electrically connected to the gate terminal of the other of the third transistor and the fourth transistor. The eighth transistor includes a gate terminal, a source terminal, and a drain terminal. The gate terminal of the eighth transistor is electrically connected to the gate terminal of the fifth transistor. One of the source terminal and the drain terminal of the eighth transistor is electrically connected to the gate terminal of the other of the third transistor and the fourth transistor. The fourth potential is applied to the other of the source terminal and the drain terminal of the eighth transistor. The second capacitor includes at least two terminals. The sixth potential is applied to one of the terminals of the second capacitor. The other of the terminals of the second capacitor is electrically connected to the gate terminal of the one of the third transistor and the fourth transistor. The ninth transistor includes a gate terminal, a source terminal, and a drain terminal. The gate terminal of the ninth transistor is electrically connected to the gate terminal of the first transistor. One of the source terminal and the drain terminal of the ninth transistor is electrically connected to the gate terminal of the one of the third transistor and the fourth transistor. The fourth potential is applied to the other of the source terminal and the drain terminal of the ninth transistor.

In the above embodiment of the present invention, the flip-flop circuit can include a first capacitor and an eighth transistor. The first capacitor includes at least two terminals. The fifth potential is applied to one of the terminals of the first capacitor. The other of the terminals of the first capacitor is electrically connected to the gate terminal of the other of the third transistor and the fourth transistor. The eighth transistor includes a gate terminal, a source terminal, and a drain terminal. The gate terminal of the eighth transistor is electrically connected to the gate terminal of the fifth transistor. One of the source terminal and the drain terminal of the eighth transistor is electrically connected to the gate terminal of the other of the third transistor and the fourth transistor. The fourth potential is applied to the other of the source terminal and the drain terminal of the eighth transistor.

In the above embodiment of the present invention, the flip-flop circuit can include a tenth transistor. The tenth transistor includes a gate terminal, a source terminal, and a drain terminal. The first potential is applied to the gate terminal of the tenth transistor. One of the source terminal and the drain terminal of the tenth transistor is electrically connected to the gate terminal of the other of the third transistor and the fourth transistor. The fourth potential is applied to the other of the source terminal and the drain terminal of the tenth transistor.

In the above embodiment of the present invention, the flip-flop circuit can have a function of outputting a second output signal and can include an eleventh transistor, a twelfth transistor, and a thirteenth transistor. The eleventh transistor includes a gate terminal, a source terminal, and a drain terminal. The gate terminal of the eleventh transistor is electrically connected to the one of the source terminal and the drain terminal of the first transistor. The fifth potential is applied to one of the source terminal and the drain terminal of the eleventh transistor. A potential of the other of the source terminal and the drain terminal of the eleventh transistor is a potential of the second output signal. The twelfth transistor includes a gate terminal, a source terminal, and a drain terminal. The gate terminal of the twelfth transistor is electrically connected to the gate terminal of the other of the third transistor and the fourth transistor. One of the source terminal and the drain terminal of the twelfth transistor is electrically connected to the other of the source terminal and the drain terminal of the eleventh transistor. The fourth potential is applied to the other of the source terminal and the drain terminal of the twelfth transistor. The thirteenth transistor includes a gate terminal, a source terminal, and a drain terminal. The gate terminal of the thirteenth transistor is electrically connected to the gate terminal of the seventh transistor. One of the source terminal and the drain terminal of the thirteenth transistor is electrically connected to the other of the source terminal and the drain terminal of the eleventh transistor. The fourth potential is applied to the other of the source terminal and the drain terminal of the thirteenth transistor.

In the above embodiment of the present invention, the first control signal and the second control signal are digital signals, and the absolute value of a potential difference between a high state and a low state of each digital signal can be made larger than the absolute value of the threshold voltage of each transistor in the flip-flop circuit.

In the above embodiment of the present invention, the level of the fourth potential can be made equivalent to the level of a potential of a high state or a low state of the first control signal, the second control signal, the first clock signal, or the second clock signal.

In the above embodiment of the present invention, the phase of the first clock signal and the phase of the second clock signal are opposite to each other, and the absolute value of a potential difference between a high state and a low state of each of the first clock signal and the second clock signal can be made larger than the absolute value of the threshold voltage of each transistor in the flip-flop circuit.

In the above embodiment of the present invention, all the transistors in the flip-flop circuit can have the same conductivity type.

In the above embodiment of the present invention, each transistor in the flip-flop circuit can include a gate electrode, a gate insulating film provided so as to cover the gate electrode, a first semiconductor layer including a microcrystalline semiconductor layer and provided over the gate electrode with the gate insulating film interposed therebetween, a buffer layer provided over the first semiconductor layer, a pair of second semiconductor layers including an impurity element and provided over the buffer layer, a source electrode provided over one of the pair of second semiconductor layers, and a drain electrode provided over the other of the pair of second semiconductor layers.

An embodiment of the present invention is a display device which includes one of a scan line driver circuit and a signal line driver circuit having the above driver circuit, a plurality of scan lines, a plurality of signal lines, and a pixel portion. The pixel portion includes a plurality of pixels which are electrically connected to the scan line driver circuit through any one of the plurality of scan lines and are electrically connected to the signal line driver circuit through any one of the plurality of signal lines.

An embodiment of the present invention is an electronic device having the above display device in a display portion.

Note that in this specification, a transistor has at least three terminals: a gate terminal, a drain terminal, and a source terminal. A gate terminal refers to part of a gate electrode (including a conductive film, a wiring, and the like) or part of a portion which is electrically connected to the gate electrode. In addition, a source terminal refers to part of a source electrode (including a conductive layer, a wiring, and the like) or part of a portion which is electrically connected to the source electrode. Further, a drain terminal refers to part of a drain electrode (including a conductive layer, a wiring, and the like) or part of a portion which is electrically connected to the drain electrode. Furthermore, the transistor has a channel region between a drain region and a source region and can supply current through the drain region, the channel region, and the source region.

Further, in this specification, since a source terminal and a drain terminal of a transistor change depending on the structure, the operating condition, or the like of the transistor, it is difficult to define which is a source terminal or a drain terminal. Therefore, in this document, one of terminals selected optionally from a source terminal and a drain terminal is referred to one of the source terminal and the drain terminal, and the other of the terminals is referred to as the other of the source terminal and the drain terminal.

Note that when it is explicitly described that "B is formed on A" or "B is formed over A", it does not necessarily mean that B is formed in direct contact with A. The description includes the case where A and B are not in direct contact with each other, i.e., the case where another object is interposed between A and B. Here, each of A and B corresponds to an object (e.g., a device, an element, a circuit, a wiring, an electrode, a terminal, a conductive film, or a layer).

Therefore, for example, when it is explicitly described that "a layer B is formed on (or over) a layer A", it includes both the case where the layer B is formed in direct contact with the layer A, and the case where another layer (e.g., a layer C or a layer D) is formed in direct contact with the layer A and the layer B is formed in direct contact with the layer C or D. Note that another layer (e.g., a layer C or a layer D) may be a single layer or a plurality of layers.

Note that when it is explicitly described that "B is formed on A" or "B is formed over A", it includes the case where B is formed obliquely above A.

Further, in this specification, terms with ordinal numbers, such as "first" and "second", are used in order to avoid confusion among components, and the terms do not limit the components numerically.

According to an embodiment of the present invention, malfunctions in a circuit including a shift register can be suppressed.

DETAILED DESCRIPTION OF THE INVENTION

Hereinafter, examples of embodiments of the present invention will be described with reference to the drawings. Note that the present invention is not limited to the following description. The present invention can be implemented in various different ways and it will be readily appreciated by those skilled in the art that various changes and modifications are possible without departing from the spirit and scope of the present invention. Therefore, the present invention should not be construed as being limited to the following description of the embodiments.

Embodiment 1

In this embodiment, a driver circuit which is an embodiment of the present invention is described.

A driver circuit in this embodiment includes a shift register including a plurality of flip-flop circuits.

Figure 24:
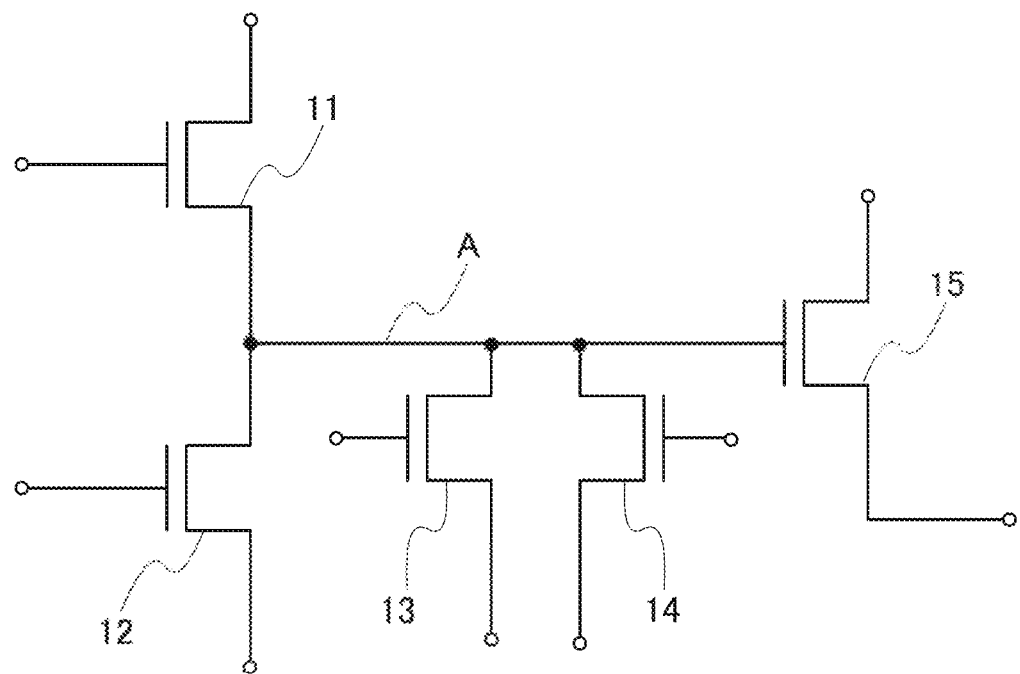
FIG. 24 is a circuit diagram illustrating an example of the structure of the driver circuit in Embodiment 1.

An example of the circuit structure of the flip-flop circuit is described with reference to FIG. 24. FIG. 24 is a circuit diagram illustrating an example of the circuit structure of the flip-flop circuit in the driver circuit of this embodiment.

At least one of the plurality of flip-flop circuits can be a flip-flop circuit having the circuit structure illustrated in FIG. 24. Note that the flip-flop circuit illustrated in FIG. 24 is, for example, a circuit to which a first signal, a second signal, and a third signal are input and which has a function of outputting an output signal.

The flip-flop circuit illustrated in FIG. 24 includes a transistor 11, a transistor 12, a transistor 13, a transistor 14, and a transistor 15.

A first potential corresponding to a potential of the first signal is applied to a gate terminal of the transistor 11. The first potential or a second potential is applied to one of a source terminal and a drain terminal of the transistor 11.

One of a source terminal and a drain terminal of the transistor 12 is electrically connected to the other of the source terminal and the drain terminal of the transistor 11. In addition, a third potential corresponding to a potential of the second signal is applied to a gate terminal of the transistor 12. A fourth potential is applied to the other of the source terminal and the drain terminal of the transistor 12.

One of the transistor 13 and the transistor 14 has a function of controlling whether to set a potential of the other of the source terminal and the drain terminal of the transistor 11 to the first potential or the fourth potential. The other of the transistor 13 and the transistor 14 has a function of controlling whether to set the potential of the other of the source terminal and the drain terminal of the transistor 11 to the fourth potential.

When the transistor 14 is on, the transistor 13 has a function of entering into an off state. Further, when the transistor 13 is in an on state, the transistor 14 has a function of entering into an off state.

The gate terminal of the transistor 15 is electrically connected to the other of the source terminal and the drain terminal of the transistor 11. In addition, a fifth potential corresponding to a potential of the third signal is applied to one of a source terminal and a drain terminal of the transistor 15. A potential of the other of the source terminal and the drain terminal of the transistor 15 is a potential of the output signal. Note that a portion where the other of the source terminal and the drain terminal of the transistor 11 and the gate terminal of the transistor 15 are connected to each other is also referred to as a node A.

Further, the transistor 15 is in an off state when the transistor 13 or the transistor 14 is in an on state.

With the above structure, when the transistor 13 or the transistor 14 is on, a potential of the node A, i.e., the potential of the gate terminal of the transistor 15 is set to a predetermined level, so that the node A does not enter into a floating state. Thus, malfunctions of the flip-flop circuit can be suppressed.

Figure 1:
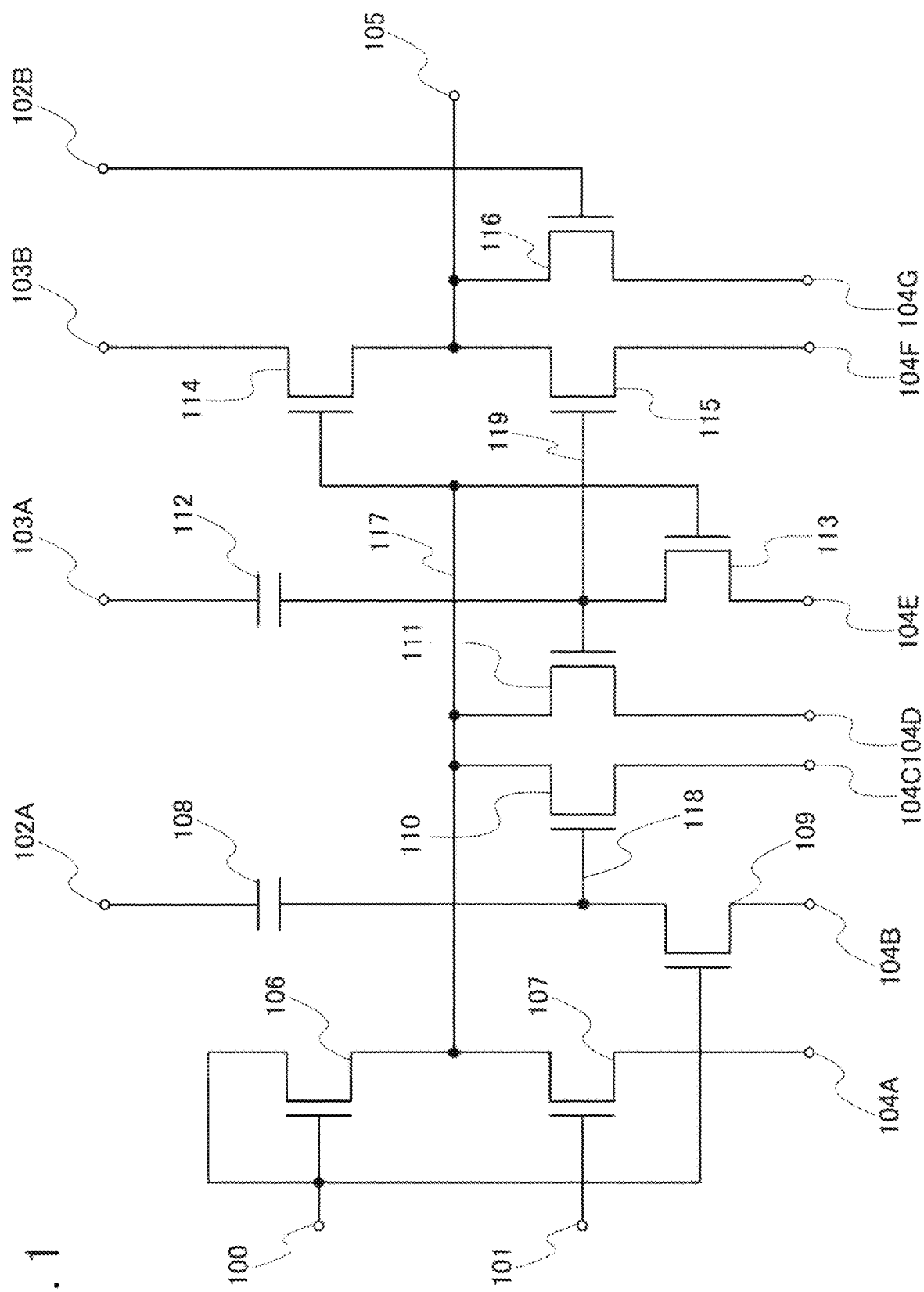
FIG. 1 is a circuit diagram illustrating an example of the structure of a driver circuit in Embodiment 1.

In addition, an example of the circuit structure of the flip-flop circuit in the driver circuit of this embodiment is described with reference to FIG. 1. FIG. 1 is a circuit diagram illustrating an example of the circuit structure of the flip-flop circuit in this embodiment.

Each of the plurality of flip-flop circuits in the driver circuit of this embodiment can be a flip-flop circuit having the circuit structure illustrated in FIG. 1. The flip-flop circuit illustrated in FIG. 1 includes a terminal 100, a terminal 101, a terminal 102, a terminal 103, a terminal 104, a terminal 105, a transistor 106, a transistor 107, a capacitor 108, a transistor 109, a transistor 110, a transistor 111, a capacitor 112, a transistor 113, a transistor 114, a transistor 115, and a transistor 116.

Note that although a terminal 102A and a terminal 102B are illustrated as the terminal 102 in the flip-flop circuit illustrated in FIG. 1, the structure of the terminal 102 is not limited to this. In the flip-flop circuit in the driver circuit of this embodiment, the terminal 102A and the terminal 102B can be electrically connected to each other so as to be one terminal 102. In addition, although a terminal 103A and a terminal 103B are illustrated as the terminal 103 in the flip-flop circuit illustrated in FIG. 1, the structure of the terminal 103 is not limited to this. In the flip-flop circuit in the driver circuit of this embodiment, the terminal 103A and the terminal 103B can be electrically connected to each other so as to be one terminal 103.

Further, although terminals 104A to 104G are illustrated as the terminal 104 in the flip-flop circuit in the driver circuit of this embodiment, the structure of the terminal 104 is not limited to this. In the flip-flop circuit in the driver circuit of this embodiment, the terminals 104A to 104G can be electrically connected to each other so as to be one terminal 104.

A gate terminal of the transistor 106 is electrically connected to the terminal 100. One of a source terminal and a drain terminal of the transistor 106 is electrically connected to the gate terminal of the transistor 106.

A gate terminal of the transistor 107 is electrically connected to the terminal 101. One of a source terminal and a drain terminal of the transistor 107 is electrically connected to the other of the source terminal and the drain terminal of the transistor 106. The other of the source terminal and the drain terminal of the transistor 107 is electrically connected to the terminal 104A. Note that although not illustrated for convenience, a structure where the transistor 107 is not provided can be used in the flip-flop circuit in the driver circuit of this embodiment. By using the structure where the transistor 107 is not provided, the circuit area can be made smaller.

The capacitor 108 includes at least two terminals. One of the terminals of the capacitor 108 is electrically connected to the terminal 102A.

A gate terminal of the transistor 109 is electrically connected to the one of the source terminal and the drain terminal of the transistor 106. One of a source terminal and a drain terminal of the transistor 109 is electrically connected to the other of the terminals of the capacitor 108. The other of the source terminal and the drain terminal of the transistor 109 is electrically connected to the terminal 104B.

A gate terminal of the transistor 110 is electrically connected to the one of the source terminal and the drain terminal of the transistor 109. One of a source terminal and a drain terminal of the transistor 110 is electrically connected to the other of the source terminal and the drain terminal of the transistor 106. The other of the source terminal and the drain terminal of the transistor 110 is electrically connected to the terminal 104C.

The capacitor 112 includes at least two terminals. One of the terminals of the capacitor 112 is electrically connected to the terminal 103A.

A gate terminal of the transistor 111 is electrically connected to the other of the terminals of the capacitor 112. One of a source terminal and a drain terminal of the transistor 111 is electrically connected to the other of the source terminal and the drain terminal of the transistor 106. The other of the source terminal and the drain terminal of the transistor 111 is electrically connected to the terminal 104D.

A gate terminal of the transistor 113 is electrically connected to the other of the source terminal and the drain terminal of the transistor 106. One of a source terminal and a drain terminal of the transistor 113 is electrically connected to the gate terminal of the transistor 111. The other of the source terminal and the drain terminal of the transistor 113 is electrically connected to the terminal 104E.

Figure 26:
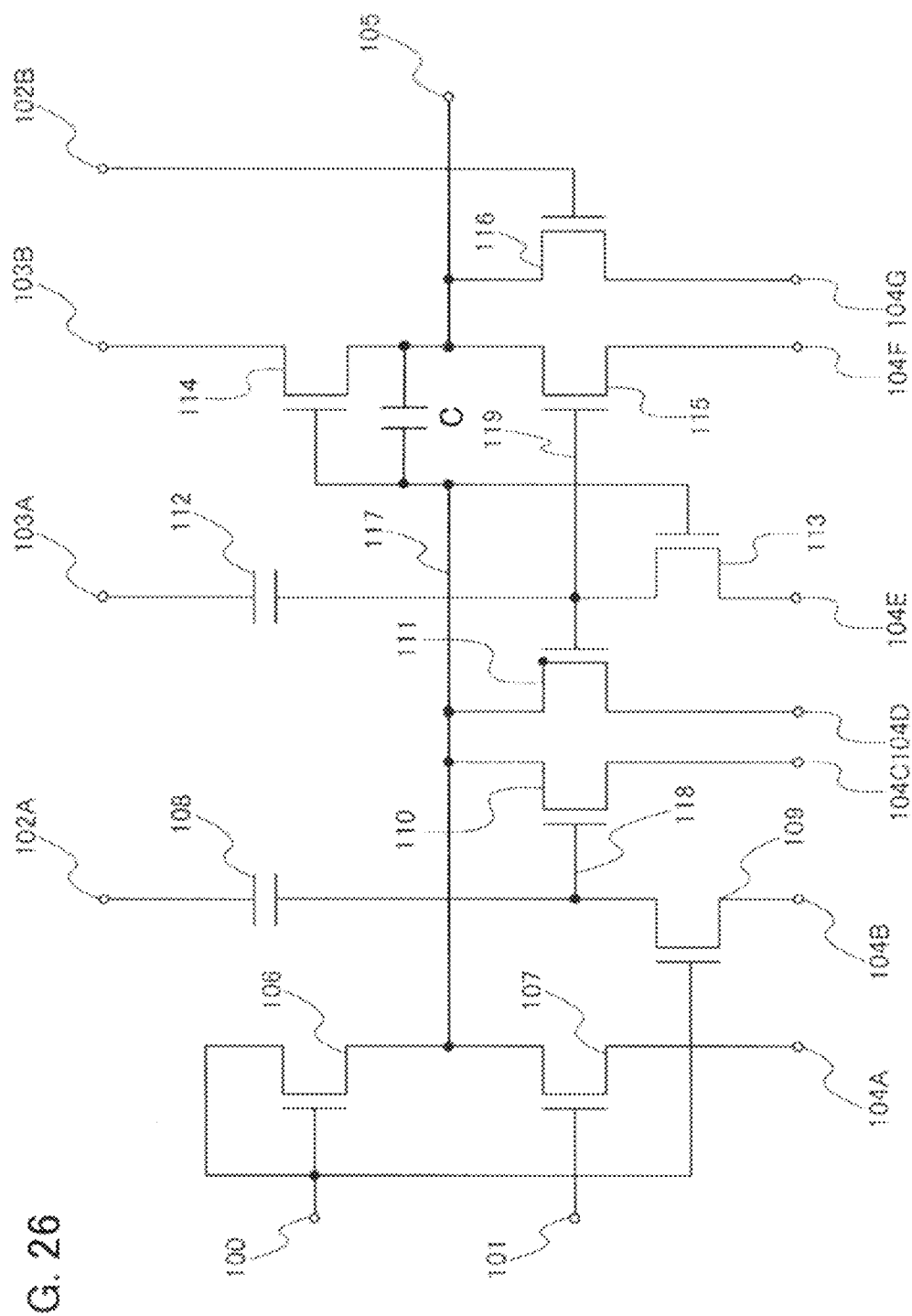
FIG. 26 is a circuit diagram of a driver circuit.

A gate terminal of the transistor 114 is electrically connected to the other of the source terminal and the drain terminal of the transistor 106. One of a source terminal and a drain terminal of the transistor 114 is electrically connected to the terminal 103B. The other of the source terminal and the drain terminal of the transistor 114 is electrically connected to the terminal 105. A potential of the other of the source terminal and the drain terminal of the transistor 114 is an output signal and is output through the terminal 105. Note that in the flip-flop circuit in the driver circuit of this embodiment, a capacitor can be additionally provided between the gate terminal of the transistor 114 and the other of the source terminal and the drain terminal of the transistor 114 (see FIG. 26).

A gate terminal of the transistor 115 is electrically connected to the gate terminal of the transistor 111. One of a source terminal and a drain terminal of the transistor 115 is electrically connected to the other of the source terminal and the drain terminal of the transistor 114. The other of the source terminal and the drain terminal of the transistor 115 is electrically connected to the terminal 104F.

A gate terminal of the transistor 116 is electrically connected to the terminal 102B. One of a source terminal and a drain terminal of the transistor 116 is electrically connected to the other of the source terminal and the drain terminal of the transistor 114. The other of the source terminal and the drain terminal of the transistor 116 is electrically connected to the terminal 104G.

Note that a portion where the one of the source terminal and the drain terminal of the transistor 109 is connected to the other of the terminals of the capacitor 108 or the gate terminal of the transistor 110 is also referred to as a node 118. In addition, a portion where the other of the source terminal and the drain terminal of the transistor 106 is connected to the one of the source terminal and the drain terminal of the transistor 107, the one of the source terminal and the drain terminal of the transistor 110, the one of the source terminal and the drain terminal of the transistor 111, the gate terminal of the transistor 113, or the gate terminal of the transistor 114 is also referred to as a node 117. Further, a portion where the gate terminal of the transistor 111 is connected to the other of the terminals of the capacitor 112, the one of the source terminal and the drain terminal of the transistor 113, or the gate terminal of the transistor 115 is also referred to as a node 119.

In the flip-flop circuit illustrated in FIG. 1, a first control signal is input through the terminal 100, and a second control signal is input through the terminal 101. As each of the first control signal and the second control signal, a digital signal having two states of a high state and a low state can be used, for example. In the case of using the digital signal, the first control signal or the second control signal having a predetermined potential is input as a first potential (also referred to as V1) through the terminal 100 or the terminal 101 when the first control signal or the second control signal, which is input, is in a high state (also referred to as a high level); the first control signal or the second control signal having a potential which is lower than the predetermined potential in the high state is input as a second potential (also referred to as V2) through the terminal 100 or the terminal 101 when the first control signal or the second control signal, which is input, is in a low state (also referred to as a low level). The levels of the potentials in the high state and the low state can be set as appropriate considering the level of the threshold voltage of each transistor, or the like, for example. For example, the levels of the potentials in the high state and the low state are preferably set so that a potential difference between the high state and the low state is larger than the absolute value of the threshold voltage of each transistor in the flip-flop circuit.

In the flip-flop circuit illustrated in FIG. 1, a clock signal which is in a first phase (also referred to as a first clock signal or a CK signal) or a clock signal which is in a second phase (also referred to as a second clock signal, a CKB signal, or a signal obtained by inverting the first clock signal) is input through the terminal 102 (also referred to as the terminal 102A and the terminal 102B). Each of the first clock signal and the second clock signal has two potential states of a high state and a low state. A potential of each clock signal is the potential V1 when each clock signal is in a high state (also referred to as a high level), and the potential of each clock signal is the potential V2 when each clock signal is in a low state (also referred to as a low level). Note that the levels of the potentials of the first clock signal and the second clock signal in a high state are preferably equivalent to the levels of the potentials of the first control signal and the second control signal in the high state. The levels of the potentials of the first clock signal and the second clock signal in a low state are preferably equivalent to the levels of the potentials of the first control signal and the second control signal in the low state. Further, the levels of the potentials in the high state and the low state can be set as appropriate considering the level of the threshold voltage of each transistor, or the like, for example. For example, the levels of the potentials in the high state and the low state are preferably set so that a potential difference between the high state and the low state is larger than the absolute value of the threshold voltage of each transistor in the flip-flop circuit.

The phase of the first clock signal and the phase of the second clock signal are opposite to each other. For example, in a predetermined period, the second clock signal is in the low state when the first clock signal is in the high state, and the second clock signal is in the high state when the first clock signal is in the low state.

In the flip-flop circuit, the first clock signal or the second clock signal is input through the terminal 103 (also referred to as the terminal 103A and the terminal 103B). Note that the phase of the clock signal which is input through the terminal 102 and the phase of the second clock signal which is input through the terminal 103 are opposite to each other. For example, the second clock signal is input through the terminal 103 in the case where the first clock signal is input through the terminal 102, and the first clock signal is input through the terminal 103 in the case where the second clock signal is input through the terminal 102.

A potential having a predetermined level is applied to the flip-flop circuit illustrated in FIG. 1 through the terminal 104 (also referred to as the terminals 104A to 104G). In this case, the level of the potential having the predetermined level can be set to V1 or V2, for example. That is, the level of the potential having the predetermined level can be made equivalent to the level of a potential of a digital signal such as a clock signal or a control signal in a high state or a low state.

Note that although the one of the source terminal and the drain terminal of the transistor 106 is electrically connected to the terminal 100 in the flip-flop circuit illustrated in FIG. 1, the structure of the flip-flop circuit is not limited to this. In the flip-flop circuit in the driver circuit of this embodiment, the one of the source terminal and the drain terminal of the transistor 106 can be electrically connected to a power supply terminal separately so that the potential V1 or the potential V2 can be applied.

The transistor 106 has a function of controlling conduction between the terminal 100 and the node 117 in accordance with a signal which is input through the terminal 100.

The transistor 107 has a function of controlling conduction between the terminal 104A and the node 117 in accordance with a signal which is input through the terminal 101. By bringing the terminal 104A and the node 117 into conduction, a potential of the node 117 is set to V1 or V2.

The capacitor 108 has a function of changing a potential of the node 118 by capacitive coupling in accordance with a signal which is input through the terminal 102 (the terminal 102A). For example, the capacitor 108 has a function of setting the potential of the node 118 to the potential V1 by capacitive coupling in the case where the signal which is input through the terminal 102 (the terminal 102A) is changed from a low state to a high state. On the other hand, the capacitor 108 has a function of setting the potential of the node 118 to V1 or V2 by capacitive coupling in the case where the signal which is input through the terminal 102 is changed from the high state to the low state.

The transistor 109 has a function of controlling conduction between the terminal 104B and the node 118 in accordance with the signal which is input through the terminal 100. By bringing the terminal 104B and the node 118 into conduction, the potential of the node 118 is set to V1 or V2.

The transistor 110 has a function of controlling conduction between the terminal 104C and the node 117 in accordance with the potential of the node 118. By bringing the terminal 104C and the node 117 into conduction, the potential of the node 117 is set to V1 or V2. In addition, the transistor 110 has a function of entering into an off state when the transistor 111 is in an on state.

The transistor 111 has a function of controlling conduction between the terminal 104D and the node 117 in accordance with a potential of the node 119. By bringing the terminal 104D and the node 117 into conduction, the potential of the node 117 is set to V1 or V2. In addition, the transistor 111 has a function of entering into an off state when the transistor 110 is on.

The capacitor 112 has a function of changing the potential of the node 119 by capacitive coupling in accordance with a signal which is input through the terminal 103A. For example, the capacitor 112 sets the potential of the node 119 to V1 by capacitive coupling in the case where the signal which is input through the terminal 103A is changed from a low state to a high state. On the other hand, the capacitor 112 sets the potential of the node 119 to V2 by capacitive coupling in the case where the signal which is input through the terminal 103A is changed from the high state to the low state.

The transistor 113 has a function of controlling conduction between the terminal 104E and the node 119. By bringing the terminal 104E and the node 119 into conduction, the potential of the node 119 is set to V1 or V2.

The transistor 114 has a function of controlling conduction between the terminal 103B and the terminal 105 in accordance with the potential of the node 117. By bringing the terminal 103B and the terminal 105 into conduction, the transistor 114 makes the level of a potential of a signal which is input through the terminal 103B equivalent to the level of the potential of a signal which is output through the terminal 105.

Further, the transistor 114, for example, is an n-channel transistor and has a function of raising the potential of the node 117 in accordance with rise in the potential of a connection portion between the transistor 114 and the terminal 105 when the signal which is input through the terminal 103B is changed from the low state to the high state in the case where the potential of the node 117 is V1. That is, the transistor 114 performs so-called bootstrap operation. Note that the bootstrap operation is often performed using parasitic capacitance between the gate terminal of the transistor 114 and the other of the source terminal and the drain terminal of the transistor 114.

The transistor 115 has a function of controlling conduction between the terminal 104F and the terminal 105 in accordance with the potential of the node 119. By bringing the terminal 104F and the terminal 105 into conduction, a potential of the signal which is output through the terminal 105 is set to V1 or V2.

The transistor 116 has a function of controlling conduction between the terminal 104G and the terminal 105 in accordance with a signal which is input through the terminal 102B. By bringing the terminal 104G and the terminal 105 into conduction, the transistor 116 sets the potential of the signal which is output through the terminal 105 to V1 or V2.

Note that since all the transistors can have the same conductivity type in the driver circuit of this embodiment, manufacturing steps can be simplified. Therefore, manufacturing cost can be reduced and yield can be improved. Further, a semiconductor device such as a large display panel can be easily manufactured. In the driver circuit of this embodiment, all the transistors can be transistors having n-type conductivity (also referred to as n-channel transistors) or transistors having p-type conductivity (also referred to as p-channel transistors). Note that description "the same" also corresponds to description "substantially the same".

Figure 2:
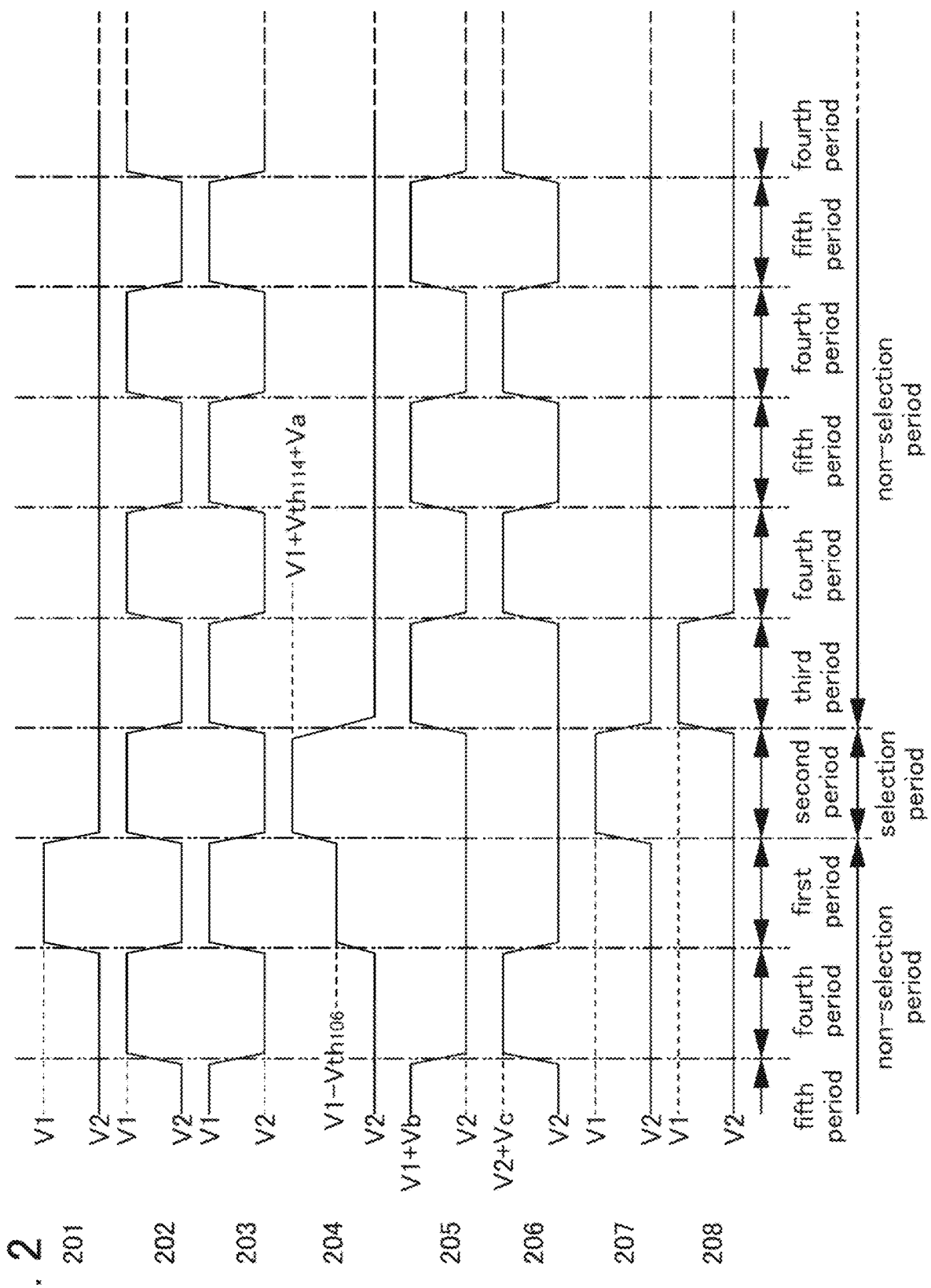
FIG. 2 is a timing chart illustrating the operation of the driver circuit illustrated in FIG. 1.

Next, the operation of the driver circuit illustrated in FIG. 1 is described with reference to FIG. 2. FIG. 2 is a timing chart illustrating an example of the operation of the driver circuit illustrated in FIG. 1. Note that in this embodiment, as an example, the second clock signal is input through the terminal 102 and the first clock signal is input through the terminal 103. In addition, here, as an example of the operation of the driver circuit illustrated in FIG. 1, the case where all the transistors in the flip-flop circuit are n-channel transistors is described.

As for the operation of the driver circuit illustrated in FIG. 1, predetermined operation in a certain period is repeated, as illustrated in FIG. 2. The certain period is divided into a selection period and a non-selection period. Further, the selection period and the non-selection period are divided into a first period, a second period, a third period, a fourth period, and a fifth period. In FIG. 2, the first period, the third period, the fourth period, and the fifth period are the non-selection period, and the second period is the selection period.

First, in the first period, a first control signal 201 which is in a high state is input through the terminal 100; a second control signal 208 which is in a low state is input through the terminal 101; a second clock signal 203 which is in a high state is input through the terminal 102; a first clock signal 202 which is in a low state is input through the terminal 103. Accordingly, the transistor 106, the transistor 109, and the transistor 116 are turned on, and the transistor 107 is turned off.

When the transistor 106 is turned on, a potential 204 of the node 117 starts to rise. In this case, the potential of the node 117 rises to a value obtained by subtracting the threshold voltage of the transistor 106 (also referred to as $Vth_{106}$) from the potential V1 of the first control signal 201, i.e., to $V1-Vth_{106}$. When the potential of the node 117 is at $V1-Vth_{106}$, the transistor 106 is turned off.

When the potential 204 of the node 117 is at $V1-Vth_{106}$, the transistor 113 is turned on. In this case, the level of a potential 206 of the node 119 becomes equivalent to the level of the potential V2 which is applied through the terminal 104E.

When the potential 206 of the node 119 is at V2, the transistor 111 and the transistor 115 are turned off.

When the transistor 109 is turned on, the level of a potential 205 of the node 118 becomes equivalent to the level of the potential V2 which is applied through the terminal 104B.

When the potential 205 of the node 118 is at V2, the transistor 110 is turned off.

When the transistor 106, the transistor 107, the transistor 110, and the transistor 111 are turned off as described above, the node 117 enters into a floating state with the potential thereof kept at $V1-Vth_{106}$.

When the potential 204 of the node 117 is at $V1-Vth_{106}$, the transistor 114 is turned on.

In this case, the level of a potential of an output signal 207 which is output through the terminal 105 becomes equivalent to the level of the potential V2 which is applied through the terminal 103B or the level of the potential V2 which is applied through the terminal 104G. The above is the operation in the first period.

Next, in the second period, the first control signal 201 which is in a low state is input through the terminal 100; the second control signal 208 which is in the low state is input through the terminal 101; the second control signal 203 which is in a low state is input through the terminal 102; the first control signal 202 which is in a high state is input through the terminal 103. In this case, the transistor 106, the transistor 109, and the transistor 116 are turned off, and the transistor 107 is kept off.

Note that the transistor 109 is turned off after the second clock signal 203 which is input through the terminal 102A enters into a low state in many cases. This is because the first control signal 201 which is input through the terminal 100 is often delayed as compared to the second clock signal 203. By turning off the transistor 109 after the second clock signal 203 enters into the low state, the node 118 enters into a floating state with the potential thereof kept at the potential V2, and the transistor 110 is kept off.

The capacitor 108 holds a potential difference between a potential of the second clock signal 203 which is input through the terminal 102A and the potential 205 of the node 118, i.e., a potential difference between the potential of the second clock signal 203 which is in the low state and the potential V2 which is applied through the terminal 104B.

When the transistor 106, the transistor 107, and the transistor 110 are in an off state as described above, the potential 204 of the node 117 is kept at $V1-Vth_{106}$.

When the potential 204 of the node 117 is $V1-Vth_{106}$, the transistor 113 is kept on. When the transistor 113 is kept on, the potential 206 of the node 119 is kept at V2, and the transistor 111 and the transistor 115 are kept off.

When the potential 204 of the node 117 is kept at V1-Vth$_{106}$ and a potential of the one of the source terminal and the drain terminal of the transistor 114 is at the potential V1 of the first clock signal 202, a potential of the output signal 207 which is output through the terminal 105 rises. Then, since the node 117 is in a floating state, the potential 204 of the node 117 rises by capacitive coupling of parasitic capacitance between the gate terminal of the transistor 114 and the other of the source terminal and the drain terminal of the transistor 114 in accordance with the potential of the output signal 207. This is so-called bootstrap operation.

The potential 204 of the node 117 rises to a value which is larger than the sum of the potential V1 of the first clock signal 202 and the threshold voltage of the transistor 114 (also referred to as Vth$_{114}$), i.e., to V1+Vth$_{114}$++Vα (Vα is a given positive number). In this case, the transistor 114 is kept on.

In this case, the level of the potential of the output signal 207 which is output through the terminal 105 becomes equivalent to the level of the potential V1 which is applied through the terminal 103B. The above is the operation in the second period.

Next, in the third period, the first control signal 201 which is in the low state is input through the terminal 100; the second control signal 208 which is in a high state is input through the terminal 101; the second clock signal 203 which is in the high state is input through the terminal 102; the first clock signal 202 which is in the low state is input through the terminal 103. In this case, the transistor 107 and the transistor 116 are turned on, and the transistor 106 and the transistor 109 are kept off.

When the transistor 107 is turned on, the level of the potential 204 of the node 117 becomes equivalent to the level of the potential V2 which is applied through the terminal 104A.

The potential 205 of the node 118 is at V2+Vb by capacitive coupling of the capacitor 108. The potential Vb is preferably higher than the threshold voltage of the transistor 110 and lower than V1−V2.

When the potential 205 of the node 118 is at V2+Vb, the transistor 110 is turned on. When the transistor 110 is turned on, the level of the potential 204 of the node 117 becomes equivalent to the level of the potential V2 which is applied through the terminal 104C.

When the potential 204 of the node 117 is at V2, the transistor 113 and the transistor 114 are turned off. Note that the transistor 113 is turned off after the first clock signal 202 which is input through the terminal 103A enters into a low state in many cases. This is because the potential 204 of the node 117 is often delayed or dulled as compared to the first clock signal 202. When the transistor 113 is turned off after the first clock signal 202 enters into the low state, the node 119 enters into a floating state with the potential thereof kept at the potential V2 which is applied through the terminal 104E.

When the node 119 is in the floating state, the transistor 111 and the transistor 115 are kept off.

The capacitor 112 holds a potential difference between the potential of the first clock signal 202 which is input through the terminal 103A and the potential 206 of the node 119, i.e., a potential difference between the potential of the first clock signal 202 which is in the low state and the potential V2 which is applied through the terminal 104E.

In this case, the level of the potential of the output signal 207 which is output through the terminal 105 becomes equivalent to the level of the potential V2 which is applied through the terminal 104G. The above is the operation in the third period.

Next, in the fourth period, the first control signal 201 which is in the low state is input through the terminal 100; the second control signal 208 which is in the low state is input through the terminal 101; the second clock signal 203 which is in the low state is input through the terminal 102; the first clock signal 202 which is in the high state is input through the terminal 103. In this case, the transistor 107 and the transistor 116 are turned off, and the transistor 106 and the transistor 109 are kept off.

In this case, the potential 205 of the node 118 is at V2 by the capacitive coupling of the capacitor 108. Therefore, the transistor 110 is turned off.

The potential 206 of the node 119 is at V2+Vc by capacitive coupling of the capacitor 112. The potential Vc is preferably higher than the threshold voltage of the transistor 111 or the threshold voltage of the transistor 115 and lower than V1−V2.

When the potential 206 of the node 119 is at V2+Vc, the transistor 111 and the transistor 115 are turned on.

When the transistor 111 is turned on, the level of the potential 204 of the node 117 becomes equivalent to the level of the potential V2 which is applied through the terminal 104D.

When the potential 204 of the node 117 is at V2, the transistor 113 and the transistor 114 are turned off.

When the transistor 115 is turned on, the level of the potential of the output signal 207 which is output through the terminal 105 becomes equivalent to the level of the potential V2 which is applied through the terminal 104F. The above is the operation in the fourth period.

Next, in the fifth period, the first control signal 201 which is in the low state is input through the terminal 100; the second control signal 208 which is in the low state is input through the terminal 101; the second clock signal 203 which is in the high state is input through the terminal 102; the first clock signal 202 which is in the low state is input through the terminal 103. In this case, the transistor 116 is turned on, and the transistor 106, the transistor 107, and the transistor 109 are kept off.

In this case, the potential of the node 118 is at V2+Vb by the capacitive coupling of the capacitor 108. When the potential of the node 118 is at V2+Vb, the transistor 110 is turned on. When the transistor 110 is turned on, the level of the potential 204 of the node 117 becomes equivalent to the level of the potential V2 which is applied through the terminal 104C.

The potential 206 of the node 119 is at V2 by the capacitive coupling of the capacitor 112. When the potential 206 of the node 119 is at V2, the transistor 111 and the transistor 115 are turned off.

When the potential 204 of the node 117 is at V2, the transistor 113 and the transistor 114 are turned off.

In this case, the level of the potential of the output signal 207 which is output through the terminal 105 becomes equivalent to the level of the potential V2 which is applied through the terminal 104G. The above is the operation in the fifth period.

As described above, in the driver circuit of this embodiment, during the non-selection period after a reset period (the third period), the operation in the fourth period and the operation in the fifth period are repeated plural times. Thus, a potential having a certain level is applied to the node 117 in any period of the non-selection period, so that the node 117 can be prevented from entering into a floating state.

Therefore, since the adverse effect of noise can be reduced, malfunctions can be suppressed.

In addition, in the operation of the driver circuit of this embodiment, a potential having a certain level can be applied to the node 117 by turning on different transistors in the fourth period and the fifth period. Thus, for example, even in the case of using a transistor which easily deteriorates, such as a transistor having a semiconductor layer formed using an amorphous semiconductor, deterioration of each transistor can be suppressed. Therefore, deviation in timing of switching operation of a transistor due to deterioration can be reduced, so that malfunctions can be suppressed.

Figure 25A:
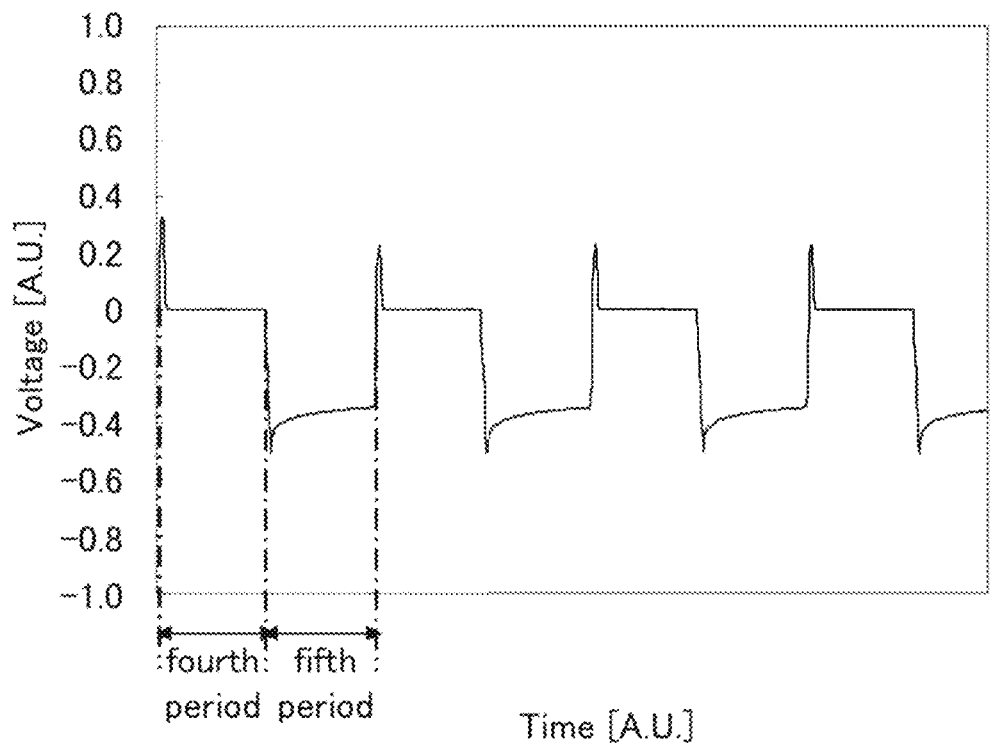
FIGS. 25A and 25B are graphs each illustrating the results of circuit simulation of the driver circuit in Embodiment 1.
Figure 25B:
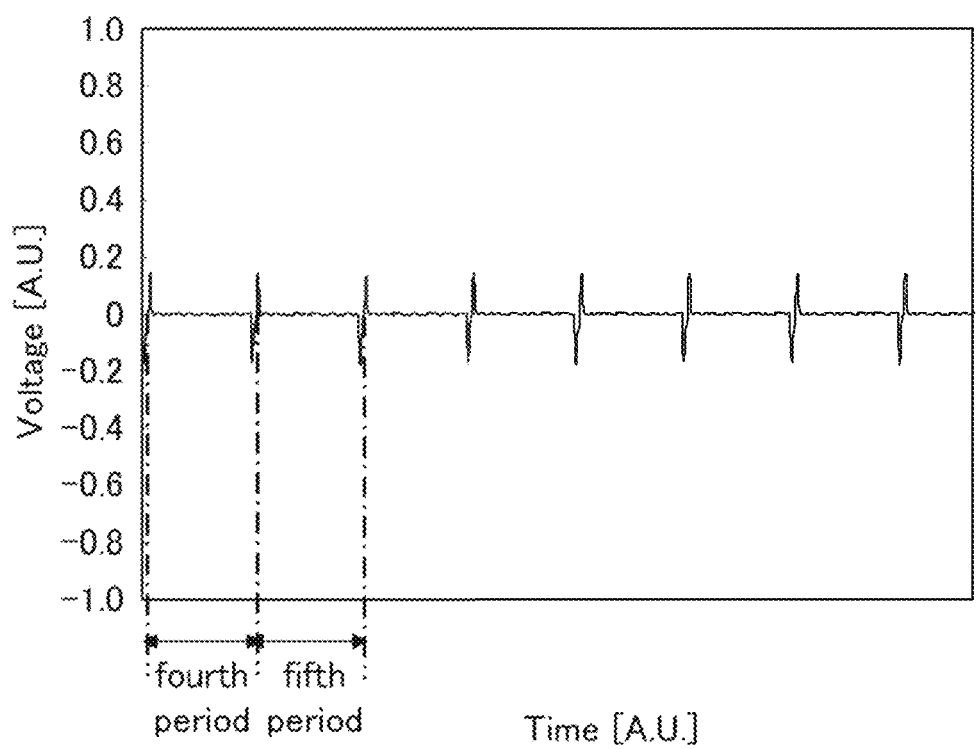

Here, the circuit simulation results in the case of a conventional driver circuit where the potential of the node 117 is controlled by providing one of the transistor 110 and the transistor 111 in the fourth period and the fifth period in FIG. 2 and the circuit simulation results in the case of the driver circuit which is an embodiment of the present invention, where the potential of the node 117 is controlled by providing both the transistor 110 and the transistor 111 in the fourth period and the fifth period in FIG. 2, are illustrated in FIGS. 25A and 25B. Note that the simulation was performed using a SPICE circuit simulator. In addition, here, as an example, all transistors in a flip-flop circuit were n-channel transistors and V2 was 0 V.

In FIGS. 25A and 25B, FIG. 25A is a graph illustrating changes in the potential (voltage) of the node 117 in the case where the node 117 is controlled using one of the transistor 110 and the transistor 111 in the fourth period and the fifth period; FIG. 25B is a graph illustrating changes in the potential (voltage) of the node 117 in the case where the node 117 is controlled using both the transistor 110 and the transistor 111 in the fourth period and the fifth period. Note that in FIGS. 25A and 25B, the unit of voltage is an arbitrary unit (A.U.).

Noise generated in the fourth period and the fifth period after the reset period (the third period) adversely affects the node 117 mainly due to parasitic capacitance of the transistor 114 illustrated in FIG. 1. First, in a conventional driver circuit, since a transistor is controlled using a signal synchronized with one clock signal, after the reset period, the transistor 114 enters into a floating state in the fourth period or the fifth period. When the transistor 114 enters into a floating state, noise is mixed into a normal potential, so that the potential (voltage) of the node 117 changes by approximately 0.4 A.U. every certain period (the fifth period in FIG. 25A), as illustrated in FIG. 25A.

On the other hand, in the driver circuit which is an embodiment of the present invention, the transistor 110 and the transistor 111 are controlled using signals synchronized with two clock signals whose phases are opposite to each other. Thus, a predetermined potential is applied without making the transistors into a floating state in both the fourth period and the fifth period, so that it is apparent that a change in the potential of the node 117 is smaller than or equal to 0.2 A.U., which is a small change, that is, the adverse effect of noise is little, as illustrated in FIG. 25B. Accordingly, it is apparent that by using a plurality of transistors and turning on the transistor 110 or the transistor 111 in the fourth period and the fifth period so that a predetermined potential is applied to the node 117, the adverse effect of noise can be reduced.

Figure 3:
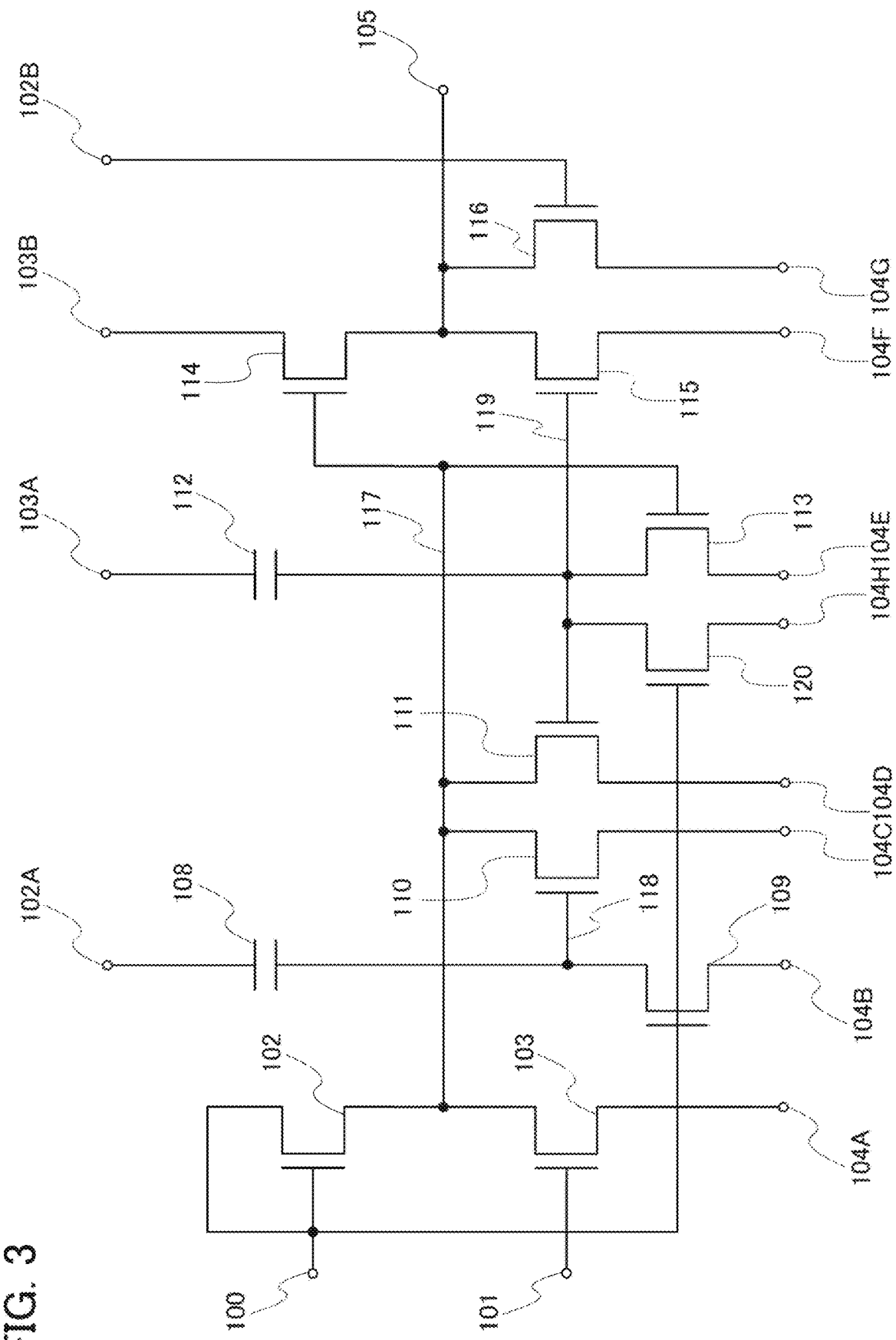
FIG. 3 is a circuit diagram illustrating an example of the structure of the driver circuit in Embodiment 1.

Further, in this embodiment, the driver circuit which is an embodiment of the present invention can be formed using a structure which is different from the structure in FIG. 1. A different structure of the driver circuit of this embodiment is described with reference to FIG. 3. FIG. 3 is a circuit diagram illustrating an example of the structure of the driver circuit of this embodiment.

In the different structure of the driver circuit of this embodiment, which is illustrated in FIG. 3, in addition to the circuit structure illustrated in FIG. 1, a transistor 120 and a terminal 104H are provided.

In FIG. 3, portions denoted by the same reference numerals as in FIG. 1 are the same portions as in the driver circuit in FIG. 1, so that description thereof is omitted.

A gate terminal of the transistor 120 is electrically connected to the terminal 100. One of a source terminal and a drain terminal of the transistor 120 is electrically connected to the gate terminal of the transistor 111. The other of the source terminal and the drain terminal of the transistor 120 is electrically connected to the terminal 104H.

Since a potential which is the same as the potential applied through the terminals 104A to 104G in FIG. 1 is applied through the terminal 104H, the description in FIG. 1 is incorporated. In addition, the terminals 104A to 104H can be electrically connected to each other so as to be one terminal 104.

The transistor 120 has a function of controlling conduction between the terminal 104H and the node 119 in accordance with the signal which is input through the terminal 100. By bringing the terminal 104H and the node 119 into conduction, the potential of the node 119 is set to V1 or V2.

Next, the operation of the driver circuit illustrated in FIG. 3 is described. Note that only the operation of the transistor 120 is described as the operation of the driver circuit in FIG. 3, and the description in FIG. 1 is incorporated in description of operation which is the same as the operation of the elements in the driver circuit illustrated in FIG. 1. In addition, here, as an example of the operation of the driver circuit illustrated in FIG. 3, the case where all the transistors in the flip-flop circuit are n-channel transistors is described.

In a first period, the first control signal 201 which is in the high state is input through the terminal 100. In this case, the transistor 120 is turned on.

When the transistor 120 is turned on, the level of the potential of the node 119 becomes equivalent to the level of the potential V2 which is applied through the terminal 104H. Therefore, the transistor 111 and the transistor 115 are turned off.

After that, in second to fifth periods, the first control signal 201 which is in the low state is input through the terminal 100. In this case, the transistor 120 is turned off.

As described above, in the driver circuit illustrated in FIG. 3, in addition to the advantageous effects of the circuit structure in FIG. 1, the potential of the node 119 can be more surely set to the potential V2 in the first period by directly inputting the first control signal 201 to the transistor 120 in the first period so that the transistor 120 is turned on.

Figure 4:
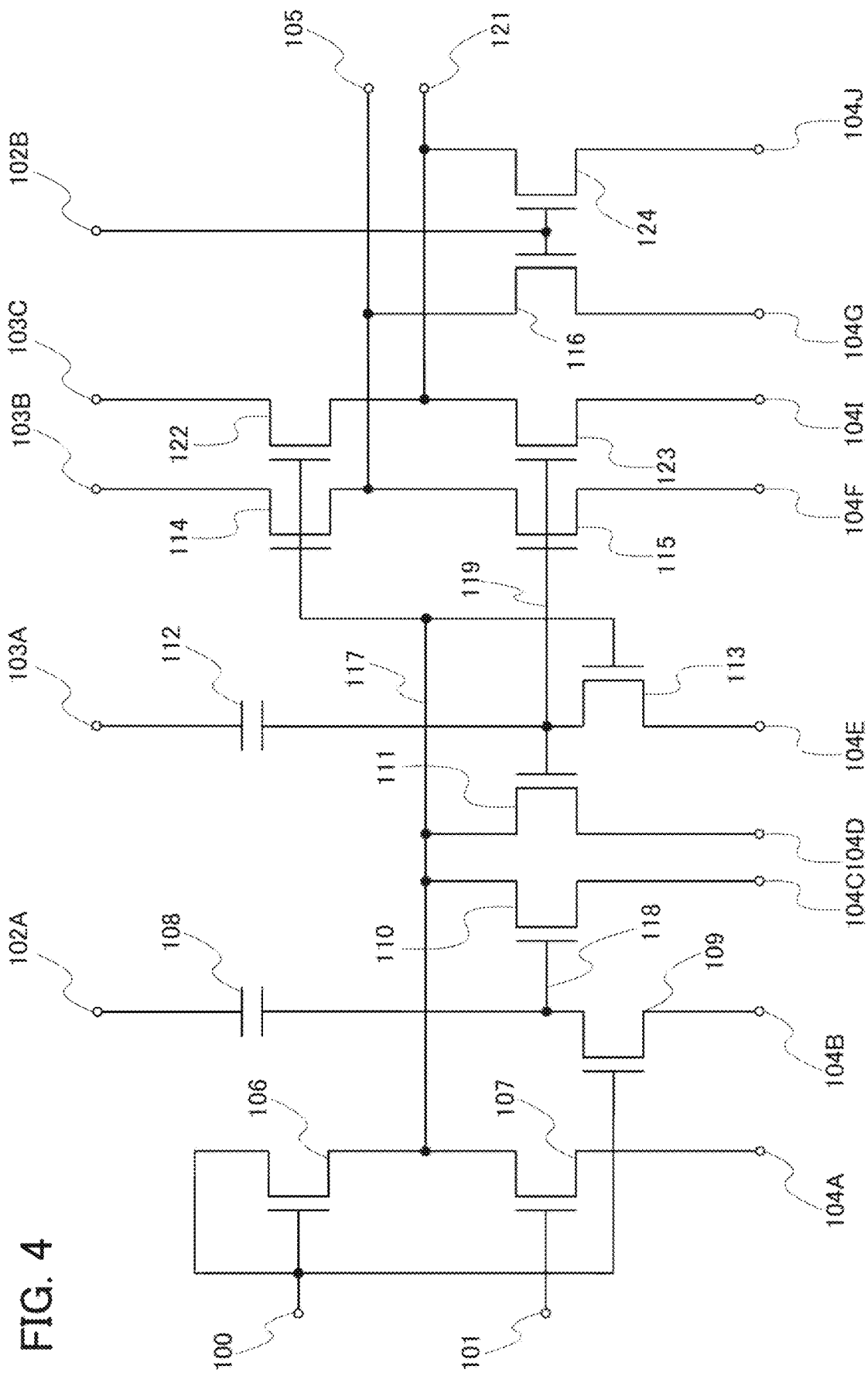
FIG. 4 is a circuit diagram illustrating an example of the structure of the driver circuit in Embodiment 1.

Further, in this embodiment, the driver circuit which is an embodiment of the present invention can be formed using a structure which is different from the structures in FIG. 1 and FIG. 3. A different structure of the driver circuit of this embodiment is described with reference to FIG. 4. FIG. 4 is a circuit diagram illustrating an example of the circuit structure of the driver circuit of this embodiment.

In the structure of the driver circuit illustrated in FIG. 4, in addition to the circuit structure illustrated in FIG. 1, a terminal 103C, a terminal 104I, a terminal 104J, a terminal 121, a transistor 122, a transistor 123, and a transistor 124 are provided.

Note that in FIG. 4, elements denoted by the same reference numerals as in FIG. 1 are the same elements as in the driver circuit in FIG. 1, so that the description in FIG. 1 is incorporated.

A gate terminal of the transistor 122 is electrically connected to the other of the source terminal and the drain terminal of the transistor 106. One of a source terminal and a drain terminal of the transistor 122 is electrically connected to the terminal 103C. The other of the source terminal and the drain terminal of the transistor 122 is electrically connected to the terminal 121.

A gate terminal of the transistor 123 is electrically connected to the gate terminal of the transistor 111. One of a source terminal and a drain terminal of the transistor 123 is electrically connected to the other of the source terminal and the drain terminal of the transistor 122. The other of the source terminal and the drain terminal of the transistor 123 is electrically connected to the terminal 104I.

A gate terminal of the transistor 124 is electrically connected to the terminal 102B. One of a source terminal and a drain terminal of the transistor 124 is electrically connected to the other of the source terminal and the drain terminal of the transistor 122. The other of the source terminal and the drain terminal of the transistor 124 is electrically connected to the terminal 104J.

Since a signal which is the same as the signal input through the terminal 103A and the terminal 103B in FIG. 1 is input through the terminal 103C, the description in FIG. 1 is incorporated. In addition, the terminals 103A to 103C can be electrically connected to each other so as to be one terminal 103.

Since a potential which is the same as the potential applied through the terminals 104A to 104G in FIG. 1 is applied through the terminal 104I and the terminal 104J, the description in FIG. 1 is incorporated. In addition, the terminals 104A to 104G, and the terminals 104I and 104J can be electrically connected to each other so as to be one terminal 104.

Further, the flip-flop circuit outputs signals generated in the flip-flop circuit through the terminal 121.

The transistor 122 has a function of bringing the terminal 103C and the terminal 121 into conduction in accordance with the potential of the node 117 so that the level of a potential of the signal which is input through the terminal 103C is made equivalent to the level of a potential of a signal which is output through the terminal 121. In particular, the transistor 122 has a function of raising the potential of the node 117 in accordance with rise in the potential of the signal which is output through the terminal 121 when the signal which is input through the terminal 103C is changed from the low state to the high state in the case where the potential of the node 117 is V1. That is, the transistor 122 performs so-called bootstrap operation. Note that the bootstrap operation is often performed using parasitic capacitance between the gate terminal of the transistor 122 and the other of the source terminal and the drain terminal of the transistor 122.

The transistor 123 has a function of controlling conduction between the terminal 104I and the terminal 121 in accordance with the potential of the node 119. By bringing the terminal 104I and the terminal 121 into conduction, the potential of the signal which is output through the terminal 121 is set to V1 or V2.

The transistor 124 has a function of controlling conduction between the terminal 104J and the terminal 121 in accordance with the signal which is input through the terminal 102B. By bringing the terminal 104J and the terminal 121 into conduction, the potential of the signal which is output through the terminal 121 is set to V1 or V2.

Figure 5:
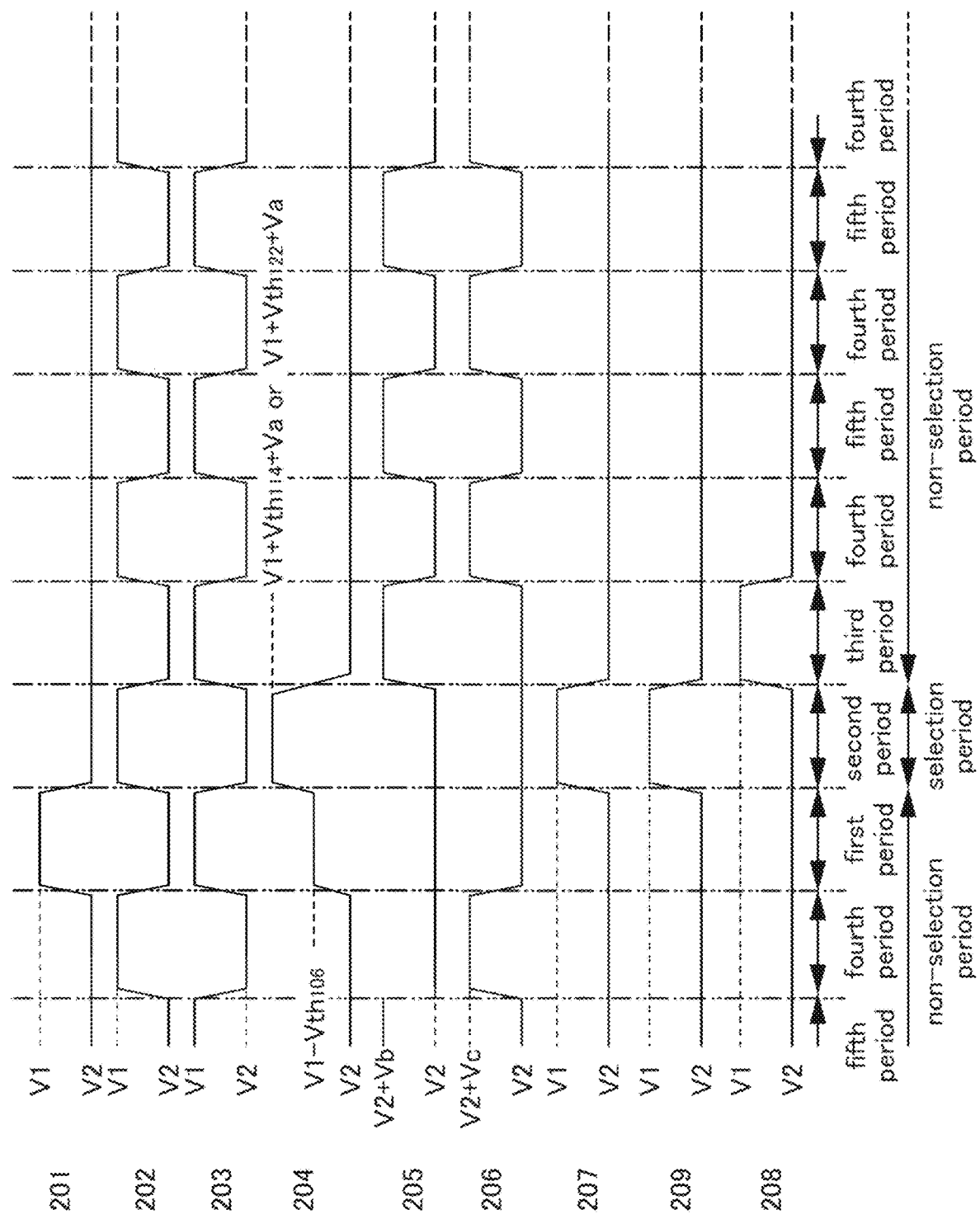
FIG. 5 is a timing chart illustrating the operation of the driver circuit illustrated in FIG. 4.

Next, the operation of the driver circuit illustrated in FIG. 4 is described with reference to FIG. 5. FIG. 5 is a timing chart illustrating an example of the operation of the driver circuit of this embodiment. Note that only the operation of the transistor 122, the operation of the transistor 123, and the operation of the transistor 124 are described as the operation of the driver circuit in FIG. 4, and the description of the driver circuit in FIG. 1 is incorporated in description of operation which is the same as the operation of the elements in the driver circuit illustrated in FIG. 1, as appropriate. Note that the case where the first clock signal is input to the terminal 103C in FIG. 5 is described. In addition, here, as an example of the operation of the driver circuit illustrated in FIG. 4, the case where all the transistors in the flip-flop circuit are n-channel transistors is described.

In a first period, in addition to the operation of the circuit illustrated in FIG. 1, the first clock signal 202 which is in the low state is input through the terminal 103C. In this case, the transistor 124 is turned on.

In this case, the potential 204 of the node 117 is at V1-Vth$_{106}$, so that the transistor 113 is turned on. When the transistor 113 is turned on, the transistor 123 is turned off.

When the potential 204 of the node 117 is at V1-Vth$_{106}$, the transistor 122 is turned on.

In this case, the level of a potential of an output signal 209 which is output through the terminal 121 becomes equivalent to the level of the potential V2 of the first clock signal which is input through the terminal 103C or the level of the potential V2 which is applied through the terminal 104J. The above is the operation in the first period.

Next, in a second period, in addition to the operation of the circuit illustrated in FIG. 1, the first clock signal 202 which is in the high state is input through the terminal 103C. In this case, the transistor 124 is turned off.

In this case, the potential 204 of the node 117 is kept at V1-Vth$_{106}$ and the transistor 113 is kept on. When the transistor 113 is in an on state, the transistor 123 is kept off.

In addition, in this case, the node 117 is kept in a floating state and the potential 204 of the node 117 is kept at V1-Vth$_{106}$.

When the potential 204 of the node 117 is kept at V1-Vth$_{106}$ and a potential of the one of the source terminal and the drain terminal of the transistor 122 becomes the potential V1 of the first clock signal 202, the potential 204 of the node 117 rises by capacitive coupling of parasitic capacitance between the gate terminal of the transistor 122 and the other of the source terminal and the drain terminal of the transistor 122 in accordance with the potential of the output signal 209 by bootstrap. In this case, the potential 204 of the node 117 rises to a value which is larger than the sum of the potential V1 of the first clock signal 202 and the threshold voltage of the transistor 114 or the sum of the potential V1 of the first clock signal 202 and the threshold voltage of the transistor 122 (also referred to as Vth$_{122}$), i.e., to V1+Vth$_{114}$+Vα or V1+Vth$_{122}$+Vα (Vα is a given positive number).

When the potential 204 of the node 117 is V1+Vth$_{114}$+Vα or V1+Vth$_{122}$+Vα, the transistor 122 is kept on.

In this case, the level of the potential of the output signal 209 which is output through the terminal 121 becomes equivalent to the level of the potential V1 of the first clock signal 202 which is input through the terminal 103C. The above is the operation in the second period.

Next, in a third period, in addition to the operation of the circuit illustrated in FIG. 1, the first clock signal 202 which is in the low state is input through the terminal 103C. In this case, the transistor 124 is turned on.

In this case, the potential 205 of the node 118 is at V2+Vb, the transistor 110 is turned on, and the level of the potential 204 of the node 117 becomes equivalent to the level of the potential V2. When the potential 204 of the node 117 is at V2, the transistor 122 is turned off.

The potential 206 of the node 119 is kept at the level which is equivalent to the potential V2. When the potential 206 of the node 119 is V2, the node 119 enters into a floating state. When the node 119 is in the floating state, the transistor 123 is kept off.

In this case, the level of the potential of the output signal 209 which is output through the terminal 121 becomes equivalent to the level of the potential V2 which is applied through the terminal 104J. The above is the operation in the third period.

Next, in a fourth period, in addition to the operation of the circuit illustrated in FIG. 1, the first clock signal 202 which is in the high state is input through the terminal 103C. In this case, the transistor 116 is turned off.

In this case, the potential 206 of the node 119 is at V2+Vc. When the potential 206 of the node 119 is at V2+Vc, the transistor 123 is turned on.

The potential 204 of the node 117 is at the potential V2 which is applied through the terminal 104D. When the potential of the node 117 is at V2, the transistor 122 is turned off.

In this case, the level of the potential of the output signal 209 which is output through the terminal 121 becomes equivalent to the level of the potential V2 which is applied through the terminal 104I. The above is the operation in the fourth period.

Next, in a fifth period, in addition to the operation of the circuit illustrated in FIG. 1, the first clock signal 202 which is in the low state is input through the terminal 103C. In this case, the transistor 124 is turned on.

In this case, the potential 205 of the node 118 is at V2+Vb and the transistor 110 is turned on. When the transistor 110 is turned on, the level of the potential 204 of the node 117 becomes equivalent to the level of the potential V2 which is applied through the terminal 104C.

When the potential 204 of the node 117 is at V2, the transistor 122 is turned off.

In addition, the potential 206 of the node 119 is at V2 and the transistor 123 is turned off.

In this case, the level of the potential of the output signal 209 which is output through the terminal 121 becomes equivalent to the level of the potential V2 which is applied through the terminal 104J. The above is the operation in the fifth period.

As described above, in the driver circuit illustrated in FIG. 4, in addition to the advantageous effects of the circuit structure in FIG. 1, by using a plurality of output signals, one of the output signals is output to a flip-flop circuit in the next stage, and the other of the output signals is output to a gate terminal of a transistor in a pixel. Thus, an output signal with slight deviation can be output to the flip-flop circuit, so that malfunctions can be suppressed.

Figure 6:
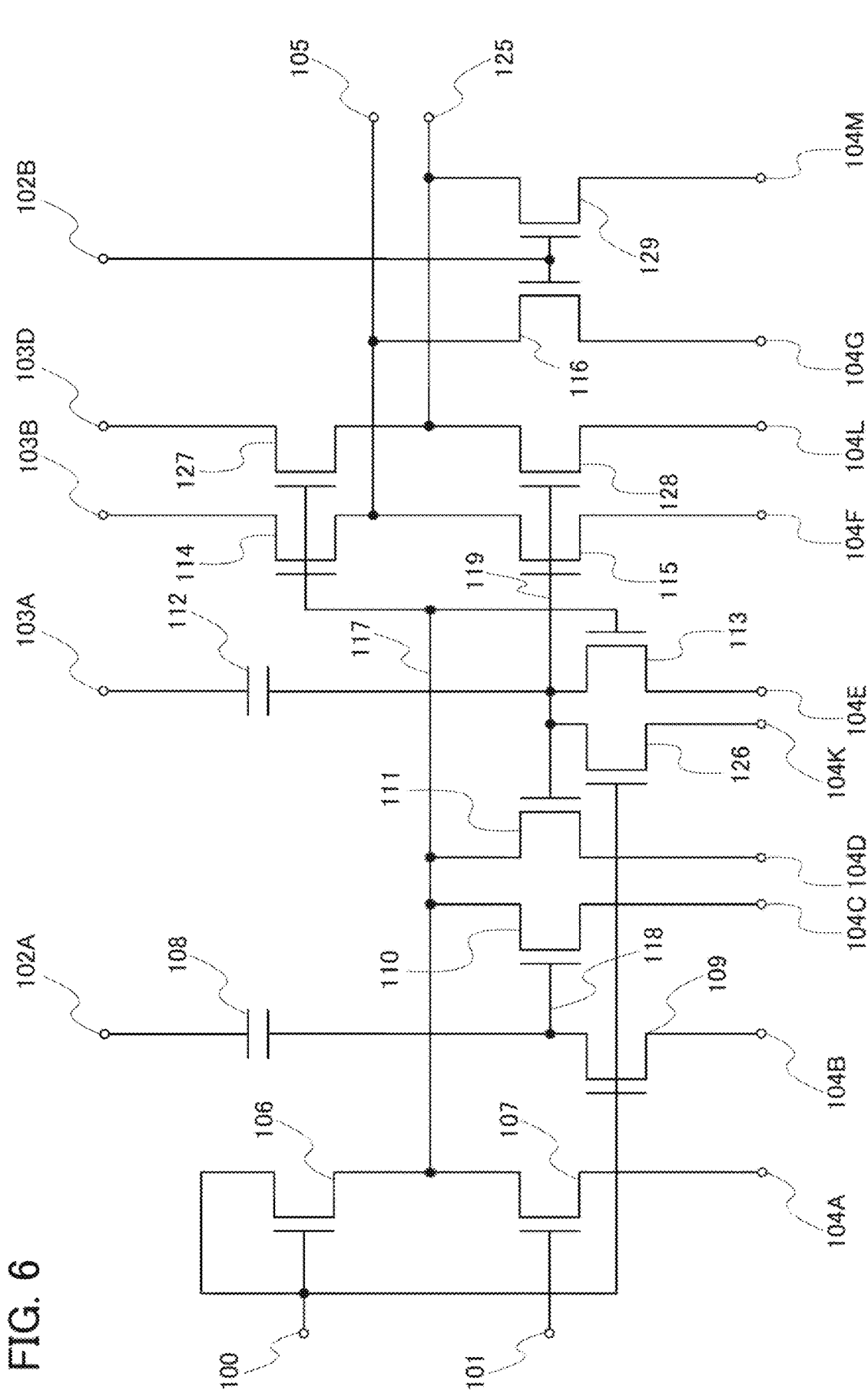
FIG. 6 is a circuit diagram illustrating an example of the structure of the driver circuit in Embodiment 1.

Further, in this embodiment, the structure in FIG. 3 and the structure in FIG. 4 can be combined with each other. A different structure of the driver circuit of this embodiment is described with reference to FIG. 6. FIG. 6 is a circuit diagram illustrating the different structure of the driver circuit of this embodiment.

In the different structure of the driver circuit of this embodiment, which is illustrated in FIG. 6, in addition to the circuit structure illustrated in FIG. 1, a terminal 103D, a terminal 104K, a terminal 104L, a terminal 104M, a terminal 125, a transistor 126, a transistor 127, a transistor 128, and a transistor 129 are provided.

In FIG. 6, elements denoted by the same reference numerals as in FIG. 1 are the same elements as in the driver circuit in FIG. 1, so that the description of each element in FIG. 1 is incorporated.

In FIG. 6, the terminal 103D corresponds to the terminal 103C in FIG. 4; the terminal 104K corresponds to the terminal 104H in FIG. 3; the terminal 104L corresponds to the terminal 104I in FIG. 4; the terminal 104M corresponds to the terminal 104J in FIG. 4; the terminal 125 correspond to the terminal 121 in FIG. 4; the transistor 126 corresponds to the transistor 120 in FIG. 3; the transistor 127 corresponds to the transistor 122 in FIG. 4; the transistor 128 corresponds to the transistor 123 in FIG. 4; the transistor 129 corresponds to the transistor 124 in FIG. 4. The description of each element in FIG. 3 and FIG. 4 is incorporated in description of each element.

Since the operation of the driver circuit in FIG. 6 is combination of the operation of the driver circuit in FIG. 3 and the operation of the driver circuit in FIG. 4, the description of the operation of the driver circuit in FIG. 3 and the operation of the driver circuit in FIG. 4 is incorporated.

By using the structure illustrated in FIG. 6, advantageous effects which are the same as the advantageous effects of the driver circuit having the structure illustrated in FIG. 3 and the driver circuit having the structure illustrated in FIG. 4 can be obtained.

Embodiment 2

In this embodiment, a driver circuit having a structure which is different from the structure in Embodiment 1 is described.

A driver circuit in this embodiment includes a shift register including a plurality of flip-flop circuits.

Figure 7:
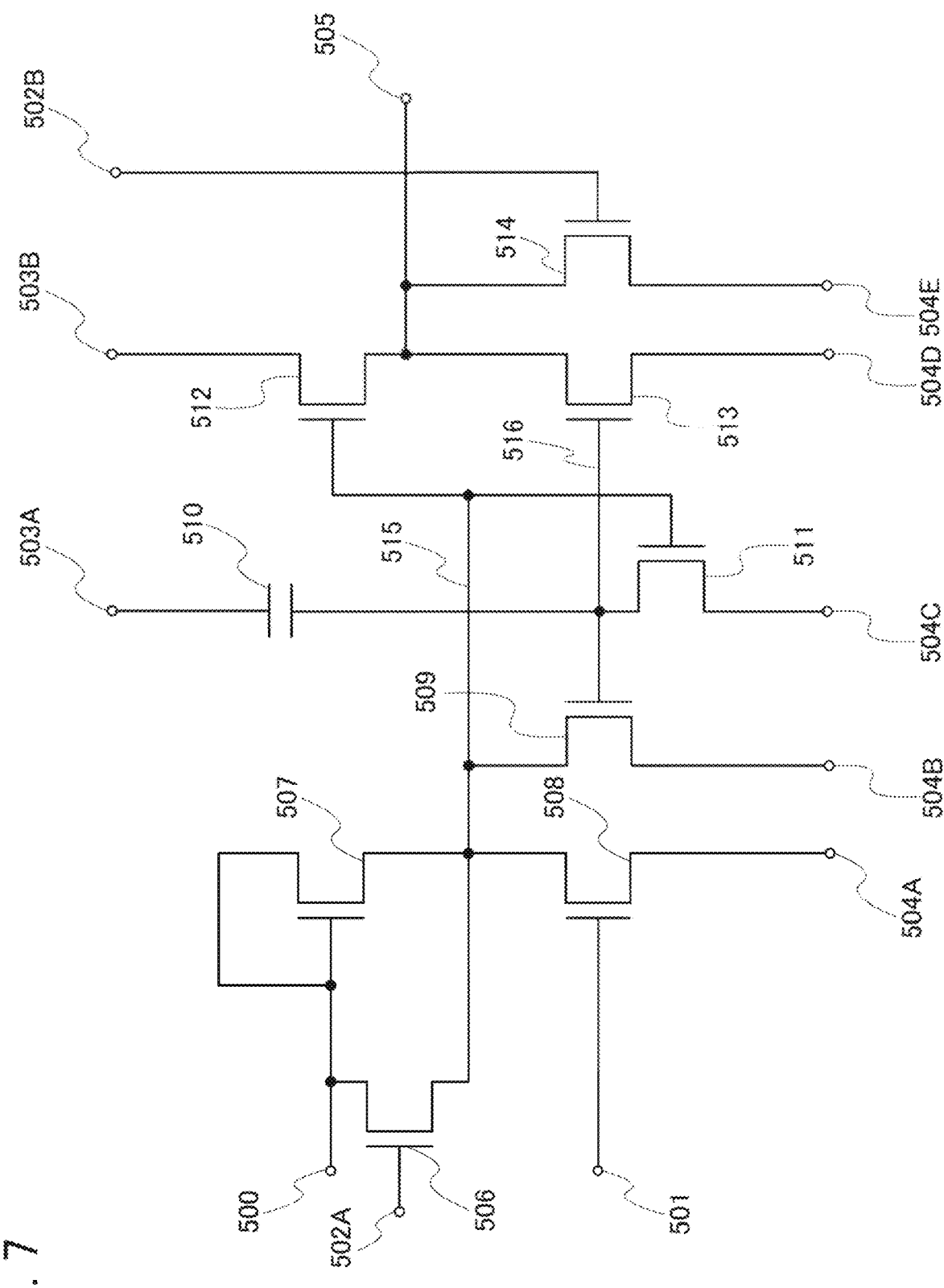
FIG. 7 is a circuit diagram illustrating an example of the structure of a driver circuit in Embodiment 2.

In addition, an example of the circuit structure of the flip-flop circuit is described with reference to FIG. 7. FIG. 7 is a circuit diagram illustrating an example of the circuit structure of the flip-flop circuit in the driver circuit of this embodiment.

The flip-flop circuit illustrated in FIG. 7 includes a terminal 500, a terminal 501, a terminal 502, a terminal 503, a terminal 504, a terminal 505, a transistor 506, a transistor 507, a transistor 508, a transistor 509, a capacitor 510, a transistor 511, a transistor 512, a transistor 513, and a transistor 514.

Note that although a terminal 502A and a terminal 502B are illustrated as the terminal 502 in this embodiment, the structure of the terminal 502 is not limited to this. The terminal 502A and the terminal 502B can be electrically connected to each other so as to be one terminal 502. In addition, although a terminal 503A and a terminal 503B are illustrated as the terminal 503 in this embodiment, the structure of the terminal 503 is not limited to this. The terminal 503A and the terminal 503B can be electrically connected to each other so as to be one terminal 503.

Further, although terminals 504A to 504E are illustrated as the terminal 504 in this embodiment, the structure of the terminal 504 is not limited to this. The terminals 504A to 504E can be electrically connected to each other so as to be one terminal 504.

A gate terminal of the transistor 506 is electrically connected to the terminal 502A. One of a source terminal and a drain terminal of the transistor 506 is electrically connected to the terminal 500.

A gate terminal of the transistor 507 is electrically connected to the terminal 500. One of a source terminal and a drain terminal of the transistor 507 is electrically connected to the gate terminal of the transistor 507. The other of the source terminal and the drain terminal of the transistor 507 is electrically connected to the other of the source terminal and the drain terminal of the transistor 506. Note that although not illustrated for convenience, by using a structure where the transistor 507 is not provided in this embodiment, the circuit area can be made smaller.

A gate terminal of the transistor 508 is electrically connected to the terminal 501. One of a source terminal and a drain terminal of the transistor 508 is electrically connected to the other of the source terminal and the drain terminal of the transistor 507. The other of the source terminal and the drain terminal of the transistor 508 is electrically connected to the terminal 504A. Note that although not illustrated for convenience, by using a structure where the transistor 508 is not provided in the flip-flop circuit in the driver circuit of this embodiment, the circuit area can be made smaller.

The capacitor 510 includes at least two terminals. One of the terminals of the capacitor 510 is electrically connected to the terminal 503A.

A gate terminal of the transistor 509 is electrically connected to the other of the terminals of the capacitor 510. One of a source terminal and a drain terminal of the transistor 509 is electrically connected to the other of the source terminal and the drain terminal of the transistor 506. The other of the source terminal and the drain terminal of the transistor 509 is electrically connected to the terminal 504B.

A gate terminal of the transistor 511 is electrically connected to the other of the source terminal and the drain terminal of the transistor 506. One of a source terminal and a drain terminal of the transistor 511 is electrically connected to the gate terminal of the transistor 509. The other of the source terminal and the drain terminal of the transistor 511 is electrically connected to the terminal 504C.

A gate terminal of the transistor 512 is electrically connected to the other of the source terminal and the drain terminal of the transistor 506. One of a source terminal and a drain terminal of the transistor 512 is electrically connected to the terminal 503B. The other of the source terminal and the drain terminal of the transistor 512 is electrically connected to the terminal 505. The potential of the other of the source terminal and the drain terminal of the transistor 114 is an output signal and is output through the terminal 105. Note that although not illustrated for convenience, in the flip-flop circuit in the driver circuit of this embodiment, a capacitor can be additionally provided between the gate terminal of the transistor 512 and the other of the source terminal and the drain terminal of the transistor 512.

A gate terminal of the transistor 513 is electrically connected to the gate terminal of the transistor 509. One of a source terminal and a drain terminal of the transistor 513 is electrically connected to the other of the source terminal and the drain terminal of the transistor 512. The other of the source terminal and the drain terminal of the transistor 513 is electrically connected to the terminal 504D.

A gate terminal of the transistor 514 is electrically connected to the terminal 502B. One of a source terminal and a drain terminal of the transistor 514 is electrically connected to the other of the source terminal and the drain terminal of the transistor 512. The other of the source terminal and the drain terminal of the transistor 514 is electrically connected to the terminal 504E.

Note that a portion where the other of the source terminal and the drain terminal of the transistor 506, the transistor 507, the transistor 508, the transistor 509, the transistor 511, and the transistor 512 are connected to each other is referred to as a node 515. Further, a portion where the one of the terminals of the capacitor 510 is connected to the transistor 509, the transistor 511, and the transistor 513 is referred to as a node 516.

In the flip-flop circuit, a first control signal is input through the terminal 500, and a second control signal is input through the terminal 501. As each of the first control signal and the second control signal, a digital signal having two states of a high state and a low state can be used. In the case of using the digital signal, the first control signal or the second control signal having a predetermined potential is input as a first potential (also referred to as V1) through the terminal 500 or the terminal 501 when the first control signal or the second control signal, which is input, is in a high state (also referred to as a high level); the first control signal or the second control signal having a potential which is lower than the predetermined potential in the high state is input as a second potential (also referred to as V2) through the terminal 500 or the terminal 501 when the first control signal or the second control signal, which is input, is in a low state (also referred to as a low level). The levels of the potentials in the high state and the low state can be set as appropriate considering the level of the threshold voltage of each transistor, or the like, for example. For example, the levels of the potentials in the high state and the low state are preferably set so that a potential difference between the high state and the low state is larger than the absolute value of the threshold voltage of each transistor in the flip-flop circuit.

In the flip-flop circuit illustrated in FIG. 7, a clock signal which is in a first phase (also referred to as a first clock signal or a CK signal) or a clock signal which is in a second phase (also referred to as a second clock signal or a CKB signal) is input through the terminal 502 (also referred to as the terminal 502A and the terminal 502B). Each of the first clock signal and the second clock signal has two potential levels of a high state and a low state. A clock signal having the first potential (also referred to as V1) is input when each clock signal is in a high state (also referred to as a high level), and a clock signal having the second potential (also referred to as V2) is input when each clock signal is in a low state (also referred to as a low level). Note that the levels of the potentials of the first clock signal and the second clock signal in a high state are preferably equivalent to the levels of the potentials of the first control signal and the second control signal in the high state. The levels of the potentials of the first clock signal and the second clock signal in a low state are preferably equivalent to the levels of the potentials of the first control signal and the second control signal in the low state. Further, the levels of the potentials in the high state and the low state can be set as appropriate considering the level of the threshold voltage of each transistor, or the like, for example. For example, the levels of the potentials in the high state and the low state are preferably set so that a potential difference between the high state and the low state is larger than the absolute value of the threshold voltage of each transistor in the flip-flop circuit.

The phase of the first clock signal and the phase of the second clock signal are different from each other. Specifically, the phase of the first clock signal and the phase of the second clock signal are opposite to each other. For example, in a predetermined period, the second clock signal is in the low state when the first clock signal is in the high state, and the second clock signal is in the high state when the first clock signal is in the low state.

In the flip-flop circuit, the first clock signal or the second clock signal is input through the terminal 503 (also referred to as the terminal 503A and the terminal 503B). Note that the phase of the clock signal which is input through the terminal 502 and the phase of the second clock signal which is input through the terminal 503 are opposite to each other. For example, the second clock signal is input through the terminal 503 in the case where the first clock signal is input through the terminal 502, and the first clock signal is input through the terminal 503 in the case where the second clock signal is input through the terminal 502.

A potential having a predetermined level is applied to the flip-flop circuit through the terminal 504 (also referred to as the terminals 504A to 504E). In this case, the level of the potential having the predetermined level can be set to V1 or V2, for example. That is, the level of the potential having the predetermined level can be made equivalent to the level of a potential of a digital signal such as a clock signal or a control signal in a high state or a low state.

The transistor 506 has a function of controlling conduction between the terminal 500 and the node 515 in accordance with a signal which is input through the terminal 502A. By bringing the terminal 500 and the node 515 into conduction, the level of a potential of a signal which is input through the terminal 500 is made equivalent to the level of a potential of the node 515. In addition, the transistor 506 is turned off when the transistor 509 is in an on state.

The transistor 507 has a function of controlling conduction between the terminal 500 and the node 515 in accordance with the signal which is input through the terminal 500. By bringing the terminal 500 and the node 515 into conduction, the potential of the node 515 is set to V1 or V2. After that, the terminal 500 and the node 515 are brought out of conduction, so that the node 515 enters into a floating state.

The transistor 508 has a function of controlling conduction between the terminal 504A and the node 515 in accordance with a signal which is input through the terminal 501. By bringing the terminal 504A and the node 515 into conduction, the potential of the node 515 is set to V1 or V2.

The transistor 509 has a function of controlling conduction between the terminal 504B and the node 515 in accordance with a potential of the node 516. By bringing the terminal 504B and the node 515 into conduction, the potential of the node 515 is set to V1 or V2. In addition, the transistor 509 has a function of entering into an off state when the transistor 506 is on.

The capacitor 510 has a function of changing the potential of the node 516 by capacitive coupling in accordance with a signal which is input through the terminal 503A. For example, the capacitor 510 sets the potential of the node 516 to V1 by capacitive coupling in the case where the signal which is input through the terminal 503A is changed from a low state to a high state. On the other hand, the capacitor 510 sets the potential of the node 516 to V1 or V2 by capacitive coupling in the case where the signal which is input through the terminal 503A is changed from the high state to the low state.

The transistor 511 has a function of controlling conduction between the terminal 504C and the node 516 in accordance with the potential of the node 515. By bringing the terminal 504C and the node 516 into conduction, the potential of the node 516 is set to V1 or V2.

The transistor 512 has a function of controlling conduction between the terminal 503B and the terminal 505 in accordance with the potential of the node 515. By bringing the terminal 503B and the terminal 505 into conduction, a potential of a signal which is input through the terminal 503B is made equivalent to a potential of a signal which is output through the terminal 505. Further, the transistor 512, for example, is an n-channel transistor and has a function of raising the potential of the node 515 in accordance with rise in the potential of the signal which is output through the terminal 505 when the signal which is input through the terminal 503B is changed from the low state to the high state in the case where the potential of the node 515 is V1. That is, the transistor 512 performs so-called bootstrap operation. Note that the bootstrap operation is often performed using parasitic capacitance between the gate terminal of the transistor 512 and the other of the source terminal and the drain terminal of the transistor 512.

The transistor 513 has a function of controlling conduction between the terminal 504D and the terminal 505 in accordance with the potential of the node 516. By bringing the terminal 504D and the terminal 505 into conduction, the potential of the signal which is output through the terminal 505 is set to V1 or V2.

The transistor 514 has a function of controlling conduction between the terminal 504E and the terminal 505 in accordance with a signal which is input through the terminal 502B. By bringing the terminal 504E and the terminal 505 into conduction, the potential of the signal which is output through the terminal 505 is set to V1 or V2.

Note that since all the transistors can have the same conductivity type in the driver circuit of this embodiment, manufacturing steps can be simplified. Therefore, manufacturing cost can be reduced and yield can be improved. Further, a semiconductor device such as a large display panel can be easily manufactured. In the driver circuit of this embodiment in FIG. 7, all the transistors can be n-channel transistors or p-channel transistors.

Figure 8:
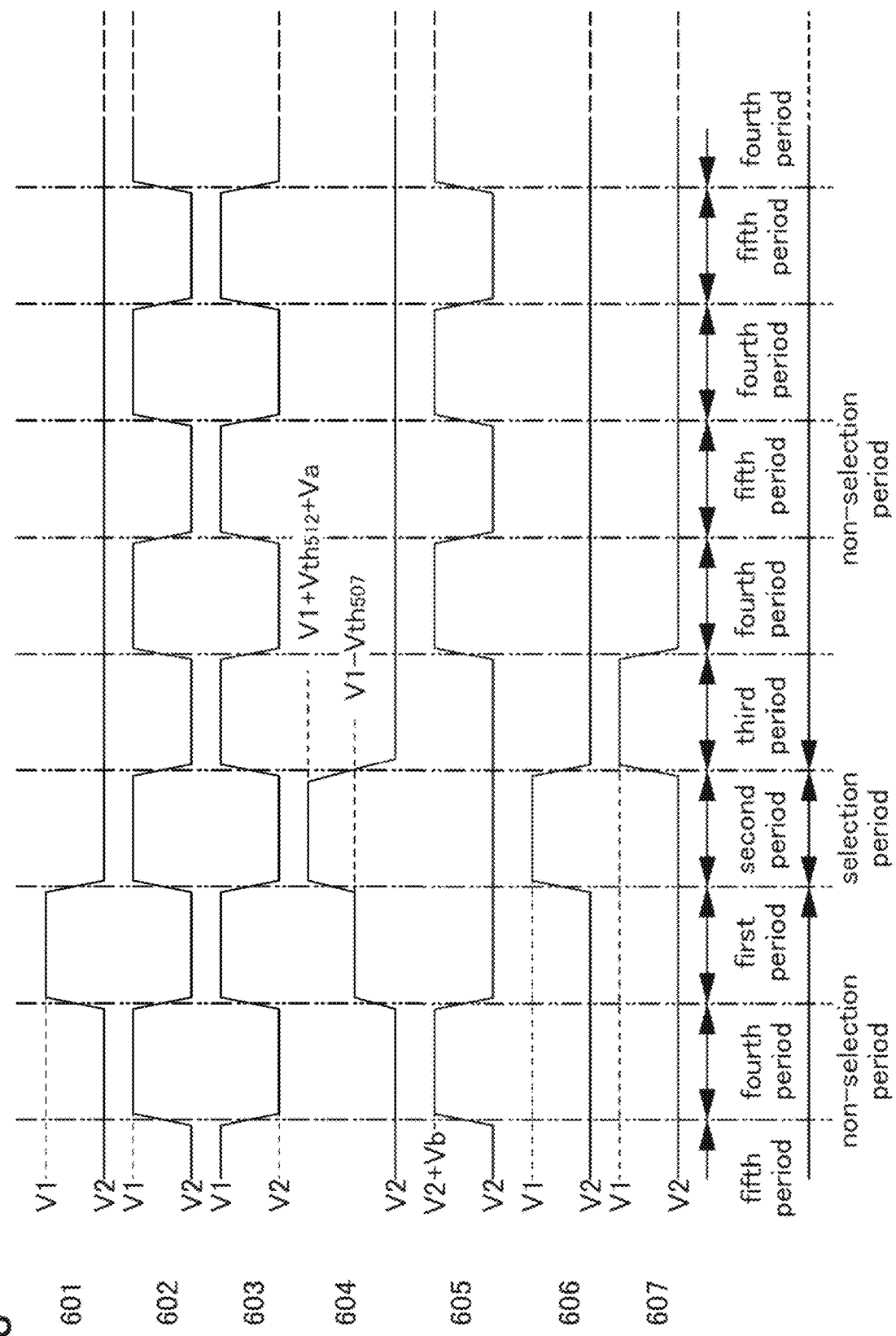
FIG. 8 is a timing chart illustrating the operation of the driver circuit illustrated in FIG. 7.

Next, the operation of the driver circuit illustrated in FIG. 7 is described with reference to FIG. 8. FIG. 8 is a timing chart illustrating an example of the operation of the driver circuit illustrated in FIG. 7. Note that here, as an example, the first clock signal is input through the terminal 503 and the second clock signal is input through the terminal 502. In addition, here, as an example of the operation of the driver circuit illustrated in FIG. 7, the case where all the transistors in the flip-flop circuit are n-channel transistors is described.

As for the operation of the driver circuit illustrated in FIG. 7, predetermined operation in a certain period is repeated, as illustrated in FIG. 8. The certain period is divided into a selection period and a non-selection period. Further, the selection period and the non-selection period are divided into a first period, a second period, a third period, a fourth period, and a fifth period. In FIG. 8, the first period, the third period, the fourth period, and the fifth period are the non-selection period, and the second period is the selection period.

First, in the first period, a first control signal 601 which is in a high state is input through the terminal 500; a second control signal 607 which is in a low state is input through the terminal 501; a second clock signal 603 which is in a high state is input through the terminal 502; a first clock signal 602 which is in a low state is input through the terminal 503. Accordingly, the transistor 506, the transistor 507, and the transistor 514 are turned on, and the transistor 508 is turned off.

When the transistor 506 and the transistor 507 are turned on, a potential 604 of the node 515 rises to a value obtained by subtracting the threshold voltage of the transistor 506 (also referred to as $Vth_{506}$) from the potential V1 of the second clock signal 603 which is input through the terminal 502A, i.e., to V1-$Vth_{506}$, or a value obtained by subtracting the threshold voltage of the transistor 507 (also referred to as $Vth_{507}$) from the potential V1 of the first control signal 601 which is input through the terminal 500, i.e., to V1-$Vth_{507}$. When the potential of the node 515 rises to V1-$Vth_{506}$ or V1-$Vth_{507}$, the transistor 507 is turned off. In this case, the level of the threshold voltage of the transistor 506 and the level of the threshold voltage of the transistor 507 are preferably equivalent to each other. In FIG. 8, as an example, the potential of the node 515 in the second period is at V1-$Vth_{507}$.

When the potential 604 of the node 515 is at V1-$Vth_{507}$, the transistor 511 and the transistor 512 are turned on.

When the transistor 511 is turned on, the level of a potential 605 of the node 516 becomes equivalent to the level of the potential V2 which is applied through the terminal 504C. When the potential of the node 516 is at V2, the transistor 509 and the transistor 513 are turned off.

In this case, the level of a potential of an output signal 606 which is output through the terminal 505 becomes equivalent to the level of the potential V2 of the first clock signal 602 which is input through the terminal 503B or the level of the potential V2 which is applied through the terminal 504E. The above is the operation in the first period.

Next, in the second period, the first control signal 601 which is in a low state is input through the terminal 500; the second control signal 607 which is in the low state is input through the terminal 501; the second clock signal 603 which is in a low state is input through the terminal 502; the first clock signal 602 which is in a high state is input through the terminal 503A and the terminal 503B. In this case, the transistor 506, the transistor 507, and the transistor 514 are turned off, and the transistor 508 is kept off.

In this case, the potential 604 of the node 515 is kept at V1-$Vth_{507}$, and the transistor 511 is kept on. In addition, when the potential 604 of the node 515 is kept at V1-$Vth_{507}$, the potential 605 of the node 516 is kept at the potential V2 which is applied through the terminal 504C, and the transistor 509 and the transistor 513 are kept off.

When the transistor 506, the transistor 507, the transistor 508, the transistor 509, and the transistor 513 are in an off state as described above, the node 515 is kept in the floating state, and the potential 604 of the node 515 is kept at V1-$Vth_{507}$.

When the potential 604 of the node 515 is kept at V1-$Vth_{507}$ and a potential of the one of the source terminal and the drain terminal of the transistor 512 becomes the potential V1 of the first clock signal 602, a potential of the output signal 606 which is output through the terminal 505 rises. Then, since the node 515 is in the floating state, the potential 604 of the node 515 rises by capacitive coupling of parasitic capacitance between the gate terminal of the transistor 512 and the other of the source terminal and the drain terminal of the transistor 512 in accordance with the potential of the output signal 606 by bootstrap.

The potential 604 of the node 515 rises to a value which is larger than the sum of the potential V1 of the first clock signal 602 and the threshold voltage of the transistor 512 (also referred to as $Vth_{512}$), i.e., V1+$Vth_{512}$+Vα (Vα is a given positive number). In this case, the transistor 512 is kept on.

In this case, the level of the potential of the output signal 606 which is output through the terminal 505 becomes equivalent to the level of the potential V1 which is applied through the terminal 503B. The above is the operation in the second period.

Next, in the third period, the first control signal 601 which is in the low state is input through the terminal 500; the second control signal 607 which is in a high state is input through the terminal 501; the second clock signal 603 which is in the high state is input through the terminal 502A and the terminal 502B; the first clock signal 602 which is in the low state is input through the terminal 503A and the terminal 503B. In this case, the transistor 506, the transistor 508, and the transistor 514 are turned on, and the transistor 507 is kept off.

When the transistor 506 and the transistor 508 are turned on, the level of the potential of the node 515 becomes equivalent to the level of the potential V2 of the first control signal which is input through the terminal 500 or the level of the potential V2 which is applied through the terminal 504A.

When the potential 604 of the node 515 is at V2, the transistor 511 and the transistor 512 are turned off. Note that the transistor 511 is often turned off after the first clock signal 602 which is input through the terminal 502B enters into a low state. This is because the potential 604 of the node 515 is often delayed or dulled as compared to the first clock signal 602. When the transistor 511 is turned off after the first clock signal 602 enters into the low state, the node 516 enters into a floating state with the potential thereof kept at the potential V2 which is applied through the terminal 504C.

When the node 516 is in the floating state, the transistor 509 and the transistor 513 are kept off.

The capacitor 510 holds a potential difference between a potential of the first clock signal 602 which is input through the terminal 503A and the potential of the node 516, i.e., a potential difference between the potential of the first clock signal 602 which is in the low state and the potential V2 which is applied through the terminal 504C.

In this case, the level of the potential of the output signal 606 which is output through the terminal 505 becomes equivalent to the level of the potential V2 which is applied through the terminal 504E. The above is the operation in the third period.

Next, in the fourth period, the first control signal 601 which is in the low state is input through the terminal 500; the second control signal 607 which is in the low state is input through the terminal 501; the second clock signal 603 which is in the low state is input through the terminal 502A and the terminal 502B; the first clock signal 602 which is in the high state is input through the terminal 503A and the terminal 503B. In this case, the transistor 506, the transistor 508, and the transistor 514 are turned off, and the transistor 507 is kept off.

The potential 605 of the node 516 is at V2+Vb by capacitive coupling of the capacitor 510. The potential Vb is preferably higher than the threshold voltage of the transistor 509 or the threshold voltage of the transistor 513, and lower than V1−V2.

When the potential 605 of the node 516 is at V2+Vc, the transistor 509 and the transistor 513 are turned on. When the transistor 509 and the transistor 513 are turned on, the level of the potential 604 of the node 515 becomes equivalent to the level of the potential V2 which is applied through the terminal 504B or the level of the potential V2 which is applied through the terminal 504D.

When the potential 604 of the node 515 is at V2, the transistor 511 and the transistor 512 are turned off.

In this case, the level of the potential of the output signal 606 which is output through the terminal 505 becomes equivalent to the level of the potential V2 which is applied through the terminal 504D. The above is the operation in the fourth period.

Next, in the fifth period, the first control signal 601 which is in the low state is input through the terminal 500; the second control signal 607 which is in the low state is input through the terminal 501; the second clock signal 603 which is in the high state is input through the terminal 502A and the terminal 502B; the first clock signal 602 which is in the high state is input through the terminal 503A and the terminal 503B. In this case, the transistor 506 and the transistor 514 are turned on, and the transistor 507 and the transistor 508 are kept off.

In this case, the potential 605 of the node 516 is at V2 by the capacitive coupling of the capacitor 510. When the potential 605 of the node 516 is at V2, the transistor 509 and the transistor 513 are turned off.

When the potential 604 of the node 515 is at V2, the transistor 511 and the transistor 512 are turned off.

In this case, the level of the potential of the output signal 606 which is output through the terminal 505 becomes equivalent to the level of the potential V2 which is applied through the terminal 504D. The above is the operation in the fifth period.

Note that in the operation of the driver circuit of this embodiment, during the non-selection period after the third period, the operation in the fourth period and the operation in the fifth period are repeated plural times. Thus, a potential having a certain level is applied to the node 515 in any period of the non-selection period, so that the node 515 can be prevented from entering into a floating state. Therefore, since the adverse effect of noise can be reduced, malfunctions can be suppressed.

In addition, in the operation of the driver circuit of this embodiment, a potential having a certain level can be applied to the node 515 by turning on different transistors (in this embodiment, the transistor 506 and the transistor 509) in the fourth period and the fifth period. Thus, for example, even in the case of using a transistor which has a semiconductor layer formed using an amorphous semiconductor, deterioration of each transistor can be suppressed. Therefore, deviation in timing of switching operation of a transistor due to deterioration can be reduced, so that malfunctions can be suppressed.

Since the number of elements included in the diver circuit in this embodiment can be made smaller than the number of elements included in the driver circuit of the above embodiment, the circuit area can be made smaller.

Figure 9:
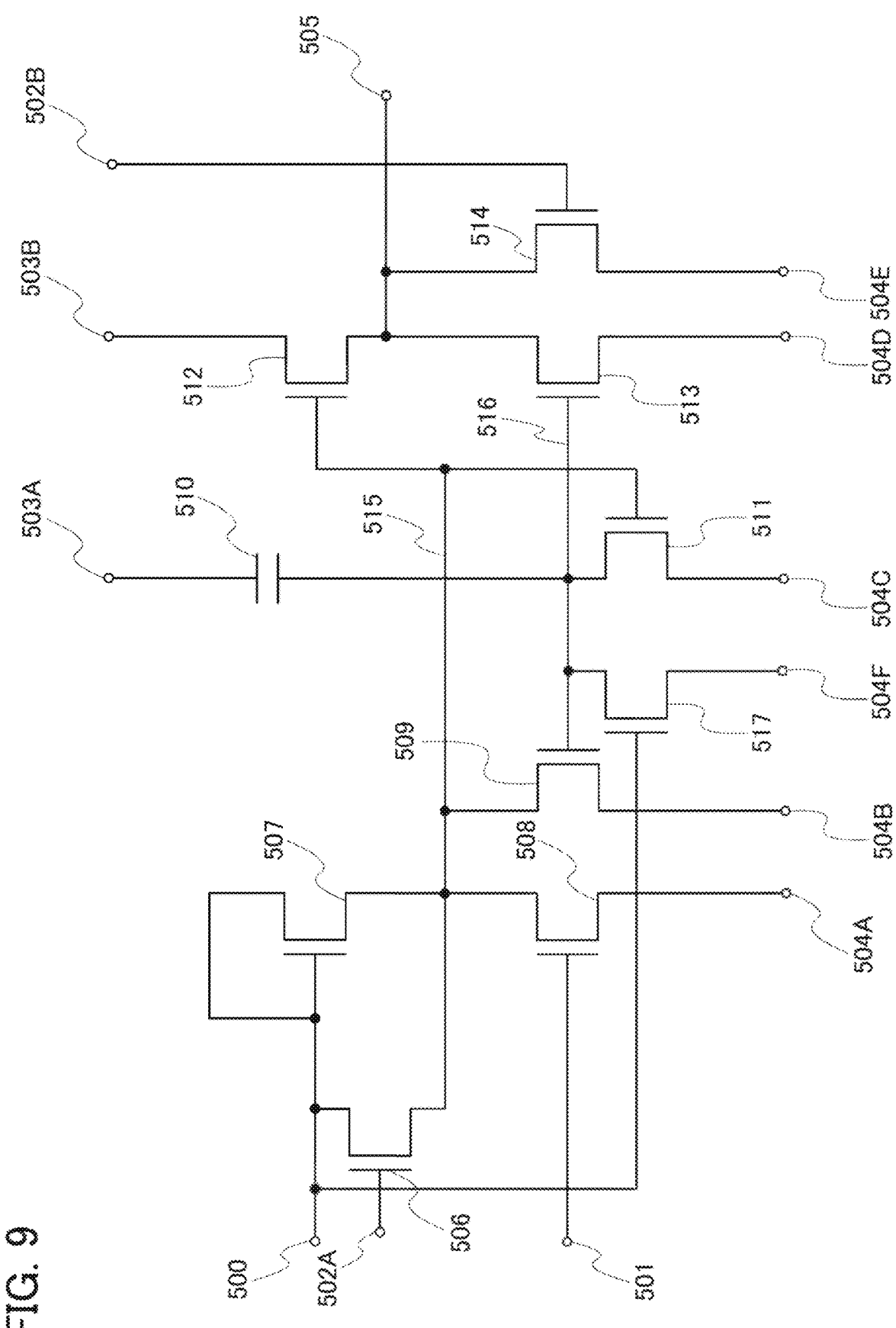
FIG. 9 is a circuit diagram illustrating an example of the structure of the driver circuit in Embodiment 2.

Further, in this embodiment, a driver circuit which is an embodiment of the present invention can be formed using a structure which is different from the structure in FIG. 7. A different structure of the driver circuit of this embodiment is described with reference to FIG. 9. FIG. 9 is a circuit diagram illustrating an example of the structure of the driver circuit of this embodiment.

In the driver circuit illustrated in FIG. 9, in addition to the circuit structure illustrated in FIG. 7, a terminal 504F and a transistor 517 are provided.

Note that in the driver circuit illustrated in FIG. 9, portions denoted by the same reference numerals as in FIG. 7 are the same portions as in the driver circuit in FIG. 7, so that description thereof is omitted.

A gate terminal of the transistor 517 is electrically connected to the terminal 500. One of a source terminal and a drain terminal of the transistor 517 is electrically connected to the gate terminal of the transistor 509. The other of the source terminal and the drain terminal of the transistor 517 is electrically connected to the terminal 504F.

In the driver circuit illustrated in FIG. 9, a potential which is equivalent to the potential applied through the terminals 504A to 504E in FIG. 7 is applied through the terminal 504F. In addition, the terminals 504A to 504F can be electrically connected to each other so as to be one terminal 504.

The transistor 517 has a function of controlling conduction between the terminal 504F and the node 516 in accordance with the signal which is input through the terminal 500. By bringing the terminal 504F and the node 516 into conduction, the potential of the node 516 is set to V1 or V2.

Next, the operation of the driver circuit illustrated in FIG. 9 is described. Note that only the operation of the transistor 517 is described as the operation of the driver circuit in FIG. 9, and the operation of elements except for the transistor 517 is the same as the operation of the driver circuit illustrated in FIG. 7; therefore, description thereof is omitted. In addition, here, as an example of the operation of the driver circuit illustrated in FIG. 9, the case where all the transistors in the flip-flop circuit are n-channel transistors is described.

In a first period, the first control signal 601 which is in the high state is input through the terminal 500. In this case, the transistor 517 is turned on.

When the transistor 517 is turned on, the level of the potential of the node 516 becomes equivalent to the level of the potential V2 which is applied through the terminal 504F.

After that, in second to fifth periods, the first control signal 601 which is in the low state is input through the terminal 500, so that the transistor 517 is turned off.

As described above, in the driver circuit illustrated in FIG. 9, in addition to the advantageous effects of the circuit structure in FIG. 7, the potential of the node 516 can be more surely set to the potential V2 in the first period by directly inputting the first control signal 601 to the transistor 517 in the first period so that the transistor 517 is turned on.

Figure 10:
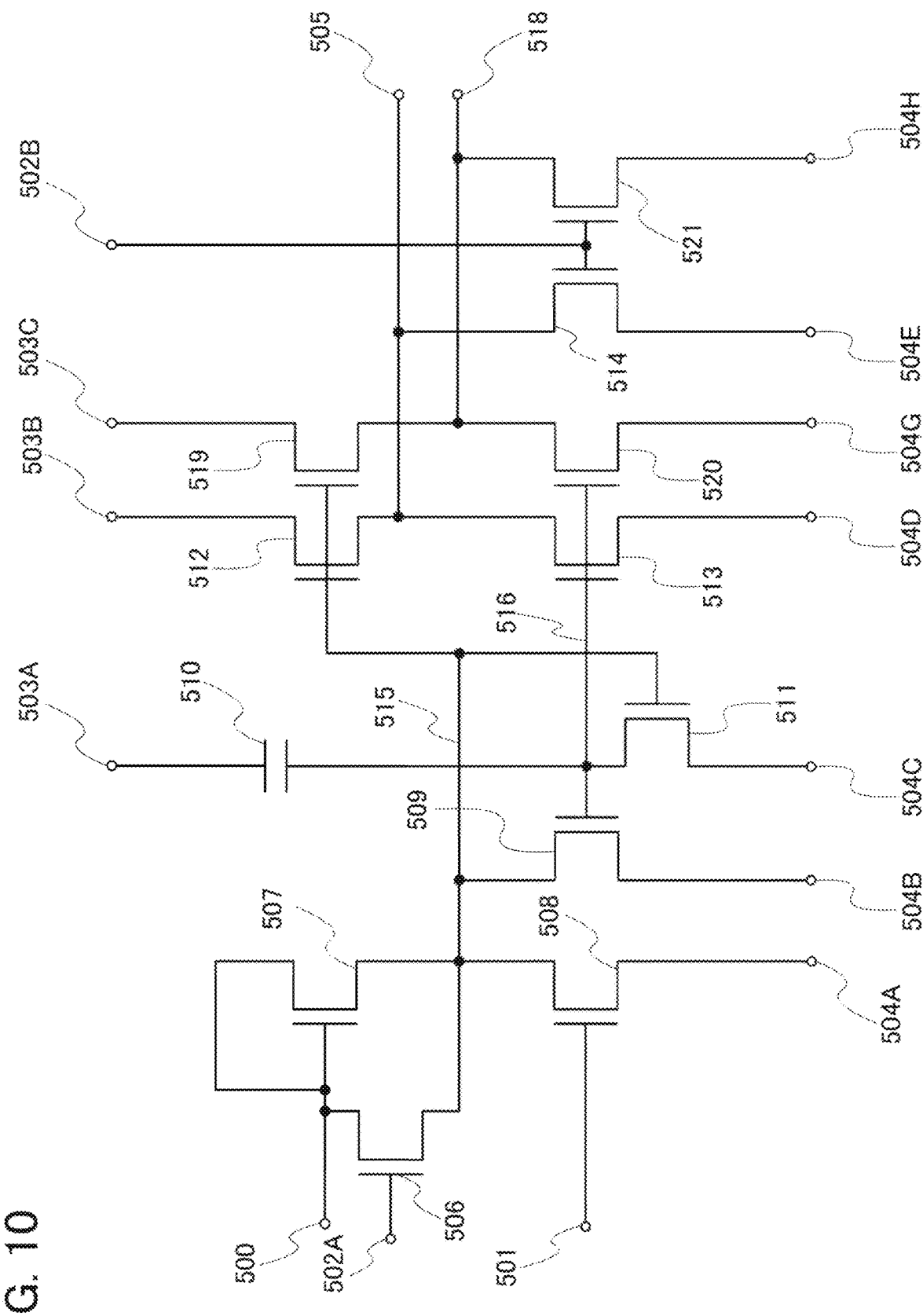
FIG. 10 is a circuit diagram illustrating an example of the structure of the driver circuit in Embodiment 2.

Further, in this embodiment, a driver circuit which is an embodiment of the present invention can be formed using a structure which is different from the structures in FIG. 7 and FIG. 9. A different structure of the driver circuit of this embodiment is described with reference to FIG. 10. FIG. 10 is a circuit diagram illustrating an example of the circuit structure of the driver circuit of this embodiment.

In the structure of the driver circuit illustrated in FIG. 10, in addition to the circuit structure illustrated in FIG. 7, a terminal 503C, a terminal 504G, a terminal 504H, a terminal 518, a transistor 519, a transistor 520, and a transistor 521 are provided.

Note that in FIG. 10, elements denoted by the same reference numerals as in FIG. 7 are the same elements as in the driver circuit in FIG. 7, so that the description of each element in FIG. 7 is incorporated.

A gate terminal of the transistor 519 is electrically connected to the other of the source terminal and the drain terminal of the transistor 506. One of a source terminal and a drain terminal of the transistor 519 is electrically connected to the terminal 503C.

A gate terminal of the transistor 520 is electrically connected to the gate terminal of the transistor 509. One of a source terminal and a drain terminal of the transistor 520 is electrically connected to the other of the source terminal and the drain terminal of the transistor 519. The other of the source terminal and the drain terminal of the transistor 520 is electrically connected to the terminal 504G.

A gate terminal of the transistor 521 is electrically connected to the gate terminal of the transistor 514. One of a source terminal and a drain terminal of the transistor 521 is electrically connected to the other of the source terminal and the drain terminal of the transistor 519. The other of the source terminal and the drain terminal of the transistor 521 is electrically connected to the terminal 504H.

The transistor 519 has a function of bringing the terminal 503C and the terminal 518 into conduction in accordance with the potential of the node 515 so that a potential of a signal which is input through the terminal 503C is made equivalent to a potential of a signal which is output through the terminal 518. In particular, the transistor 519 has a function of raising the potential of the node 515 in accordance with rise in a potential of the other of the source terminal and the drain terminal of the transistor 519 when the signal which is input through the terminal 503C is changed from the low state to the high state in the case where the potential of the node 515 is V1. That is, the transistor 519 performs so-called bootstrap operation. The bootstrap operation is often performed using parasitic capacitance between the gate terminal of the transistor 519 and the other of the source terminal and the drain terminal of the transistor 519.

The transistor 520 has a function of bringing the terminal 504G and the terminal 518 into conduction in accordance with the potential of the node 516 so that the potential of the signal which is output through the terminal 518 is set to V1 or V2.

The transistor 521 has a function of bringing the terminal 504H and the terminal 518 into conduction in accordance with the signal which is input through the terminal 502B so that the potential of the signal which is output through the terminal 518 is set to V1 or V2.

Figure 11:
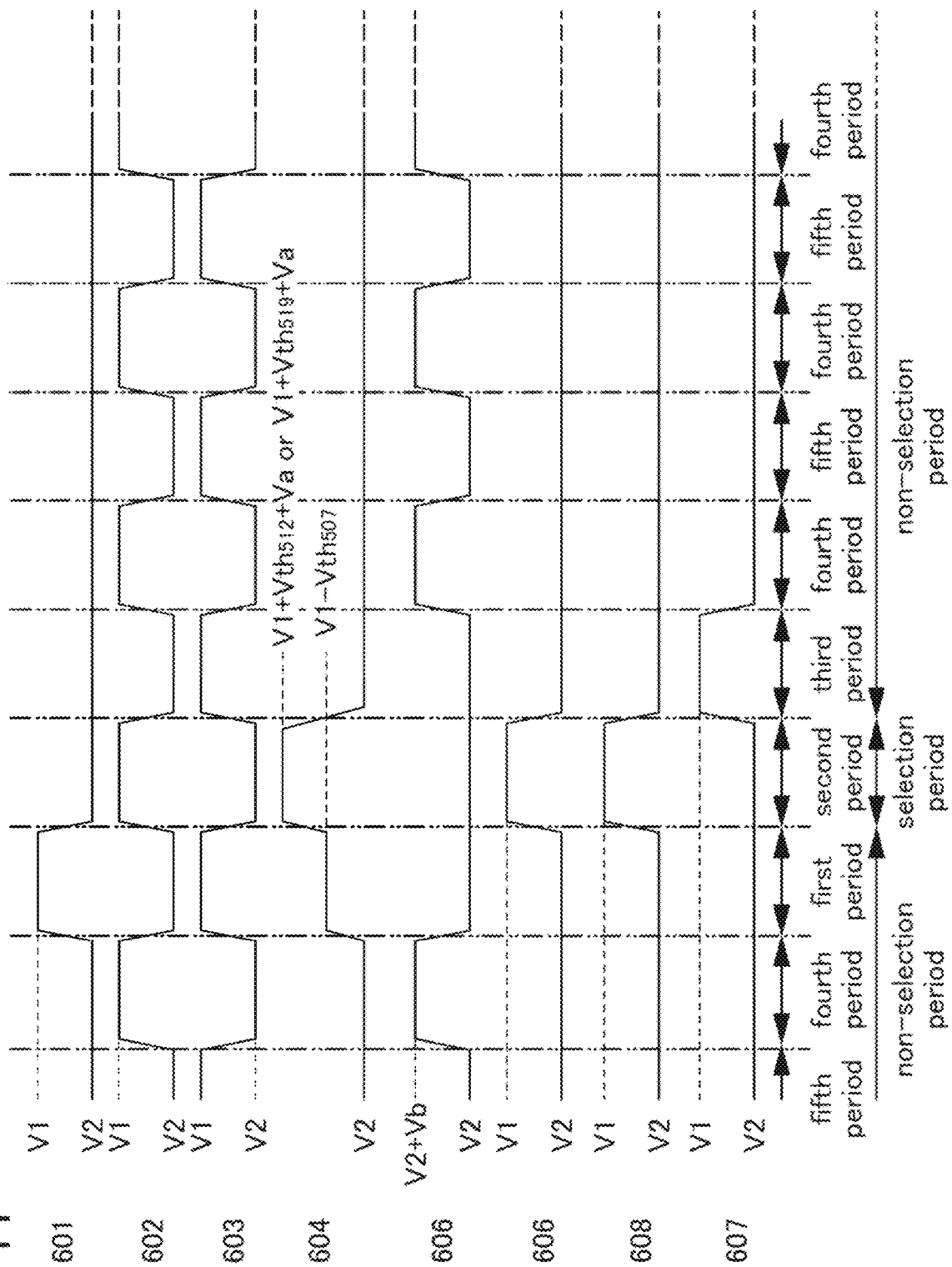
FIG. 11 is a timing chart illustrating the operation of the driver circuit illustrated in FIG. 10.

Next, the operation of the driver circuit illustrated in FIG. 10 is described with reference to FIG. 11. FIG. 11 is a timing chart illustrating an example of the operation of the driver circuit of this embodiment. Note that only the operation of the transistor 519, the operation of the transistor 520, and the operation of the transistor 521 are described as the operation of the driver circuit in FIG. 10, and the description of the driver circuit in FIG. 7 is incorporated in description of operation which is the same as the operation of the elements in the driver circuit illustrated in FIG. 7, as appropriate. Note that the case where the first clock signal is input to the terminal 503C in FIG. 10 is described. Here, as an example of the operation of the driver circuit illustrated in FIG. 10, the case where all the transistors in the flip-flop circuit are n-channel transistors is described.

In a first period, in addition to the operation of the circuit illustrated in FIG. 7, the first clock signal 602 which is in the low state is input through the terminal 503C. In this case, the transistor 521 is turned on.

In this case, the potential 604 of the node 515 is at V1-$Vth_{507}$, so that the transistor 511 is turned on. When the transistor 511 is turned on, the transistor 520 is turned off.

When the potential 604 of the node 515 is at V1-$Vth_{507}$, the transistor 512 is turned on.

In this case, the level of the potential of an output signal 608 which is output through the terminal 518 becomes equivalent to the level of the potential V2 of the first clock signal which is input through the terminal 503C or the level of the potential V2 which is applied through the terminal 504H. The above is the operation in the first period.

Next, in a second period, in addition to the operation of the circuit illustrated in FIG. 7, the first clock signal 602 which is in the high state is input through the terminal 503C. In this case, the transistor 521 is turned off.

In this case, the potential 604 of the node 515 is kept at V1-$Vth_{507}$ and the transistor 511 is kept on. When the transistor 511 is kept on, the transistor 520 is kept off.

In addition, in this case, the node 515 is kept in a floating state and the potential 604 of the node 515 is kept at V1-$Vth_{507}$.

When the potential 604 of the node 515 is kept at V1-$Vth_{507}$ and the potential of the one of the source terminal and the drain terminal of the transistor 519 becomes the potential V1 of the first clock signal 602, the potential 604 of the node 515 rises by capacitive coupling of parasitic capacitance between the gate terminal of the transistor 519 and the other of the source terminal and the drain terminal of the transistor 519 in accordance with the potential of the output signal 608. In this case, the potential 604 of the node 515 rises to a value which is larger than the sum of the potential V1 of the first clock signal 602 and the threshold voltage of the transistor 512 (also referred to as $Vth_{512}$) or the sum of the potential V1 of the first clock signal 602 and the threshold voltage of the transistor 519 (also referred to as $Vth_{519}$), i.e., to V1+$Vth_{512}$+Vα or V1+$Vth_{519}$+Vα (Vα is a given positive number).

When the potential 604 of the node 515 is V1+$Vth_{512}$+Vα or V1+$Vth_{519}$+Vα, the transistor 519 is kept on.

In this case, the level of the potential of the output signal 608 which is output through the terminal 518 becomes equivalent to the level of the potential V1 of the first clock signal 602 which is input through the terminal 503C. The above is the operation in the second period.

Next, in a third period, in addition to the operation of the circuit illustrated in FIG. 7, the first clock signal 602 which is in the low state is input through the terminal 503C. In this case, the transistor 521 is turned on.

In this case, the potential 605 of the node 516 is kept at the level which is equivalent to the potential V2. When the potential 605 of the node 516 is V2, the node 516 enters into a floating state. When the node 516 is in the floating state, the transistor 520 is kept off.

In this case, the level of the potential of the output signal 608 which is output through the terminal 518 becomes equivalent to the level of the potential V2 which is applied through the terminal 504H. The above is the operation in the third period.

Next, in a fourth period, in addition to the operation of the circuit illustrated in FIG. 7, the first clock signal 602 which is in the high state is input through the terminal 503C. In this case, the transistor 521 is turned off.

In this case, the potential 605 of the node 516 is at V2+Vb. When the potential 605 of the node 516 is at V2+Vb, the transistor 520 is turned on.

The level of the potential 604 of the node 515 becomes equivalent to the level of the potential V2 which is applied through the terminal 504B. When the potential 604 of the node 515 is at V2, the transistor 519 is turned off.

In this case, the level of the potential of the output signal 608 which is output through the terminal 518 becomes equivalent to the level of the potential V2 which is applied through the terminal 504G. The above is the operation in the fourth period.

Next, in a fifth period, in addition to the operation of the circuit illustrated in FIG. 7, the first clock signal 602 which is in the low state is input through the terminal 503C. In this case, the transistor 521 is turned on.

When the potential 604 of the node 515 is at V2, the transistor 519 is turned off.

When the potential 605 of the node 516 is at V2, the transistor 520 is turned off.

In this case, the level of the potential of the output signal 608 which is output through the terminal 518 becomes equivalent to the level of the potential V2 which is applied through the terminal 504H. The above is the operation in the fifth period.

As described above, in the flip-flop circuit in the driver circuit illustrated in FIG. 10, by using a plurality of output signals, one of the output signals is output to a flip-flop circuit in the next stage, and the other of the output signals is output to a gate terminal of a transistor in a pixel. Thus, an output signal with slight deviation can be output to the flip-flop circuit, so that malfunctions can be suppressed.

Figure 12:
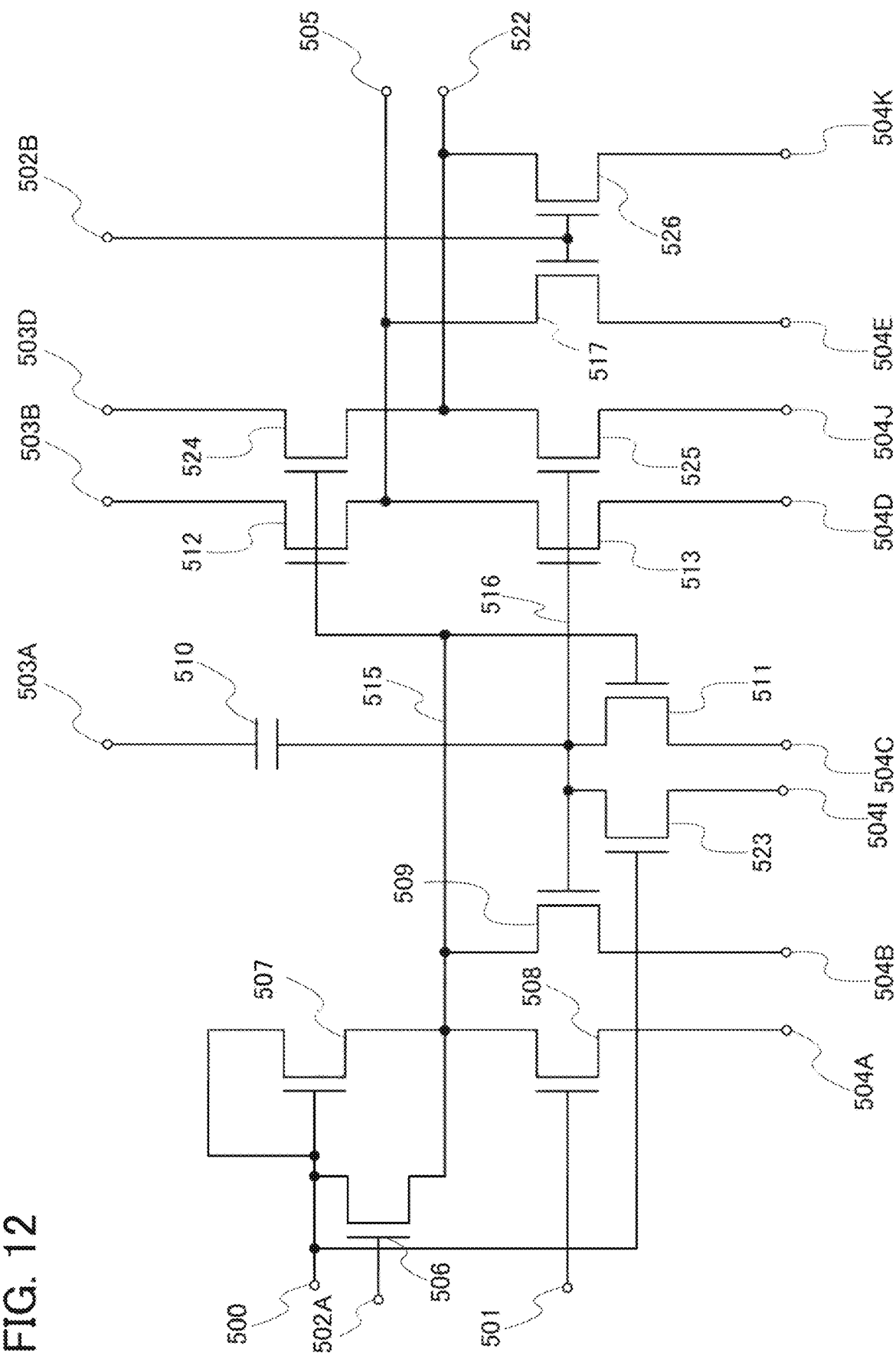
FIG. 12 is a circuit diagram illustrating an example of the structure of the driver circuit in Embodiment 2.

Further, as the flip-flop circuit in the driver circuit of this embodiment, the structure in FIG. 7 and the structure in FIG. 10 can be combined with each other. A different structure of the flip-flop circuit in the driver circuit of this embodiment is described with reference to FIG. 12. FIG. 12 is a circuit diagram illustrating the different structure of the flip-flop circuit in the driver circuit of this embodiment.

In the different structure of the flip-flop circuit in the driver circuit of this embodiment, which is illustrated in FIG. 12, in addition to the circuit structure illustrated in FIG. 7, a terminal 503D, a terminal 504I, a terminal 504J, a terminal 504K, a terminal 522, a transistor 523, a transistor 524, a transistor 525, and a transistor 526 are provided.

In FIG. 12, elements denoted by the same reference numerals as in FIG. 7 are the same elements as in the driver circuit in FIG. 7, so that the description of each element in FIG. 7 is incorporated as appropriate.

In FIG. 12, the terminal 503D corresponds to the terminal 503C in FIG. 10; the terminal 504I corresponds to the terminal 504F in FIG. 9; the terminal 504J corresponds to the terminal 504G in FIG. 10; the terminal 504K corresponds to the terminal 504H in FIG. 10; the terminal 522 corresponds to the terminal 518 in FIG. 10; the transistor 523 corresponds to the transistor 517 in FIG. 9; the transistor 524 corresponds to the transistor 519 in FIG. 10; the transistor 525 corresponds to the transistor 520 in FIG. 10; the transistor 526 corresponds to the transistor 521 in FIG. 10. The description of each element in FIG. 9 and FIG. 10 is incorporated in description of each element as appropriate.

Since the operation of the driver circuit in FIG. 12 is combination of the operation of the driver circuit in FIG. 9 and the operation of the driver circuit in FIG. 10, the description of the operation of the driver circuit in FIG. 9 and the operation of the driver circuit in FIG. 10 is incorporated as appropriate.

By using the structure illustrated in FIG. 12 as described above, the advantageous effects of the driver circuits illustrated in FIG. 9 and FIG. 10 can be obtained.

Note that this embodiment can be combined with any of the other embodiments as appropriate.

Embodiment 3

In this embodiment, the structure of a display device including the driver circuit which is an embodiment of the present invention is described.

Figure 13:
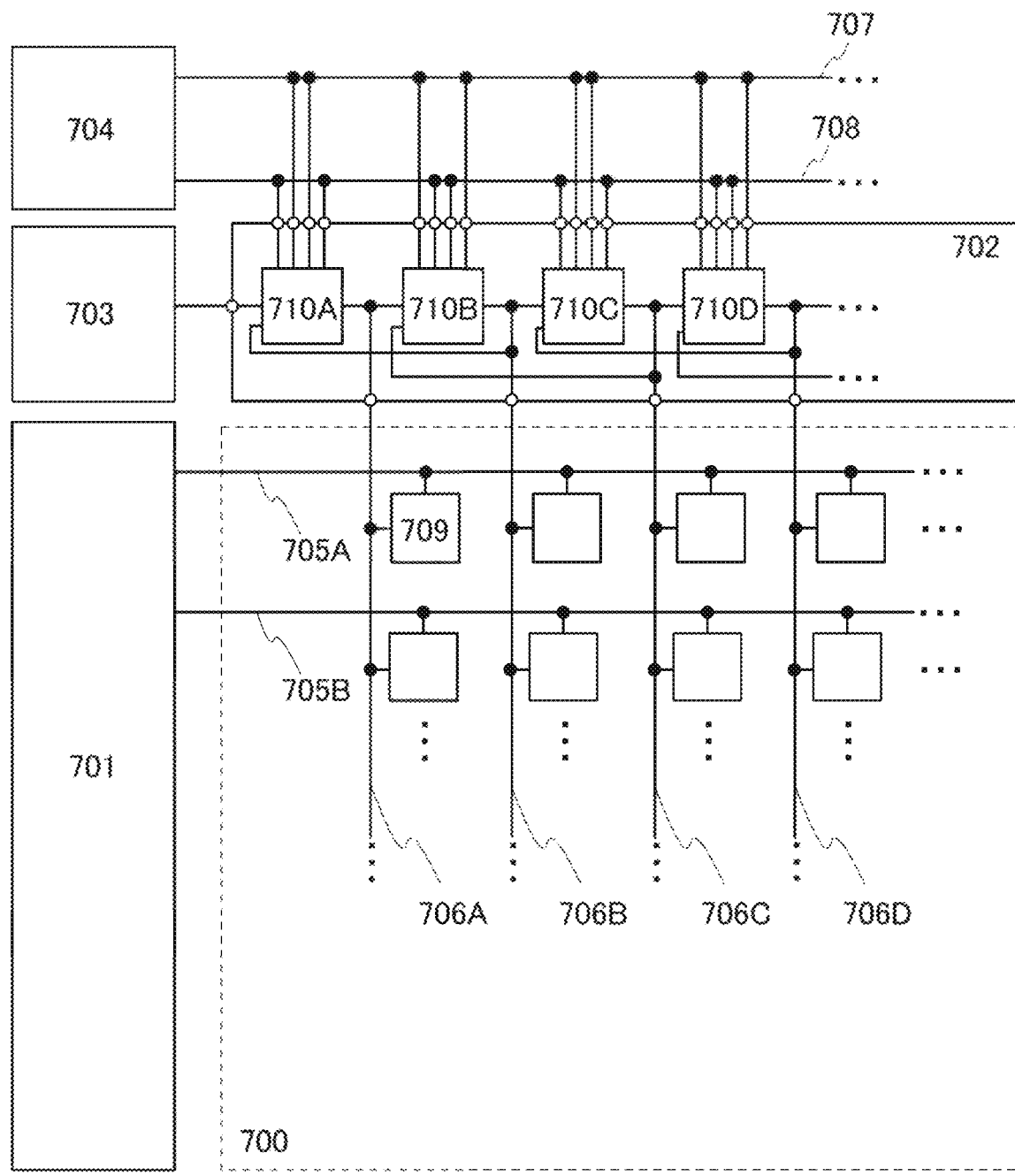
FIG. 13 is a circuit diagram illustrating an example of the structure of a display device in Embodiment 3.

First, the structure of a display device of this embodiment is described with reference to FIG. 13. FIG. 13 is a block diagram illustrating an example of the structure of the display device of this embodiment.

The display device illustrated in FIG. 13 includes a pixel portion 700, a signal line driver circuit 701, a scan line driver circuit 702, a control circuit 703, a clock signal generation circuit 704, a signal line 705A, a signal line 705B, a scan line 706A, a scan line 706B, a scan line 706C, a scan line 706D, a clock signal line 707, and a clock signal line 708. Note that in the display device illustrated in FIG. 13, the scan line 706A, the scan line 706B, the scan line 706C, or the scan line 706D is simply referred to as a scan line 706. Note that in the display device illustrated in FIG. 13, the signal line 705A or the signal line 705B is simply referred to as a signal line 705. In addition, although two signal lines and four scan lines are illustrated in FIG. 13, the number of signal lines and the number of scan lines are not particularly limited in the display device of this embodiment. The number of signal lines and the number of scan lines can be different from the above. By increasing the number of signal lines and the number of scan lines, images can be displayed even in the case of increasing the number of pixels.

The pixel portion 700 includes a plurality of pixels 709. Note that although only eight pixels 709 are illustrated in FIG. 13, the number of the pixels 709 is not limited to this. In the display device of this embodiment, the number of the pixels 709 can be different from the above. For example, if the pixel portion has the same size, images can be displayed clearly by increasing the number of pixels.

The pixel 709 in the pixel portion 700 is electrically connected to the signal line driver circuit 701 through any one of the plurality of signal lines 705 and is electrically connected to the scan line driver circuit 702 through any one of the plurality of scan lines 706.

The scan line driver circuit 702 includes a shift register. The shift register includes a flip-flop circuit 710A which is a first flip-flop circuit (also referred to as a flip-flop circuit in a first stage), a flip-flop circuit 710B which is a second flip-flop circuit (also referred to as a flip-flop circuit in a second stage), a flip-flop circuit 710C which is a third flip-flop circuit (also referred to as a flip-flop circuit in a third stage), and a flip-flop circuit 710D which is a fourth flip-flop circuit (also referred to as a flip-flop circuit in a fourth stage). Note that the flip-flop circuit 710A, the flip-flop circuit 710B, the flip-flop circuit 710C, or the flip-flop circuit 710D is simply referred to as a flip-flop circuit 710. Note that in the display device of this embodiment, the number of flip-flop circuits is not limited to the number of the flip-flop circuits illustrated in FIG. 13. The number of the flip-flop circuits can be different from the above ((N pieces of stages) (N is a natural number)). For example, it is effective to increase the number of the flip-flop circuits in the case of increasing the area of the pixel portion because more signal lines can be controlled.

In the display device of this embodiment, the structure of any one of the flip-flop circuits in Embodiments 1 to 3 can be used for the flip-flop circuit 710. The case where the structure of the flip-flop in FIG. 1 is used in the display device illustrated in FIG. 13 is described as an example. Note that although an example in which the driver circuit which is an embodiment of the present invention is used as the scan line driver circuit in the display device illustrated in FIG. 13 is described, the example of the display device is not limited to this. In the display device of this embodiment, the driver circuit which is an embodiment of the present invention can also be applied to the signal line driver circuit.

For example, in the case of using a structure where the flip-flop circuit 710 has N pieces of stages (N is a natural number of 2 or more), in a flip-flop circuit in a first stage, the terminal 100 illustrated in FIG. 1 is electrically connected to the control circuit 703, and the terminal 105 illustrated in FIG. 1 is electrically connected to the pixel 709 through the first scan line 706.

In the flip-flop circuit 710 in an N$^{th}$ stage, the terminal 100 illustrated in FIG. 1 is electrically connected to the terminal 105 in the flip-flop circuit 710 in an (N−1)$^{th}$ stage, and the terminal 105 illustrated in FIG. 1 is electrically connected to the terminal 101 illustrated in FIG. 1 in the flip-flop circuit 710 in the (N−1)$^{th}$ stage and is electrically connected to the pixel 709 through a K$^{th}$ scan line 706.

In the flip-flop circuit 710 in an odd-numbered stage, the terminal 102 illustrated in FIG. 1 is electrically connected to the clock signal generation circuit 704 through the clock signal line 708, and the terminal 103 illustrated in FIG. 1 is electrically connected to the clock signal generation circuit 704 through the clock signal line 707.

In the flip-flop circuit 710 in an even-numbered stage, the terminal 102 illustrated in FIG. 1 is electrically connected to the clock signal generation circuit 704 through the clock signal line 707, and the terminal 103 illustrated in FIG. 1 is electrically connected to the clock signal generation circuit 704 through the clock signal line 708.

In addition, the structure of the scan line driver circuit 702 illustrated in FIG. 13 is specifically described.

In the scan line driver circuit 702 illustrated in FIG. 13, in the flip-flop circuit 710A, the terminal 100 illustrated in FIG. 1 is electrically connected to the control circuit 703; the terminal 102 illustrated in FIG. 1 is electrically connected to the clock signal generation circuit 704 through the clock signal line 708; the terminal 103 illustrated in FIG. 1 is electrically connected to the clock signal generation circuit 704 through the clock signal line 707; the terminal 105 illustrated in FIG. 1 is electrically connected to the pixel 709 through the scan line 706A.

In the flip-flop circuit 710B, the terminal 100 illustrated in FIG. 1 is electrically connected to the terminal 105 in the flip-flop circuit 710A; the terminal 102 illustrated in FIG. 1 is electrically connected to the clock signal generation circuit 704 through the clock signal line 707; the terminal 103 illustrated in FIG. 1 is electrically connected to the clock signal generation circuit 704 through the clock signal line 708; the terminal 105 illustrated in FIG. 1 is electrically connected to the terminal 101 illustrated in FIG. 1 in the flip-flop circuit 710A and is electrically connected to the pixel 709 through the scan line 706B.

In the flip-flop circuit 710C, the terminal 100 illustrated in FIG. 1 is electrically connected to the terminal 105 in the flip-flop circuit 710B; the terminal 102 illustrated in FIG. 1 is electrically connected to the clock signal generation circuit 704 through the clock signal line 708; the terminal 103 illustrated in FIG. 1 is electrically connected to the clock signal generation circuit 704 through the clock signal line 707; the terminal 105 illustrated in FIG. 1 is electrically connected to the terminal 101 illustrated in FIG. 1 in the flip-flop circuit 710B and is electrically connected to the pixel 709 through the scan line 706C.

In the flip-flop circuit 710D, the terminal 100 illustrated in FIG. 1 is electrically connected to the terminal 105 in the flip-flop circuit 710C; the terminal 102 illustrated in FIG. 1 is electrically connected to the clock signal generation circuit 704 through the clock signal line 707; the terminal 103 illustrated in FIG. 1 is electrically connected to the clock signal generation circuit 704 through the clock signal line 708; the terminal 105 illustrated in FIG. 1 is electrically connected to the terminal 101 illustrated in FIG. 1 in the flip-flop circuit 710C and is electrically connected to the pixel 709 through the scan line 706D.

The clock signal generation circuit 704 outputs a first clock signal through the clock signal line 707 and outputs a second clock signal through the clock signal line 708. Note that since the first clock signal and the second clock signal are the same as the first clock signal and the second clock signal in Embodiment 1, the description in Embodiment 1 is incorporated as appropriate.

From the control circuit 703, a start signal is output as a first control signal for starting the operation of the flip-flop circuit. Note that since the start signal is the same as the first control signal in Embodiment 1, the description of the first control signal in Embodiment 1 is incorporated. In addition, a structure where the control circuit 703 is electrically connected to the signal line driver circuit 701 can be used. By using the structure where the control circuit 703 and the signal line driver circuit 701 are electrically connected to each other, desired operation can be performed using a control signal also in the signal line driver circuit 701.

Next, the operation of the display device illustrated in FIG. 13 is described.

Figure 14:
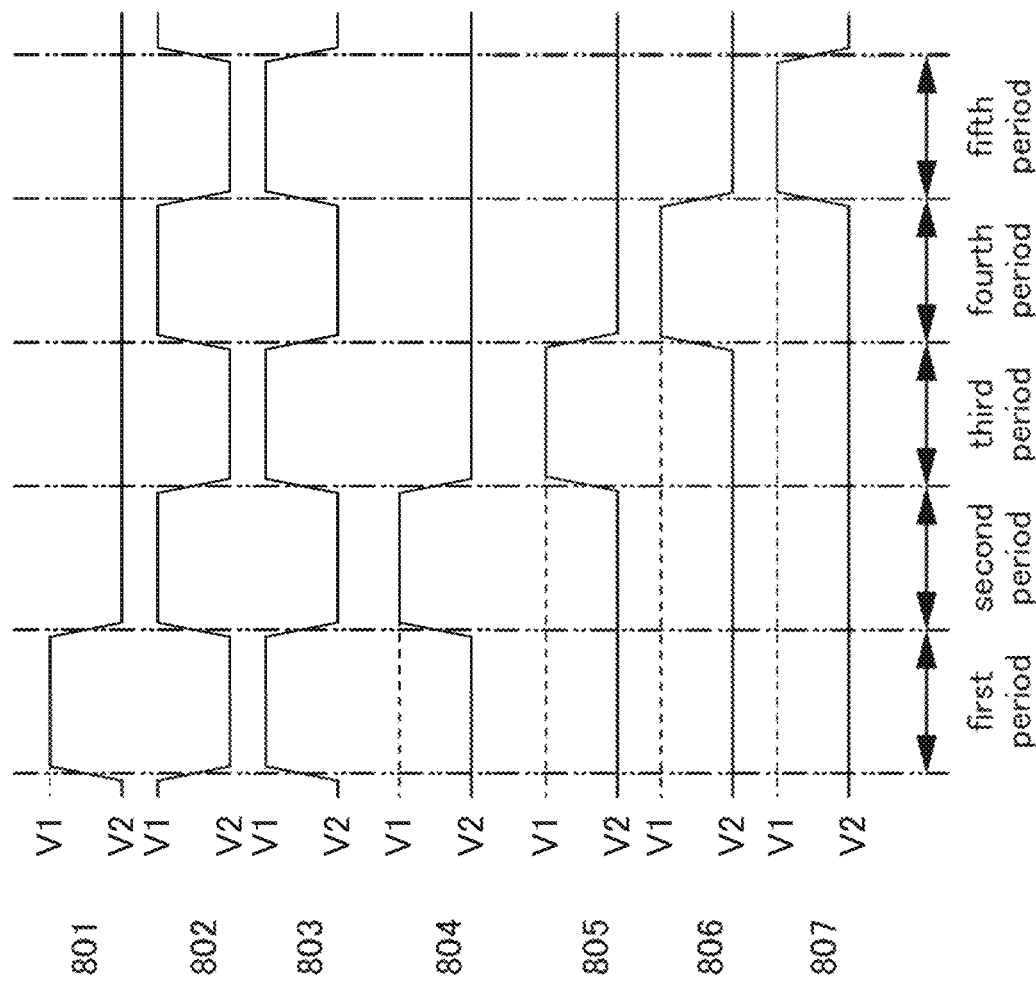
FIG. 14 is a timing chart illustrating the operation of a scan line driver circuit 702 illustrated in FIG. 13.

First, the operation of the scan line driver circuit 702 is described with reference to FIG. 14. FIG. 14 is a timing chart illustrating an example of the operation of the scan line driver circuit in the display device illustrated in FIG. 13. Here, as an example, the case where the flip-flop circuit is formed using an n-channel transistor is described.

The operation of the scan line driver circuit 702 illustrated in FIG. 13 is divided into T (T is a natural number) periods in accordance with the number of stages (N) of the flip-flop circuits. Here, as an example, the operation of the four flip-flop circuits 710A to 710D which are illustrated in FIG. 13 is described assuming that T is 8.

First, in a first period, a start signal 801 which is in a high state is input to the flip-flop circuit 710A from the control circuit 703 through the terminal 100 in the flip-flop circuit 710A; a second clock signal 803 which is in a high state is input through the terminal 102; a first clock signal 802 which is in a low state is input through the terminal 103. The operation in the first period here corresponds to the operation in the first period of the timing chart illustrated in FIG. 2 in Embodiment 1.

Next, in a second period, the start signal 801 which is in a low state is input to the flip-flop circuit 710A from the control circuit 703 through the terminal 100 in the flip-flop circuit 710A; the second clock signal 803 which is in a low state is input through the terminal 102; the first clock signal 802 which is in a high state is input through the terminal 103. In this case, an output signal 804 which is in a high state is output to the terminal 100 in the flip-flop circuit 710B and the scan line 706A through the terminal 105.

In addition, in the second period, the output signal 804 of the flip-flop circuit 710A is input to the flip-flop circuit 710B through the terminal 100; the first clock signal 802 which is in the high state is input through the terminal 102; the second clock signal 803 which is in the low state is input through the terminal 103.

Next, in a third period, the output signal 804 which is in a low state is input to the flip-flop circuit 710B through the terminal 100; the first clock signal 802 which is in the low state is input through the terminal 102; the second clock signal 803 which is in the high state is input through the terminal 103. In this case, an output signal 805 which is in a high state is output to the terminal 100 in the flip-flop circuit 710C, the terminal 101 in the flip-flop circuit 710A, and the scan line 706B through the terminal 105.

In addition, in the third period, the output signal 805 which is in the high state is input to the flip-flop circuit 710C through the terminal 100; the second clock signal 803 which is in the high state is input through the terminal 102; the first clock signal 802 which is in the low state is input through the terminal 103.

Next, in a fourth period, an output signal 805 which is in a low state is input to the flip-flop circuit 710C through the terminal 100; the second clock signal 803 which is in the low state is input through the terminal 102; the first clock signal 802 which is in the high state is input through the terminal 103. In this case, the output signal 806 is output to the terminal 100 in the flip-flop circuit 710D, the terminal 101 in the flip-flop circuit 710B, and the scan line 706C through the terminal 105.

In addition, in the fourth period, the output signal 806 which is in the high state is input to the flip-flop circuit 710D through the terminal 100 as the first control signal; the first clock signal 802 which is in the high state is input through the terminal 102; the second clock signal 803 which is in the low state is input through the terminal 103.

Next, in a fifth period, the output signal 806 which is in the low state is input to the flip-flop circuit 710D through the terminal 100 as the first control signal; the first clock signal 802 which is in the low state is input through the terminal 102; the second clock signal 803 which is in the high state is input through the terminal 103. In this case, an output signal 807 is output to the terminal 100 in a flip-flop circuit in the next stage, the terminal 101 in the flip-flop circuit 710C, and the scan line 706D through the terminal 105. The above is the operation of the scan line driver circuit.

Next, the operation in the pixel portion is described.

First, any one of the plurality of scan lines 706 is selected by the scan line driver circuit 702. A signal is input to the pixel 709 which is electrically connected to the selected scan line 706 from the signal line driver circuit 701 through the signal line 705, and a predetermined potential is applied to a display element so that an image is displayed. Further, images are displayed in different pixels in a similar manner when the other scan lines 706 are sequentially selected. The above is the operation in the pixel portion.

As described above, by using the driver circuit which is an embodiment of the present invention as the scan line driver circuit in the display device of this embodiment, changes in the amount of signals after the flip-flop circuit is reset can be suppressed. Therefore, malfunctions can be suppressed. Further, since each scan line can be held at a desired potential, reliability can be improved.

As the display device of this embodiment, a liquid crystal display device can be used, for example. The case where a liquid crystal display device is used is described below.

As the operation mode of a liquid crystal element which can be used in a liquid crystal display device of this embodiment, a TN (twisted nematic) mode, an IPS (in-plane-switching) mode, an FFS (fringe field switching) mode, an MVA (multi-domain vertical alignment), a PVA (patterned vertical alignment) mode, an ASM (axially symmetric aligned micro-cell) mode, an OCB (optical compensated birefringence) mode, an FLC (ferroelectric liquid crystal) mode, an AFLC (antiferroelectric liquid crystal) mode, or the like can be used.

Next, the structure and operation of a pixel which can be used in the liquid crystal display device of this embodiment are described.

Figure 15A:
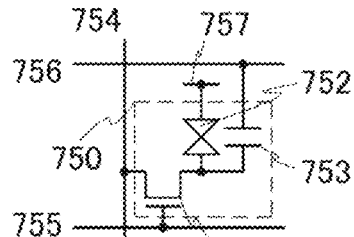
FIGS. 15A to 15G illustrate examples of the structure and the operation of a pixel in a liquid crystal display device of Embodiment 3.

First, the structure of a pixel which can be used in the liquid crystal display device of this embodiment is described with reference to FIG. 15A. FIG. 15A is a circuit diagram illustrating an example of the structure of the pixel portion of the liquid crystal display device of this embodiment.

The pixel portion illustrated in FIG. 15A includes a pixel 750, a wiring 754, a wiring 755, a wiring 756, and a wiring 757. The pixel 750 includes a transistor 751, a liquid crystal element 752, and a capacitor 753.

A gate terminal of the transistor 751 is electrically connected to the wiring 755. One of a source terminal and a drain terminal of the transistor 751 is electrically connected to the wiring 754.

The liquid crystal element 752 includes a first terminal, a second terminal, and a liquid crystal layer. The first terminal of the liquid crystal element 752 is electrically connected to the other of the source terminal and the drain terminal of the transistor 751. The second terminal of the liquid crystal element 752 is electrically connected to the wiring 757.

The capacitor 753 includes at least two terminals. One of the terminals of the capacitor 753 is electrically connected to the first terminal of the liquid crystal element 752. The other of the terminals of the capacitor 753 is electrically connected to the wiring 756.

The wiring 754 can serve as a signal line, for example. The signal line is a wiring for sending a data signal, which is input from the outside of the pixel and has a predetermined potential, to the pixel 750.

The wiring 755 can serve as a scan line. The scan line is a wiring for controlling an on state and an off state of the transistor 751.

The wiring 756 can serve as a capacitor line. The capacitor line is a wiring for applying predetermined voltage to the one of the terminals of the capacitor 753.

The transistor 751 can serve as a switch.

The capacitor 753 can serve as a storage capacitor. The capacitor 753 is a capacitor for holding voltage applied to the liquid crystal element 752 for a certain period when the transistor 751 is in an off state.

The wiring 757 can serve as a counter electrode of the liquid crystal element 752. The counter electrode is a wiring for applying predetermined voltage to the liquid crystal element 752.

Note that the function of each wiring is not limited to this, and a variety of functions can be provided. For example, by changing a potential applied to the wiring which serves as the capacitor line, the level of voltage applied to the liquid crystal element 752 can be controlled.

Since the transistor 751 only has to serve as a switch, the transistor 751 may be either a p-channel transistor or an n-channel transistor.

Figure 15B:
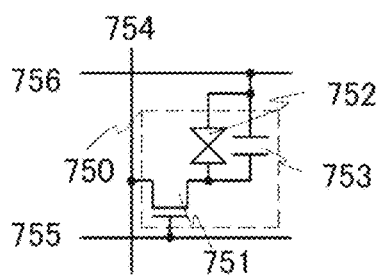

Further, a different structure of a pixel which can be used in the liquid crystal display device of this embodiment is described with reference to FIG. 15B. FIG. 15B is a circuit diagram illustrating an example of the different structure of the pixel portion of the liquid crystal display device of this embodiment.

The structure of the pixel portion illustrated in FIG. 15B is similar to the structure of the pixel portion illustrated in FIG. 15A except that the wiring 757 is eliminated and the terminal of the liquid crystal element 752 and the terminal of the capacitor 753 are electrically connected to each other. It is particularly preferable to use the pixel portion illustrated in FIG. 15B in the case where the operation mode of a liquid crystal element is a horizontal electric field mode (e.g., an IPS mode or an FFS mode). This is because electrodes of the liquid crystal element 752, which are part of the terminals of the liquid crystal element 752, and electrodes of the capacitor 753 which are part of the terminals of the capacitor 753, can be formed over the same substrate in the case where the operation mode of the liquid crystal element is a horizontal electric field mode, so that the electrodes of the liquid crystal element 752 and the electrode of the capacitor 753 can be electrically connected to each other easily. Further, by using the structure of the pixel portion illustrated in FIG. 15B, the wiring 757 can be eliminated. Thus, manufacturing steps can be simplified, so that manufacturing cost can be reduced.

Note that in the pixel portion illustrated in FIG. 15A or FIG. 15B, a plurality of pixels can be arranged in matrix. Thus, a display portion of the liquid crystal display device is formed, so that a variety of images can be displayed.

Figure 15C:
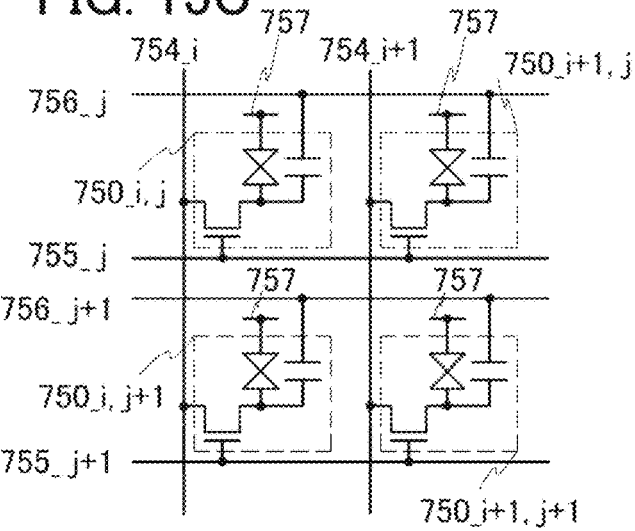

The structure of the pixel portion where a plurality of pixels are arranged is described with reference to FIG. 15C. FIG. 15C is a circuit diagram illustrating an example of the structure of the pixel portion of the liquid crystal display device of this embodiment.

In the pixel portion illustrated in FIG. 15C, the plurality of pixels 750, one of which is illustrated in FIG. 15A, are arranged in matrix. In FIG. 15C, four pixels are picked up from the plurality of pixels in the pixel portion, and a pixel arranged in an $i^{th}$ column and $j^{th}$ row (i and j are natural numbers) is referred to as a pixel 750_$i, j$. In the pixel portion illustrated in FIG. 15C, the pixel 750_$i, j$ is electrically connected to a wiring 754_$i$, a wiring 755_$j$, and a wiring 756_$j$; a pixel 750_$i$+1, j is electrically connected to a wiring 754_$i$+1, the wiring 755_$j$, and the wiring 756_$j$; a pixel 750_$i, j$+1 is electrically connected to the wiring 754_$i$, a wiring 755_$j$+1, and a wiring 756_$j$+1; a pixel 750_$i$+1, j+1 is electrically connected to the wiring 754_$i$+1, the wiring 755_$j$+1, and the wiring 756_$j$+1. Note that in the pixel portion illustrated in FIG. 15C, each wiring can be shared between a plurality of pixels in the same column or the same row. Note that in the pixel portion illustrated in FIG. 15C, since the wiring 757 is the counter electrode and the counter electrode is shared between all the pixels, the wiring 757 is not referred to using the natural number of i or j. Note that in the liquid crystal display device of this embodiment, the structure of the pixel portion illustrated in FIG. 15B can be used. Thus, the wiring 757 can be eliminated from the structure where the wiring 757 is provided, and the wiring 757 can be eliminated if a different wiring also serves as the wiring 757, for example.

Figure 15D:
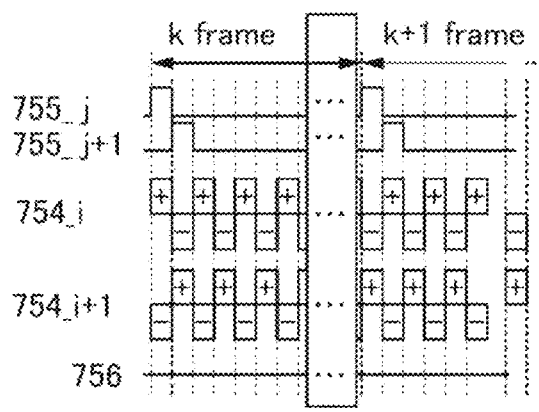

Note that the pixels in the pixel portion illustrated in FIG. 15C can be driven by a variety of methods. In particular, by driving the pixels by a method which is referred to as AC drive, deterioration (burn-in) of the liquid crystal elements can be suppressed. The operation in the case where the pixels in the pixel portion illustrated in FIG. 15C are driven by AC drive is described with reference to FIG. 15D. FIG. 15D is a timing chart illustrating the operation of the pixels in the pixel portion illustrated in FIG. 15C. Note that here, operation using dot inversion drive, which is one of AC drive, is described as the operation of the pixels in the pixel portion illustrated in FIG. 15C. By using dot inversion drive, flickers which occur in the case of AC drive can be suppressed.

In the pixels in the pixel portion illustrated in FIG. 15C, a switch in the pixel which is electrically connected to the wiring 755_$j$ is selected (is in an on state) in a $j^{th}$ gate selection period in one frame period and is not selected (is in an off state) in the other periods. Then, after the $j^{th}$ gate selection period, a $(j+1)^{th}$ gate selection period is provided. By performing sequential scanning in this manner, all the pixels are sequentially selected in one frame period. In the timing chart illustrated in FIG. 15D, for example, the switch in the pixel is selected when the potential is high, and the switch in the pixel is not selected when the potential is low. Note that this example is the case where the transistor in each pixel is an n-channel transistor. In the case of using a p-channel transistor, the relationship between voltage and selection is opposite to that of the case of using an n-channel transistor.

In the timing chart illustrated in FIG. 15D, a positive potential is applied to the wiring 754_$i$ which is used as a signal line and a negative potential is applied to the wiring 754_$i$+1 in the $j^{th}$ gate selection period in a $k^{th}$ frame (k is a natural number). Then, a negative potential is applied to the wiring 754_$i$ and a positive potential is applied to the wiring 754_$i$+1 in the $(j+1)^{th}$ gate selection period in the $k^{th}$ frame. After that, signals whose polarities are inverted every gate selection period are alternately applied to signal lines. Accordingly, in the $k^{th}$ frame, a positive potential, a negative potential, a negative potential, and a positive potential are applied to the pixel 750_$i, j$ the pixel 750_$i$+1, j, the pixel 750_$i, j$+1, and the pixel 750_$i$+1, j+1, respectively. Then, in a $(k+1)^{th}$ frame, potentials whose polarities are opposite to the polarities of the potentials written to the pixels in the $k^{th}$ frame are written to the pixels as data. Accordingly, in the $(k+1)^{th}$ frame, a negative potential, a positive potential, a positive potential, and a negative potential are applied to the pixel 750_$i, j$, the pixel 750_$i$+1, j, the pixel 750_$i, j$+1, and the pixel 750_$i$+1, j+1, respectively. As described above, a driving method by which potentials whose polarities are opposite to each other are applied to adjacent pixels in the same frame and the polarities of potentials are inverted every one frame in the pixels is dot inversion drive. By dot inversion drive, deterioration of the liquid crystal elements can be suppressed and flickers viewed when all or part of images displayed are uniform can be reduced. Note that voltage which is applied to all the wirings 756 including the wiring 756_$j$ and the wiring 756_$j$+1 can be made constant voltage. Note that although only the polarity of a potential of the wiring 754 is illustrated in the timing chart, the level of the potential of the wiring 754 can be a variety of levels in the polarity illustrated in FIG. 15D. Note that although the case where polarities are inverted every one dot (one pixel) is described here, the method of inversion is not limited to this. Polarities can be inverted every plurality of pixels. For example, by inverting the polarities of potentials which are written in every two gate selection periods, power which is consumed in writing the potentials can be reduced. Alternatively, polarities can be inverted every one column (source line inversion) or polarities can be inverted every one row (gate line inversion).

Note that constant voltage may be applied to the capacitor 753 in the pixel 750 in one frame period. Here, a signal supplied to the wiring 755 which is used as a scan line is in a low state in the most part of one frame period, and substantially constant voltage is applied to the wiring 755. Thus, the other of the terminals of the capacitor 753 in the pixel 750 may be connected to the wiring 755. A structure where the other of the terminals of the capacitor 753 and the wiring 755 are electrically connected to each other is illustrated in FIG. 15E.

Figure 15E:
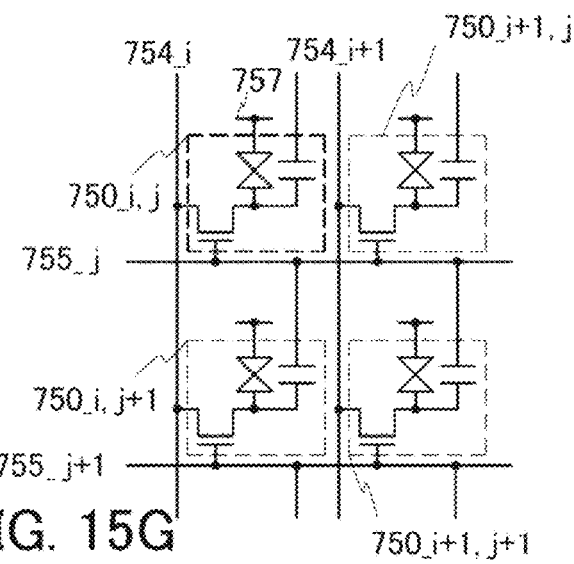

When the structure of a pixel portion illustrated in FIG. 15E is compared to the structure of the pixel portion illustrated in FIG. 15C, the wiring 756 is eliminated and the one of the terminals of the capacitor 753 in the pixel 750 and the wiring 755 in the preceding row are electrically connected to each other. Specifically, the one of the terminals of the capacitors 753 in the pixel 750_$i, j$+1 and the pixel 750_$i$+1, j+1 are electrically connected to the wiring 755_$j$. The wiring 756 can be eliminated by electrically connecting the one of the terminals of the capacitor 753 in the pixel 750 and the wiring 755 in the preceding row in this manner. Thus, according to reduction in the number of wirings, the aperture ratio of the pixels can be improved. Note that the one of the terminals of the capacitor 753 may be connected not to the wiring 755 in the preceding row but to the wiring 755 in a different row. Note that as the driving method of the pixels in the pixel portion illustrated in FIG. 15E, a driving method which is similar to the driving method of the pixels in the pixel portion illustrated in FIG. 15C can be used.

Note that by using the capacitor 753 and the wiring which is electrically connected to the other of the terminals of the capacitor 753, the level of voltage applied to the wiring 754 which is used as the signal line can be lowered. The structure and the driving method of the pixel portion in this case are described with reference to FIG. 15F and FIG. 15G.

Figure 15F:
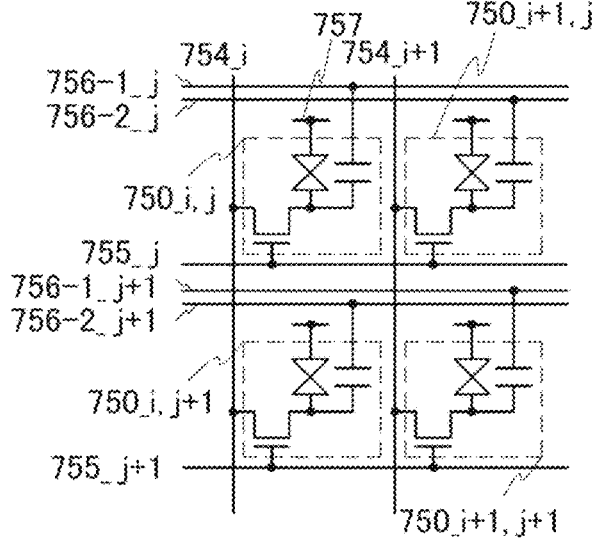

When the structure of the pixel portion illustrated in FIG. 15F is compared to the structure of the pixel portion illustrated in FIG. 15A, two wirings 756 are provided in one pixel column and electrical connection to the one of the terminals of the capacitor 753 in the pixel 750 is alternately performed in adjacent pixels. Note that the two wirings 756 are referred to as a wiring 756-1 and a wiring 756-2. Specifically, in the range of illustration of FIG. 15F, the one of the terminals of the capacitor 753 in the pixel 750_$i, j$ is electrically connected to a wiring 756-1_$j$; the one of the terminals of the capacitor 753 in the pixel 750_$i$+1, j is electrically connected to a wiring 756-2_$j$; the one of the terminals of the capacitor 753 in the pixel 750_$i, j$+1 is electrically connected to a wiring 756-2_$j$+1; the one of the terminals of the capacitor 753 in the pixel 750_$i$+1, j+1 is electrically connected to a wiring 756-1_$j$+1.

Figure 15G:
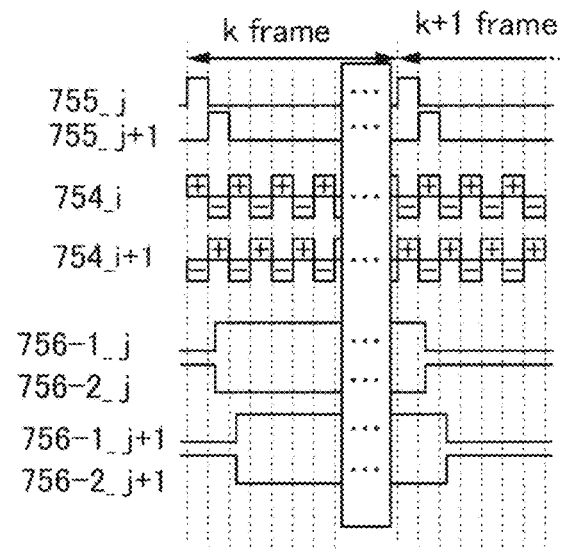

For example, as illustrated in FIG. 15G, in the case where a positive potential is written to the pixel 750_$i, j$ in the k$^{th}$ frame, the wiring 756-1_$j$ enters into a low state in the j$^{th}$ gate selection period and enters into a high state after the fun gate selection period is finished. Then, the wiring 756-1_$j$ is kept at the high state in one frame period, and a negative potential is written in the j$^{th}$ gate selection period in a (k+1)th frame. After that, the wiring 756-1_$j$ enters into the low state. By changing the polarity of the wiring which is electrically connected to the other of the terminals of the capacitor 753 in a positive direction after the positive potential is written to the pixel in this manner, the potential applied to the liquid crystal element can be changed in the positive direction by a predetermined level. That is, the level of voltage which is written to the pixel can be lowered by the predetermined level, so that power which is consumed in writing signals can be reduced. Note that in the case where a negative potential is written in the j$^{th}$ gate selection period, by changing the polarity of the wiring which is electrically connected to the other of the terminals of the capacitor 753 in a negative direction after the negative potential is written to the pixel, the potential applied to the liquid crystal element can be changed in the negative direction by a predetermined level. Thus, as in the case of the positive potential, the level of voltage which is written to the pixel can be lowered. That is, in the same row of the same frame, the wirings which are electrically connected to the other of the terminals of the capacitor 753 are preferably different wirings between the pixel to which the positive potential is applied and the pixel to which the negative potential is applied.

In the pixel portion illustrated in FIG. 15F, the wiring 756-1 is electrically connected to the pixel to which the positive potential is written in the k$^{th}$ frame, and the wiring 756-2 is electrically connected to the pixel to which the negative potential is written in the k$^{th}$ frame. Note that this structure is just an example. For example, in the case of a driving method in which a pixel to which a positive potential is written and a pixel to which a negative potential is written appear every two pixels, it is preferable to perform electrical connections with the wiring 756-1 and the wiring 756-2 alternately every two pixels. Further, in the case where potentials having the same polarity are written to all the pixels in one row (gate line inversion), one wiring 756 is provided in one row. That is, in the pixel structure of the pixel portion illustrated in FIG. 15C, a driving method by which the level of voltage written to a pixel is lowered as described with reference to FIG. 15F and FIG. 15G, can be used.

Figure 16A:
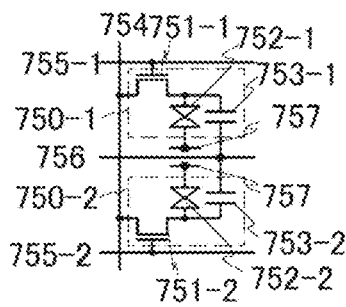
FIGS. 16A to 16H illustrate examples of the structure and the operation of a pixel in the liquid crystal display device of Embodiment 3.
Figure 16B:
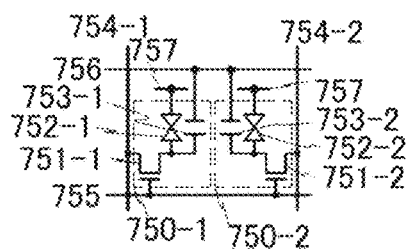

Next, a pixel structure and a driving method thereof which are particularly preferable in the case where the operation mode of a liquid crystal element is a VA (vertical alignment) mode typified by an MVA mode, a PVA mode, or the like are described. The VA mode has advantages that a rubbing process is not necessary in manufacturing, the amount of light leakage is small in displaying black images, and the level of drive voltage is low; however, the VA mode has a problem in that the quality of images deteriorates when a screen is viewed from an angle (the viewing angle is narrow). In order to broaden the viewing angle in the VA mode, it is effective to use a pixel structure where a plurality of subpixels are provided in one pixel. A pixel structure where a plurality of subpixels are provided in one pixel is described with reference to FIG. 16A and FIG. 16B. FIG. 16A and FIG. 16B are circuit diagrams each illustrating an example of the structure of a pixel which can be used in the liquid crystal display device of this embodiment.

The pixel 750 in the pixel portion of each liquid crystal display device illustrated in FIG. 16A and FIG. 16B is an example of the case where two subpixels (a subpixel 750-1 and a subpixel 750-2) are provided. Note that the number of subpixels in one pixel is not limited to two, and the number of subpixels may be a variety of numbers. As the number of subpixels becomes larger, the viewing angle can be further broadened. A plurality of subpixels can have the same circuit structure. Here, the case is described in which all the subpixels have a circuit structure which is similar to the circuit structure illustrated in FIG. 15A. Note that the first subpixel 750-1 includes a transistor 751-1, a liquid crystal element 752-1, and a capacitor 753-1. Connection relationships of these elements are similar to the connection relationships in the circuit structure illustrated in FIG. 15A. In a similar manner, the second subpixel 750-2 includes a transistor 751-2, a liquid crystal element 752-2, and a capacitor 753-2. Connection relationships of these elements are similar to the connection relationships in the circuit structure illustrated in FIG. 15A.

In the pixel portion illustrated in FIG. 16A, two wirings 75S which are used as scan lines (a wiring 755-1 and a wiring 755-2) are provided with respect to two subpixels included in one pixel; one wiring 754 which is used as a signal line is provided; one wiring 756 which is used as a capacitor line is provided. By sharing the signal line and the capacitor line between the two subpixels in this manner, the aperture ratio can be improved, manufacturing cost can be reduced because the structure of a signal line driver circuit can be simplified, and yield can be improved because the number of connection portions between a liquid crystal panel and a driver circuit can be reduced.

In the pixel portion illustrated in FIG. 16B, one wiring 755 which is used as a scan line is provided with respect to two subpixels included in one pixel; two wirings 754 (a wiring 754-1 and a wiring 754-2) which are used as signal lines are provided; one wiring 756 which is used as a capacitor line is provided. By sharing the scan line and the capacitor line between the two subpixels in this manner, the aperture ratio can be improved and the number of the entire scan lines can be reduced; therefore, the length of each gate line selection period can be sufficiently increased even in a high-definition liquid crystal panel, so that appropriate voltage can be written to each pixel.

Next, an example in which the liquid crystal element 752 in the pixel portion illustrated in FIG. 16B is illustrated only by a pixel electrode of the liquid crystal element 752 and the electrical connection of each element is schematically illustrated is described with reference to FIG. 16C and FIG. 16D.

Figure 16C:
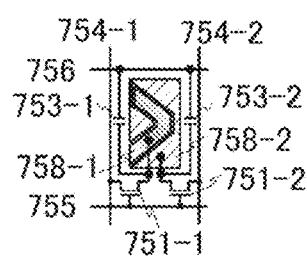
Figure 16D:
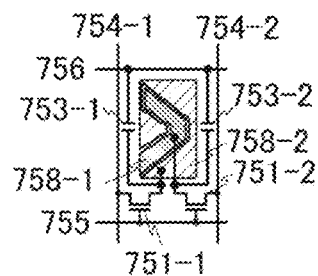

In FIG. 16C and FIG. 16D, an electrode 758-1 is a first pixel electrode and an electrode 758-2 is a second pixel electrode. In FIG. 16C, the electrode 758-1 corresponds to a second terminal of the liquid crystal element 752-1 in FIG. 16B, and the electrode 758-2 corresponds to a second terminal of the liquid crystal element 752-2 in FIG. 16B. That is, the electrode 758-1 is electrically connected to one of a source terminal and a drain terminal of the transistor 751-1, and the electrode 758-2 is electrically connected to one of a source terminal and a drain terminal of the transistor 751-2. On the other hand, in FIG. 16D, connection relationships between the pixel electrodes and the transistors are opposite to the connection relationships in FIG. 16C. That is, the electrode 758-1 is electrically connected to the one of the source terminal and the drain terminal of the transistor 751-2, and the electrode 758-2 is electrically connected to the one of the source terminal and the drain terminal of the transistor 751-1.

By alternately arranging the pixels illustrated in FIG. 16C and FIG. 16D in matrix, special advantageous effects can be obtained. An example of the structure and the driving method of the pixel portion in this case is described with reference to FIG. 16E and FIG. 16F. Note that in a timing chart illustrated in FIG. 16F, for example, a switch in the pixel is selected when the potential is high, and the switch in the pixel is not selected when the potential is low.

Figure 16E:
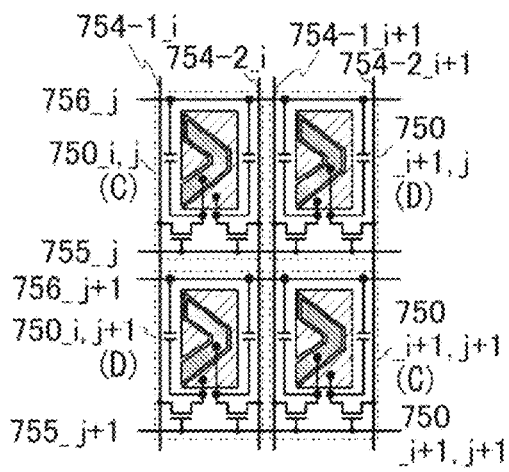
Figure 16F:
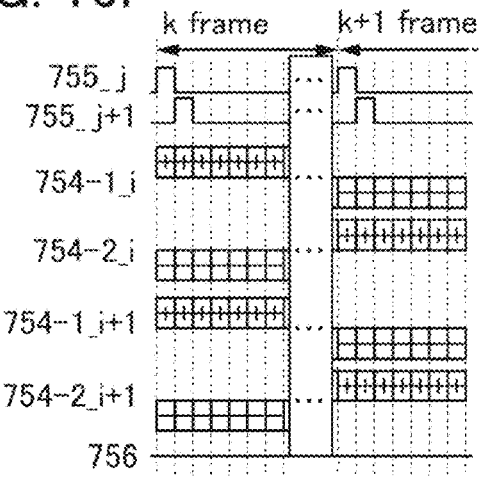

In the structure of the pixel portion illustrated in FIG. 16E, the structure illustrated in FIG. 16C is used for portions which correspond to the pixel 750_$i, j$ and the pixel 750_$i$+1, $j$+1, and the structure illustrated in FIG. 16D is used for portions which correspond to the pixel 750_$i$+1, j and the pixel 750_$i, j$+1. In this structure, by performing driving as the timing chart illustrated in FIG. 16F, in the $j^{th}$ gate selection period in the $k^{th}$ frame, positive potentials are written to a first pixel electrode of the pixel 750_$i, j$ and a second pixel electrode of the pixel 750_$i$+1, j, and negative potentials are written to a second pixel electrode of the pixel 750_$i, j$ and a first pixel electrode of the pixel 750_$i$+1, j. In the (j+1)$^{th}$ gate selection period in the $k^{th}$ frame, positive potentials are applied to a second pixel electrode of the pixel 750_$i, j$+1 and a first pixel electrode of the pixel 750_$i$+1, j+1, and negative potentials are applied to a first pixel electrode of the pixel 750_$i, j$+1 and a second pixel electrode of the pixel 750_$i$+1, j+1. In the (k+1)$^{th}$ frame, the polarity of voltage is inverted in each pixel. Thus, driving which corresponds to dot inversion drive can be performed in the pixel structure where subpixels are provided and the polarities of potentials applied to signal lines can be the same in one frame period. Therefore, power which is consumed in writing data to the pixels can be drastically reduced. Note that voltage which is applied to all the wirings 756 including the wiring 756_$j$ and the wiring 756_$j$+1 can be constant voltage.

Figure 16G:
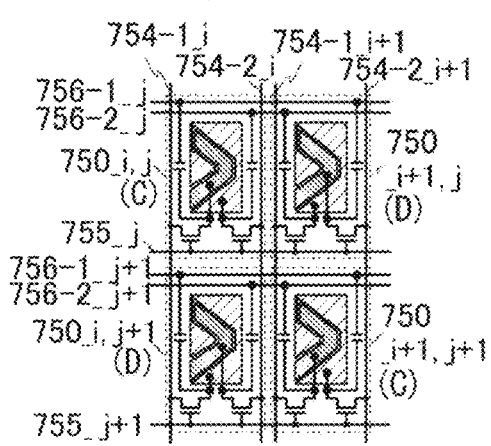
Figure 16H:
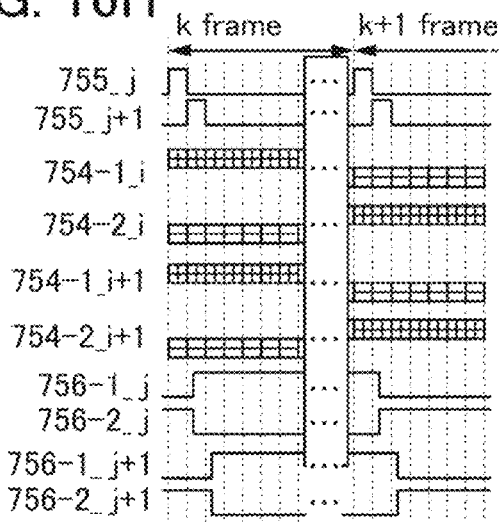

By using the structure and the driving method illustrated in FIGS. 16G and 16H, the level of potential which is written to a pixel can be lowered. Specifically, capacitor lines which are electrically connected to a plurality of subpixels included in each pixel are different between the subpixels. That is, by using the structure and the driving method illustrated in FIGS. 16G and 16H, subpixels to which voltage having the same polarities are written in the same frame share a capacitor line in the same row, and subpixels to which voltage having the different polarities are written in the same frame use different capacitor lines in the same row. Then, by changing the potentials of the capacitor lines in a positive direction in the subpixels to which voltage having the same polarities are written and by changing the potentials of the capacitor lines in a negative direction in the subpixels to which voltage having the different polarities are written at the time when writing of each row is finished, the level of voltage which is written to a pixel can be lowered. In specific, two wirings 756 (a wiring 756-1 and a wiring 756-2) which are used as capacitor lines are provided in each row; the first pixel electrode of the pixel 750_$i, j$ and a wiring 756-1_$j$ are electrically connected to each other through a capacitor; the second pixel electrode of the pixel 750_$i, j$ and a wiring 756-2_$j$ are electrically connected to each other through a capacitor; a first pixel electrode of the pixel 750_$i$+1, j and the wiring 756-1_$j$ are electrically connected to each other through a capacitor; a second pixel electrode of the pixel 750_$i$+1, j and the wiring 756-2_$j$ are electrically connected to each other through a capacitor; a first pixel electrode of the pixel 750_$i, j$+1 and a wiring 756-2_$j$+1 are electrically connected to each other through a capacitor; a second pixel electrode of the pixel 750_$i, j$+1 and a wiring 756-1_$j$+1 are electrically connected to each other through a capacitor; a first pixel electrode of the pixel 750_$i$+1, j+1 and the wiring 756-2_$j$+1 are electrically connected to each other through a capacitor; a second pixel electrode of the pixel 750_$i$+1, j+1 and the wiring 756-1_$j$+1 are electrically connected to each other through a capacitor. Note that this structure is just an example. For example, in the case of a driving method in which a pixel to which a positive potential is written and a pixel to which a negative potential is written appear every two pixels, it is preferable to perform electrical connections with the wiring 756-1 and the wiring 756-2 alternately every two pixels. Further, in the case where potentials having the same polarity are written to all the pixels in one row (gate line inversion), one wiring 756 is provided in one row. That is, in the structure of the pixel portion illustrated in FIG. 16E, a driving method by which the level of voltage written to a pixel is lowered as described with reference to FIG. 16G and FIG. 16H, can be used.

Note that this embodiment can be combined with any of the other embodiments as appropriate.

Embodiment 4

In this embodiment, the structure of a transistor which can be used as a transistor included in the driver circuit which is an embodiment of the present invention is described.

Figure 17A:
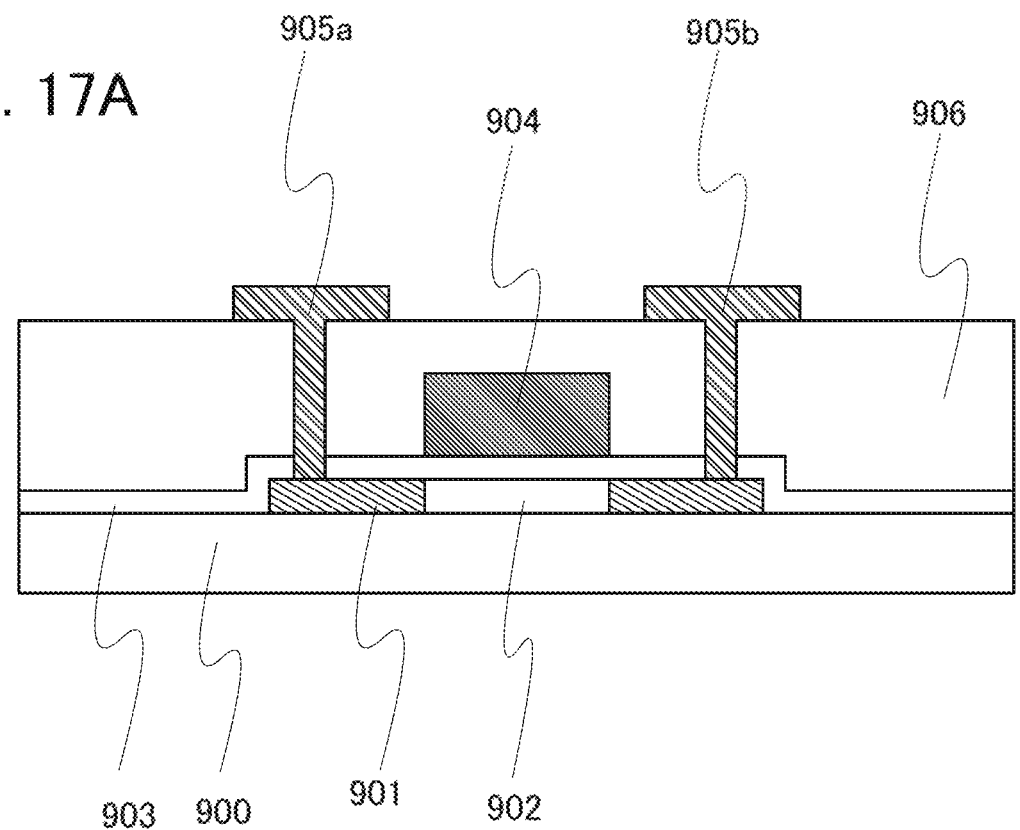
FIGS. 17A and 17B are cross-sectional schematic views each illustrating an example of the structure of a transistor which can be used for a driver circuit in Embodiment 4.
Figure 17B:
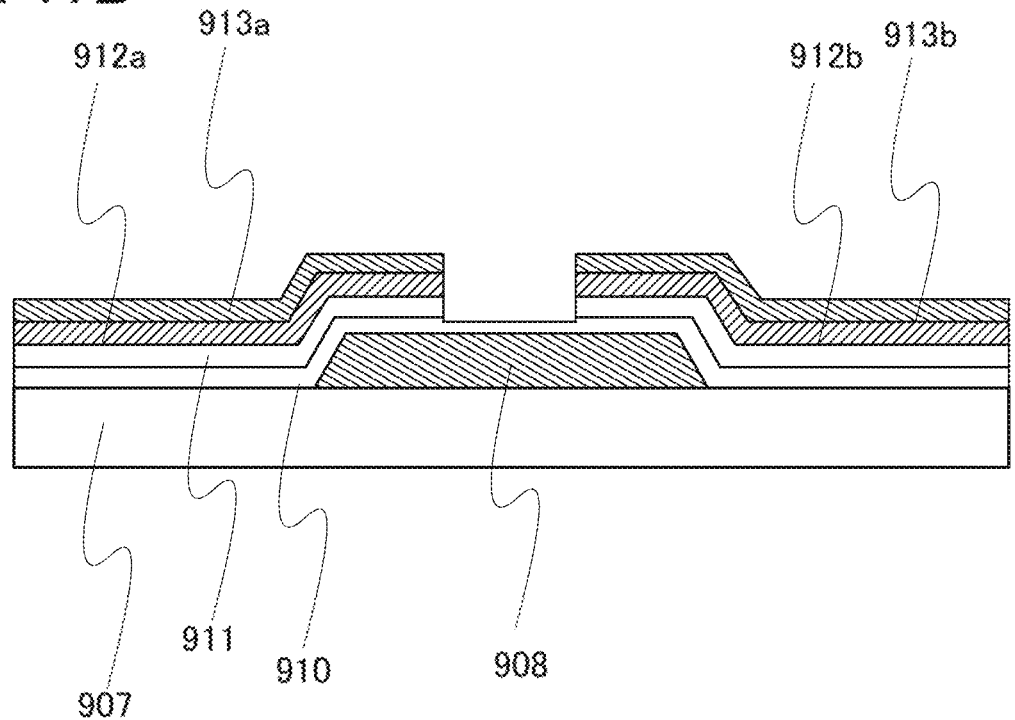

First, the structure of a transistor which can be used as a transistor included in a driver circuit of this embodiment is described with reference to FIGS. 17A and 17B. FIGS. 17A and 17B are cross-sectional schematic views each illustrating the structure of a transistor which can be used in the driver circuit of this embodiment. FIG. 17A illustrates an example of the structure of a top-gate transistor. FIG. 17B illustrates an example of the structure of a bottom-gate transistor.

The transistor illustrated in FIG. 17A includes a substrate 900, a semiconductor layer 902 which is provided over the substrate 900 and has impurity regions 901, a gate insulating film 903 which is provided so as to cover the semiconductor layer 902, a gate electrode 904 which is provided over part of the semiconductor layer 902 with the gate insulating film 903 interposed therebetween, an interlayer insulating film 906 which is provided over the gate electrode 904 and the gate insulating film 903 and has opening portions, and a pair of electrodes 905a and 905b which are provided so as to be in contact with the impurity regions 901 through the openings.

The transistor illustrated in FIG. 17B includes a substrate 907, a gate electrode 908 which is provided over the substrate 907, a gate insulating film 910 which is provided so as to cover the gate electrode 908, a semiconductor layer 911 which is provided over portions of the gate insulating film 910, where the gate electrode 908 is not provided, a pair of semiconductor layers 912a and 912b which are provided over the semiconductor layer 911 and have n-type conductivity, an electrode 913a which is provided over one of the pair of semiconductor layers, i.e., the semiconductor layer 912a, and an electrode 913b which is provided over the other of the pair of semiconductor layers, i.e., the semiconductor layer 912b.

As each of the substrate 900 and the substrate 907, a glass substrate, a quartz substrate, a silicon substrate, a metal substrate, a stainless steel substrate, or the like can be used, for example. Alternatively, as well as the above substrate, a flexible substrate can be used. A flexible substrate refers to a substrate which can be bent (is flexible). For example, a plastic substrate or the like formed using polycarbonate, polyalylate, polyethersulfone, or the like can be used. Alternatively, as each of the substrate 900 and the substrate 907, an attachment film (formed using polypropylene, polyester, vinyl, polyvinyl fluoride, polyvinyl chloride, or the like), paper of a fibrous material, a base material film (polyester, polyamide, an inorganic vapor deposition film, paper, or the like), or the like can be used, for example.

Each of the semiconductor layer 902 and the semiconductor layer 911 can be formed using an amorphous semiconductor film, a single crystal semiconductor film, a polycrystalline semiconductor film, a microcrystalline (also referred to as microcrystal or semi-amorphous) semiconductor film, or the like, or can be formed by stacking any of such semiconductor films. Alternatively, for each of the semiconductor layer 902 and the semiconductor layer 911, an oxide semiconductor (e.g., IGZO (InGaZnO)) can be used. Alternatively, each of the semiconductor layer 902 and the semiconductor layer 911 can be formed by sputtering, LPCVD, plasma-enhanced CVD, or the like, for example. Alternatively, a semiconductor film having a crystalline structure (a crystalline semiconductor film) which is obtained by crystallizing an amorphous semiconductor film by a known technique (a solid phase epitaxy method, a laser crystallization method, a crystallization method using a catalytic metal, or the like), for example, a polycrystalline silicon film can be used.

As each of the gate insulating film 903 and the gate insulating film 910, an insulating nitride film, an insulating oxide film, an insulating oxide film containing nitrogen, or the like can be used, for example. For example, a silicon oxynitride film, a silicon nitride oxide film, or the like can be used. Note that a silicon oxynitride film refers to a film which contains more oxygen than nitrogen and contains oxygen, nitrogen, silicon, and hydrogen at concentrations ranging from 55 to 65 atomic percent, 1 to 20 atomic percent, 25 to 35 atomic percent, and 0.1 to 10 atomic percent, respectively. Further, a silicon nitride oxide film refers to a film which contains more nitrogen than oxygen and contains oxygen, nitrogen, silicon, and hydrogen at concentrations ranging from 15 to 30 atomic percent, 20 to 35 atomic percent, 25 to 35 atomic percent, and 15 to 25 atomic percent, respectively.

As the semiconductor layer 912a and the semiconductor layer 912b, a semiconductor layer which has n-type conductivity and contains phosphorus or the like as an impurity element can be used.

For each of the gate electrode 904 and the gate electrode 908, an element selected from gold, silver, platinum, nickel, silicon, tungsten, chromium, molybdenum, iron, cobalt, copper, palladium, carbon, aluminum, manganese, titanium, tantalum, or the like; or an alloy which contains a plurality of the elements can be used, for example. Alternatively, a single-layer structure or a layered structure thereof can be used. As the alloy which contains a plurality of the elements, an alloy which contains aluminum and titanium; an alloy which contains aluminum, titanium, and carbon; an alloy which contains aluminum and nickel; an alloy which contains aluminum and carbon; an alloy which contains aluminum, nickel, and carbon; an alloy which contains aluminum and molybdenum; or the like can be used, for example. Alternatively, a light-transmitting material such as indium tin oxide (ITO), indium tin oxide containing silicon oxide (ITSO), or indium zinc oxide (IZO) can be used. Each of the gate electrode 904 and the gate electrode 908 can be formed by vapor deposition, sputtering, CVD, a printing method, or a droplet discharge method.

As the interlayer insulating film 906, an insulating nitride film, an insulating oxide film, an insulating oxide film containing nitrogen, or the like can be used, for example.

Each of the electrode 905a, the electrode 905b, the electrode 913a, and the electrode 913b serves as a source electrode or a drain electrode. For each of the electrode 905a, the electrode 905b, the electrode 913a, and the electrode 913b, an element selected from gold, silver, platinum, nickel, silicon, tungsten, chromium, molybdenum, iron, cobalt, copper, palladium, carbon, aluminum, manganese, titanium, tantalum, or the like; or an alloy which contains a plurality of the elements can be used, for example. Alternatively, a single-layer structure or a layered structure thereof can be used. As the alloy which contains a plurality of the elements, an alloy which contains aluminum and titanium; an alloy which contains aluminum, titanium, and carbon; an alloy which contains aluminum and nickel; an alloy which contains aluminum and carbon; an alloy which contains aluminum, nickel, and carbon; an alloy which contains aluminum and molybdenum; or the like can be used, for example. Alternatively, a light-transmitting material such as indium tin oxide (ITO), indium tin oxide containing silicon oxide (ITSO), or indium zinc oxide (IZO) can be used. Each of the gate electrode 904 and the gate electrode 908 can be formed by vapor deposition, sputtering, CVD, a printing method, or a droplet discharge method. The electrode 905a, the electrode 905b, the electrode 913a, and the electrode 913b can be formed using different materials. Each of the electrode 905a, the electrode 905b, the electrode 913a, and the electrode 913b can be formed by vapor deposition, sputtering, CVD, a printing method, or a droplet discharge method.

As described above, by using any of the above transistors, the driver circuit which is an embodiment of the present invention can be formed.

Figure 18:
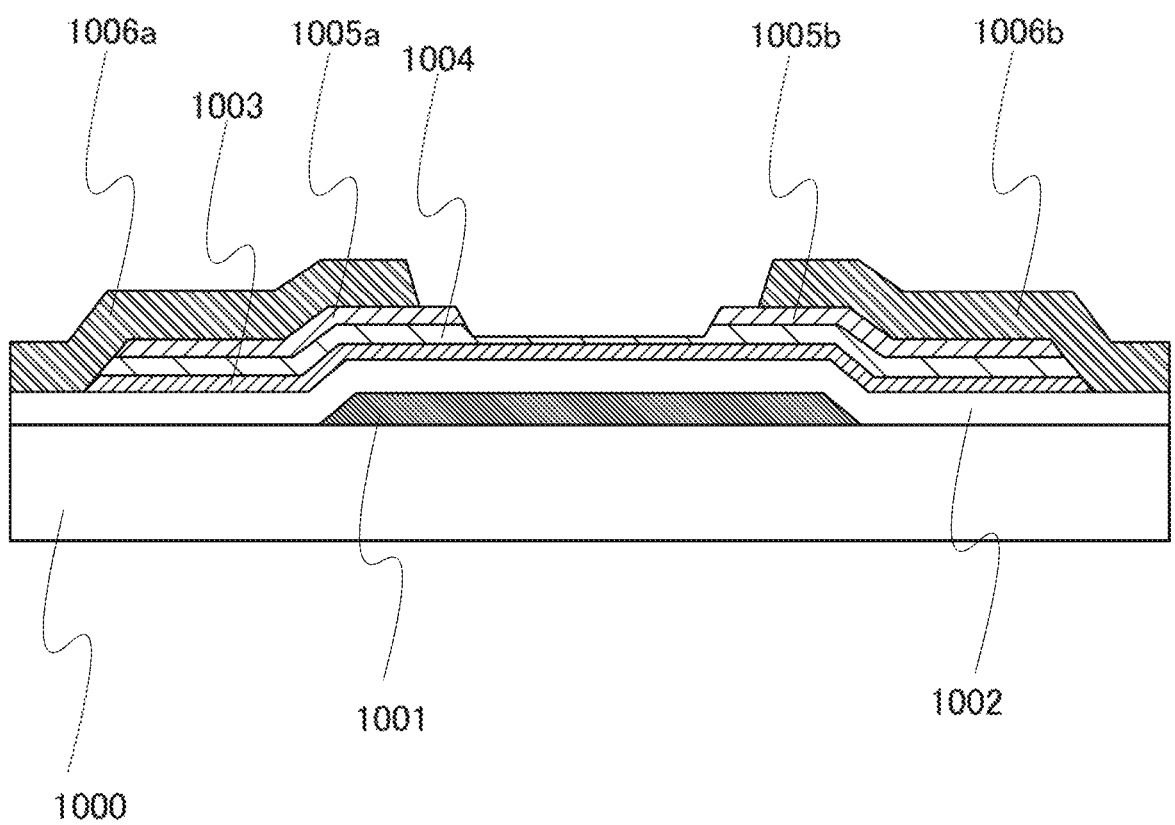
FIG. 18 is a cross-sectional schematic view illustrating an example of the structure of a transistor which can be used for the driver circuit in Embodiment 4.

Next, a different structure of a bottom-gate transistor is described with reference to FIG. 18 as a transistor which can be used in the driver circuit which is an embodiment of the present invention. FIG. 18 is a cross-sectional schematic view illustrating an example of the structure of a transistor which can be used as a transistor included in the driver circuit of this embodiment.

The transistor illustrated in FIG. 18 includes a substrate 1000, a gate electrode 1001 which is provided over the substrate 1000, a gate insulating film 1002 which is provided so as to cover the gate electrode 1001, a microcrystalline semiconductor layer 1003 which is provided over the gate electrode 1001 with the gate insulating film 1002 interposed therebetween, a buffer layer 1004 which is provided over the microcrystalline semiconductor layer 1003, a pair of semiconductor layers 1005a and 1005b which are provided over the buffer layer 1004, an electrode 1006a which is provided over one of the pair of semiconductor layers, i.e., the semiconductor layer 1005a, and an electrode 1006b which is provided over the other of the pair of semiconductor layers, i.e., the semiconductor layer 1005b.

As the substrate 1000, a substrate which can be used as each of the substrate 900 and the substrate 907 in FIGS. 17A and 17B can be used.

For the gate electrode 1001, a material and a structure which can be used for each of the gate electrode 904 and the gate electrode 908 in FIGS. 17A and 17B can be used.

For the gate insulating film 1002, a material which can be used for each of the gate insulating film 903 and the gate insulating film 910 in FIGS. 17A and 17B can be used.

The microcrystalline semiconductor layer 1003 is a layer containing a semiconductor having an intermediate structure between amorphous and crystalline (including single crystal and polycrystalline) structures. This semiconductor is a semiconductor having a third state, which is stable in terms of free energy, and is a crystalline substance having a short-range order and lattice distortion, and column-like or needle-like crystals with a grain size greater than or equal to 0.5 nm and less than or equal to 50 nm, preferably greater than or equal to 1 nm and less than or equal to 20 nm grown in the direction of a normal line with respect to a surface of the substrate. For the microcrystalline semiconductor layer 1003, microcrystalline silicon or the like can be used, for example.

The microcrystalline semiconductor layer 1003 has weak n-type conductivity when an impurity element for controlling valence electrons is not added intentionally. Thus, the threshold voltage Vth is preferably controlled by adding an impurity element which imparts p-type conductivity to the microcrystalline semiconductor layer which serves as a channel formation region of a thin film transistor at the same time as or after deposition. A typical example of an impurity element which imparts p-type conductivity is boron, and an impurity gas such as $B_2H_6$ or $BF_3$ is preferably mixed into silicon hydride at a proportion higher than or equal to 1 ppm and lower than or equal to 1000 ppm, preferably higher than or equal to 1 ppm and lower than or equal to 100 ppm. The concentration of boron is preferably higher than or equal to $1\times10^{14}$ atoms/cm$^3$ and lower than or equal to $6\times10^{16}$ atoms/cm$^3$, for example.

The oxygen concentration of the microcrystalline semiconductor layer 1003 is preferably lower than or equal to $1\times10^{19}$ cm$^3$, more preferably lower than or equal to $5\times10^{18}$ cm$^{-3}$ and each of the nitrogen concentration and the carbon concentration is preferably lower than or equal to $5\times10^{18}$ cm$^{-3}$, more preferably lower than or equal to $1\times10^{18}$ cm$^{-3}$. By decreasing the concentrations of oxygen, nitrogen, and carbon to be mixed into the microcrystalline semiconductor layer, a channel formation region of the microcrystalline semiconductor layer 1003 can be prevented from being changed into an n-type semiconductor. Further, when the concentrations of mixture of these elements are varied among elements, variations in the threshold voltage Vth occur. Thus, by decreasing these concentrations, variations in the threshold voltage Vth in the substrate can be reduced.

The carrier mobility of the microcrystalline semiconductor layer 1003 is higher than the carrier mobility of the buffer layer 1004. Thus, by using a thin film transistor, a channel formation region of which is formed using a microcrystalline semiconductor, as a transistor in a driver circuit of a display device, the size of the channel formation region, i.e., the size of the thin film transistor can be decreased. Therefore, the size of the circuit can be decreased, and the frame of the display device can be narrowed.

By providing the buffer layer 1004 over the microcrystalline semiconductor layer 1003, the amount of off-state current of the transistor can be made smaller than the amount of off-state current in the case of a single-layer structure of the microcrystalline semiconductor layer 1003. For the buffer layer 1004, amorphous silicon or the like can be used, for example.

The semiconductor layer 1005a and the semiconductor layer 1005b are formed using a semiconductor layer having an impurity element which imparts n-type or p-type conductivity. As the semiconductor layer having an impurity element, amorphous silicon or the like can be used, for example. As the impurity element, phosphorus may be added in the case of imparting n-type conductivity, and boron may be added in the case of imparting p-type conductivity. Alternatively, the semiconductor layer 1005a and the semiconductor layer 1005b can be formed using a microcrystalline semiconductor material or an amorphous semiconductor material. Each of the semiconductor layer 1005a and the semiconductor layer 1005b is preferably formed to a thickness greater than or equal to 2 nm and less than or equal to 50 nm. When each of the semiconductor layer 1005a and the semiconductor layer 1005b is formed to a small thickness, throughput can be improved.

Each of the electrode 1006a and the electrode 1006b serves as a source electrode or a drain electrode. For the electrode 1006a and the electrode 1006b, a material which can be used for the electrode 905a, the electrode 905b, the electrode 913a, and the electrode 913b in FIGS. 17A and 17B can be used.

Next, a method for manufacturing the transistor illustrated in FIG. 18 is described with reference to FIGS. 19A to 19C, FIGS. 20A to 20C, and FIGS. 21A and 21B. FIGS. 19A to 19C, FIGS. 20A to 20C, and FIGS. 21A and 21B are cross-sectional schematic views illustrating a method for manufacturing a transistor of this embodiment. Note that as for a thin film transistor having a microcrystalline semiconductor layer, an n-channel transistor has higher mobility than a p-channel transistor. It is preferable that all the thin film transistors formed over the same substrate have the same polarity because the number of manufacturing steps can be reduced. Therefore, in this embodiment, a method for manufacturing an n-channel transistor is described.

Figure 19A:
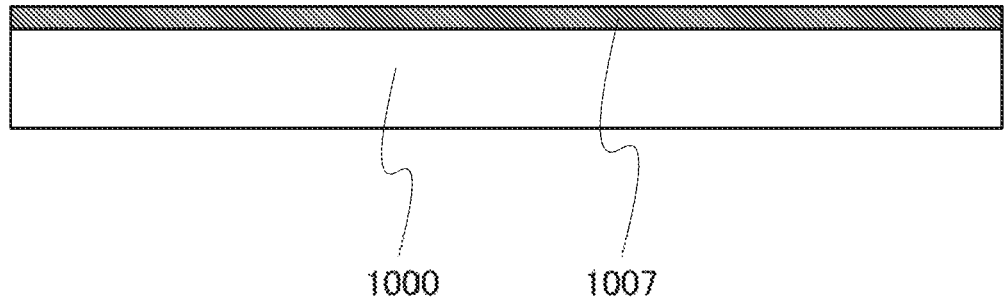
FIGS. 19A to 19C are cross-sectional schematic views illustrating an example of a method for manufacturing a transistor which can be used for the driver circuit in Embodiment 4.

First, as illustrated in FIG. 19A, a conductive film 1007 is formed over the substrate 1000. In this embodiment, a stacked-layer film of an aluminum film and a molybdenum film is formed as the conductive film 1007. Note that the conductive film 1007 can be formed by sputtering or vacuum vapor deposition.

Figure 19B:
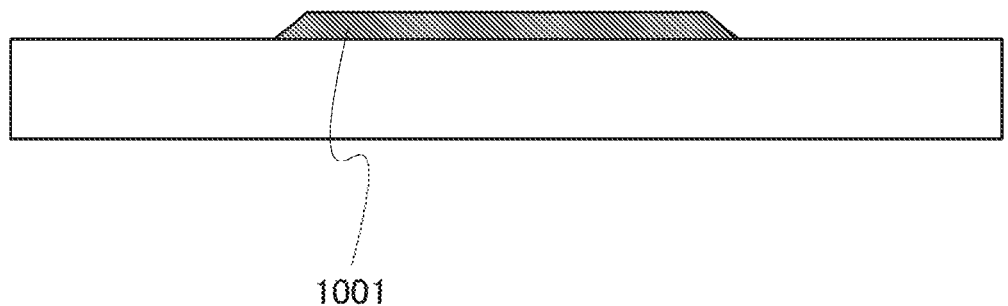

Next, as illustrated in FIG. 19B, part of the conductive film 1007 is etched, so that the gate electrode 1001 is formed. Specifically, the gate electrode 1001 can be formed in such a way that a resist is formed over the conductive film 1007 by photolithography or an inkjet method and the conductive film 1007 is selectively etched using the resist as a mask. Note that in this step, a scan line (e.g., the scan line 706 in FIG. 13) can be simultaneously formed, for example. Further, the resist is preferably removed after the etching.

End portions of the gate electrode 1001 which is formed by the etching are preferably tapered. When the end portions are tapered, coverage with a layer which is to be formed over the gate electrode 1001 in a later step can be improved.

Figure 19C:
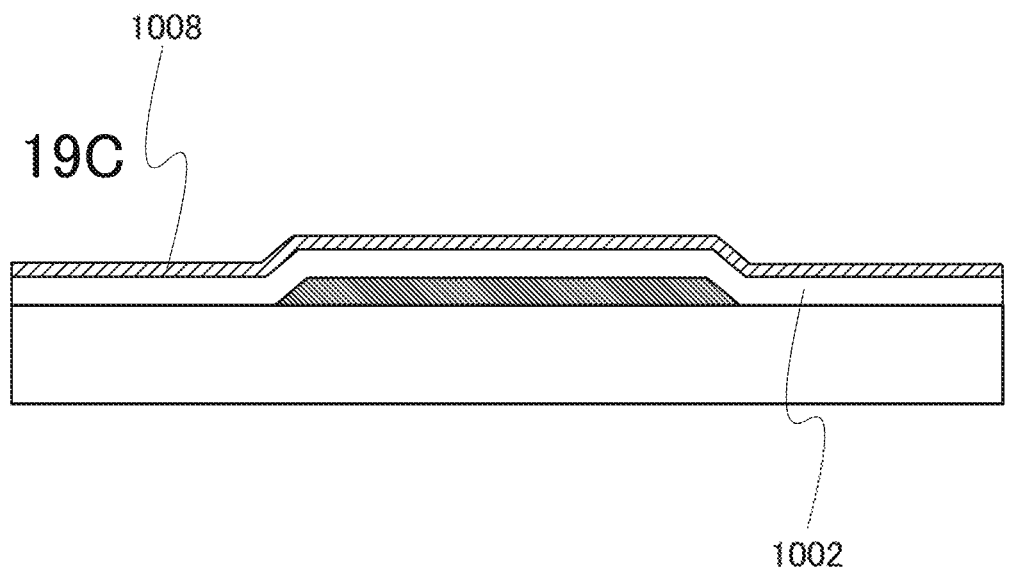

Next, as illustrated in FIG. 19C, the gate insulating film 1002 is formed so as to cover the gate electrode 1001. The gate insulating film 1002 can be formed by CVD, sputtering, or the like. In this embodiment, as an example, the gate insulating film 1002 is formed using a stacked-layer film of a nitride film or a nitride oxide film, and an oxide film or an oxynitride film.

A microcrystalline semiconductor film 1008 is formed over the gate insulating film 1002. The microcrystalline semiconductor film 1008 can be formed by high-frequency plasma-enhanced CVD with a frequency of several tens to several hundreds of megahertz or a microwave plasma-enhanced CVD apparatus with a frequency higher than or equal to 1 GHz, for example. Plasma which is generated by a microwave plasma-enhanced CVD apparatus with a frequency higher than or equal to 1 GHz has high electron density and many radicals are generated from a source gas and are supplied to the substrate 1000. Thus, radical reaction on the substrate surface is promoted and the deposition rate of the microcrystalline semiconductor film 1008 can be increased. Further, a microwave plasma CVD apparatus which includes a plurality of microwave generating apparatuses and a plurality of dielectric plates can generate wide plasma stably. Therefore, a film having high uniformity in film quality can be formed over a large substrate, and mass productivity (productivity) can be improved. In this embodiment, as an example, the case where microcrystalline silicon is used for the microcrystalline semiconductor film is described. A specific method for forming the microcrystalline semiconductor film 1008 is described below.

For example, the microcrystalline semiconductor film 1008 can be formed by diluting silicon hydride such as $SiH_4$ or $Si_2H_6$ with hydrogen or by diluting silicon hydride with hydrogen and one or plural kinds of rare gas elements selected from helium, argon, krypton, or neon. In that case, the flow ratio of hydrogen to silicon hydride is 5:1 to 200:1, preferably 50:1 to 150:1, more preferably 100:1. Note that instead of silicon hydride, $SiH_2Cl_2$, SiHCh, $SiCl_4$, $SiF_4$, or the like can be used.

Note that in the case of forming the microcrystalline semiconductor film 1008, crystals of the microcrystalline semiconductor film 1008 grow from a bottom portion of the film toward an upper portion of the film, and needle-like crystals are formed. This is because crystals grow so as to increase a crystal surface. However, even if crystals grow in this manner, the deposition rate of a microcrystalline semiconductor layer is about 1% to 10% of the deposition rate of an amorphous semiconductor layer.

Further, in this embodiment, after the microcrystalline semiconductor film 1008 is formed, treatment of irradiating the microcrystalline semiconductor film 1008 with laser light from the surface side of the microcrystalline semiconductor film 1008 (also referred to as laser process (LP) treatment) is preferably performed. The LP treatment is specifically described below.

In the LP treatment, the microcrystalline semiconductor film 1008 is preferably irradiated with laser light at energy density such that the microcrystalline semiconductor film 1008 does not melt. That is, the LP treatment is laser treatment by which solid-phase crystal growth which is performed by radiation heating without melting the microcrystalline semiconductor film 1008 is generated. In other words, the LP treatment utilizes a critical region in which the deposited microcrystalline semiconductor film 1008 does not become a liquid phase. Therefore, the LP treatment can also be referred to as critical growth.

The laser light can operate up to an interface between the microcrystalline semiconductor film 1008 and the gate insulating film 1002. Accordingly, when crystals on the surface side of the microcrystalline semiconductor film 1008 is used as nuclei, solid-phase crystal growth proceeds from the surface to the interface of the gate insulating film 1002, and substantially columnar crystals grow. Solid-phase crystal growth by the LP treatment does not increase crystal diameters but improves the crystallinity in a thickness direction.

In the LP treatment, when a laser beam is condensed in a long rectangular shape (is shaped into a linear laser beam), the microcrystalline semiconductor film 1008 formed over a glass substrate having a size of 730 mm×920 mm can be processed by one scanning of the laser beam, for example. In this case, the LP treatment is performed with a proportion of overlap of linear laser beams (an overlap ratio) of 0% to 90%, preferably 0% to 67%. Thus, the length of treatment time for each substrate is shortened, so that productivity can be improved. Note that the shape of a laser beam is not limited to a linear shape, and similar treatment can be performed when the shape of a laser beam is a plane shape. Further, the LP treatment is not limited by the size of the glass substrate, and the LP treatment can be used for substrates with a variety of sizes. When the LP treatment is performed, the crystallinity of a region of the interface between the microcrystalline semiconductor film 1008 and the gate insulating film 1002 is improved, so that electric characteristics of a transistor having a bottom-gate structure can be improved.

Through such a critical growth, unevenness (convexity called a ridge) generated on a surface of conventional low-temperature polysilicon is not formed, and the surface of the semiconductor film, on which the LP treatment is performed, is kept smoothed.

Therefore, the microcrystalline semiconductor film 1008 which is obtained by directly delivering laser light after the deposition has growth mechanism and film quality of a film to be formed, which are greatly different from those of a microcrystalline semiconductor film remaining deposited in a conventional technique or a microcrystalline semiconductor film modified by conduction heating.

Figure 20D:
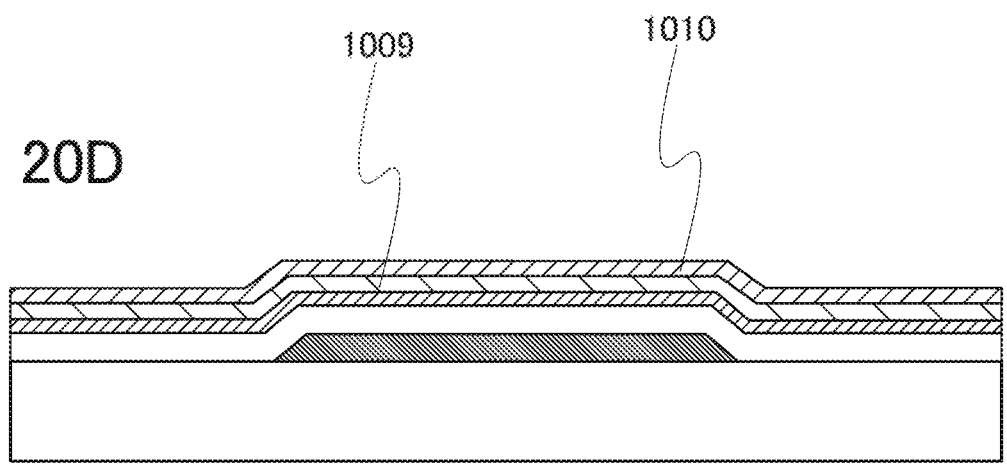
FIGS. 20A to 20C are cross-sectional schematic views illustrating the example of the method for manufacturing a transistor which can be used for the driver circuit in Embodiment 4.
Figure 20E:
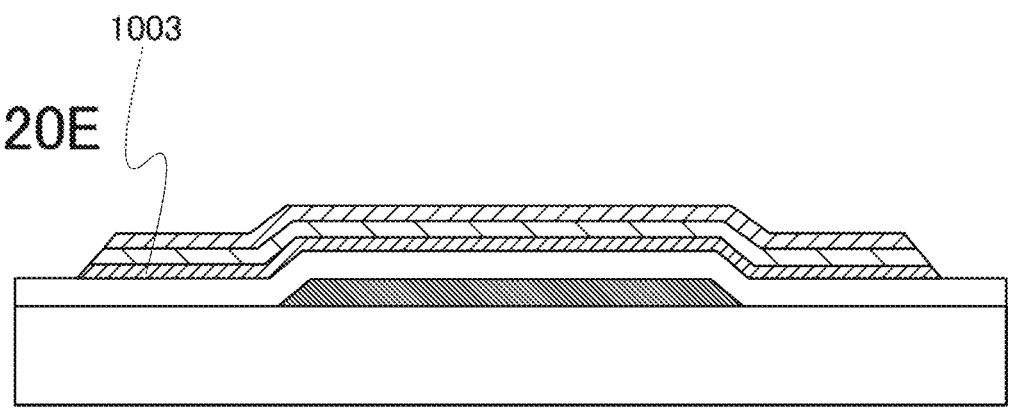
Figure 20F:
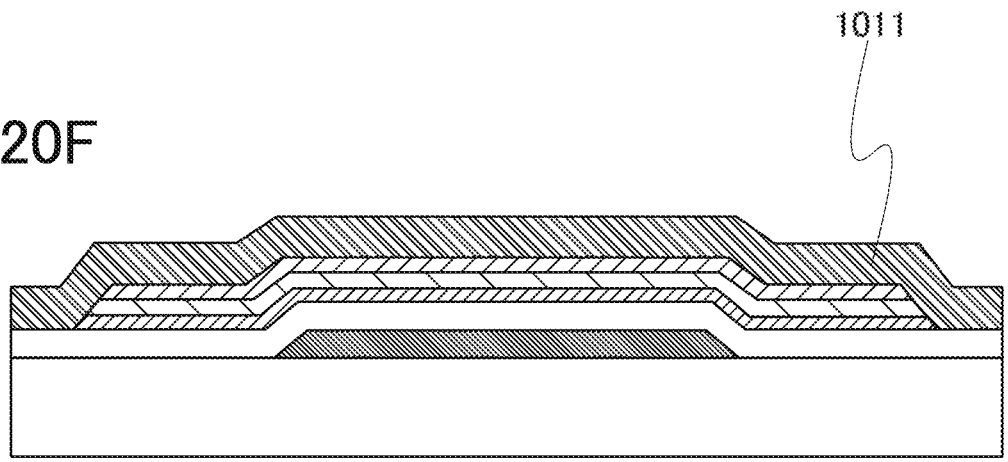

Next, as illustrated in FIG. 20A, an amorphous semiconductor film 1009 is formed over the microcrystalline film 1008.

The amorphous semiconductor film 1009 can be formed using silicon hydride such as Silla or $Si_2H_6$ by plasma-enhanced CVD. Alternatively, the amorphous semiconductor film 1009 can be formed by diluting silicon hydride with one or plural kinds of rare gas elements selected from helium, argon, krypton, or neon.

Alternatively, the amorphous semiconductor film 1009 containing hydrogen can be formed using hydrogen with a flow ratio of hydrogen to silicon hydride of 1:1 to 20:1, preferably 1:1 to 10:1, more preferably 1:1 to 5:1. By using silicon hydride, and nitrogen or ammonia, the amorphous semiconductor film 1009 containing nitrogen can be formed. Alternatively, by using silicon hydride and a gas containing fluorine, chlorine, bromine, or iodine (e.g., $F_2$, $Cl_2$, $Br_2$, $I_2$, HF, HCl, HBr, or HI), the amorphous semiconductor film 1009 containing fluorine, chlorine, bromine, or iodine can be formed. Note that instead of silicon hydride, $SiH_2Cl$, $SiHCl_3$, $SiCl_4$, $SiF_4$, or the like can be used. Note that the thickness of the amorphous semiconductor film 1009 is greater than or equal to 100 nm and less than or equal to 500 nm, preferably greater than or equal to 150 nm and less than or equal to 400 nm, more preferably greater than or equal to 200 nm and less than or equal to 300 nm. Note that in this case, hydrogen is supplied to the microcrystalline semiconductor film 1008. That is, by depositing the amorphous semiconductor film 1009 over the microcrystalline semiconductor film 1008, hydrogen is diffused into the microcrystalline semiconductor film 1008, so that dangling bonds can be terminated.

Alternatively, the amorphous semiconductor film 1009 can be formed by sputtering an amorphous semiconductor which is used as a target in hydrogen or a rare gas. In this case, when ammonia, nitrogen, or $N_2O$ is contained in an atmosphere, an amorphous semiconductor film containing nitrogen can be formed. Alternatively, when a gas containing fluorine, chlorine, bromine or iodine ($F_2$, $Cl_2$, $Br_2$, $I_2$, HF, HCl, HBr, HI or the like) is contained in the atmosphere, an amorphous semiconductor layer including fluorine, chlorine, bromine or iodine (e.g., $F_2$, $Cl_2$, $Br_2$, $I_2$, HF, HCl, HBr, or HI), an amorphous semiconductor film containing fluorine, chlorine, bromine, or iodine can be formed.

Alternatively, after forming the amorphous semiconductor film 1009, hydrogenation, nitridation, or halogenation of a surface of the amorphous semiconductor film 1009 may be performed through processing of the surface of the amorphous semiconductor film 1009 with hydrogen plasma, nitrogen plasma, or halogen plasma. Alternatively, the surface of the amorphous semiconductor film 1009 may be processed with helium plasma, neon plasma, argon plasma, krypton plasma, or the like.

It is preferable that the amorphous semiconductor film 1009 does not contain crystal grains. Therefore, when the amorphous semiconductor film 1009 is formed by high-frequency plasma-enhanced CVD with a frequency of several tens to several hundreds of megahertz or microwave plasma-enhanced CVD, deposition conditions are preferably controlled so that the amorphous semiconductor film 1009 does not contain crystal grains.

Note that the amorphous semiconductor film 1009 is formed so that an impurity which imparts one conductivity type, such as phosphorus or boron, is not contained. In particular, it is preferable that boron or phosphorus added to the microcrystalline semiconductor film 1008 in order to control the threshold voltage be not added to the amorphous semiconductor film 1009. For example, in the case where the amorphous semiconductor film 1009 contains phosphorus, a PN junction is formed between the microcrystalline semiconductor layer 1003 and the amorphous semiconductor film 1009. Alternatively, in the case where the amorphous semiconductor film 1009 contains boron, a PN junction is formed between the amorphous semiconductor film 1009, and the semiconductor layer 1005a and the semiconductor layer 1005b. Alternatively, in the case where the amorphous semiconductor 1009 contains both boron and phosphorus, a recombination center is generated, which causes leakage current. When the amorphous semiconductor 1009 does not contain such an impurity which imparts one conductivity type, a region where leakage current is generated is not provided, so that leakage current can be reduced. Further, when the amorphous semiconductor film 1009 to which an impurity which imparts one conductivity type, such as phosphorus or boron, is not added is provided between the semiconductor layer 1005a and the semiconductor layer 1005b, and the microcrystalline semiconductor layer 1003, diffusion of impurities contained in the microcrystalline semiconductor layer 1003 which serves as a channel formation region and the semiconductor layer 1005a and the semiconductor layer 1005b which serve as part of a source region and a drain region can be prevented.

In addition, a semiconductor film 1010 is formed over the amorphous semiconductor film 1009. In the case of using an impurity element which imparts n-type conductivity, phosphorus or the like is added, for example. In the case of adding phosphorus, phosphorus can be added by adding a gas such as $PH_3$ to silicon hydride. Alternatively, in the case of using an impurity element which imparts p-type conductivity, boron or the like is added, for example. In the case of adding boron, boron can be added by adding a gas such as $B_2H_6$ to silicon hydride.

Note that in this embodiment, it is preferable that the gate insulating film 1002, the microcrystalline semiconductor film 1008, and the amorphous semiconductor film 1009 be successively formed. More preferably, the gate insulating film 1002, the microcrystalline semiconductor film 1008, the amorphous semiconductor film 1009, and the semiconductor film 1010 are successively formed. By successive formation, since each film is not exposed to the atmosphere, each interface of stacked layers can be formed without being contaminated by an atmospheric constituent or a contaminant impurity element floating in the atmosphere. Thus, variations in electric characteristics of thin film transistors formed using these films can be reduced, and a driver circuit having high reliability can be manufactured with high yield.

Next, the microcrystalline semiconductor film 1008, the amorphous semiconductor film 1009, and the semiconductor film 1010 are selectively etched.

Specifically, first, a resist is formed on part of the semiconductor film 1010. For example, the resist is formed by photolithography, an inkjet method, or the like.

Next, the microcrystalline semiconductor film 1008, the amorphous semiconductor film 1009, and the semiconductor film 1010 are selectively etched by using the resist as a mask. In this case, the microcrystalline semiconductor layer 1003 is formed by the etching, as illustrated in FIG. 20B. Note that the resist is preferably removed after the etching.

Note that the etching is performed so that end portions of a layer where the microcrystalline semiconductor film, the amorphous semiconductor film, and an impurity semiconductor film are stacked are tapered. The taper angle is greater than or equal to 30° and less than or equal to 90°, preferably greater than or equal to 40° and less than or equal to 80°. When the etching is performed so that the end portions are tapered, the semiconductor film 1010 and the microcrystalline semiconductor film 1008 can be prevented from being directly in contact with each other. Further, a distance between the layers at the end portions can be sufficiently ensured, so that leakage current at the end portions can be reduced.

In addition, when the end portions are tapered, coverage with a layer which is to be formed thereover in a later step can be improved.

Next, as illustrated in FIG. 20C, a conductive film 1011 is formed over the semiconductor film 1010.

For example, the conductive film 1011 can be formed by sputtering, vacuum vapor deposition, or the like. Alternatively, the conductive film 1011 can be formed by discharging a conductive nanopaste of silver, gold, copper, or the like by a screen printing method, an inkjet method, or the like and baking the conductive nanopaste.

Next, the conductive film 1011 is etched. Specifically, first, a resist is selectively formed over the conductive film

Figure 21G:
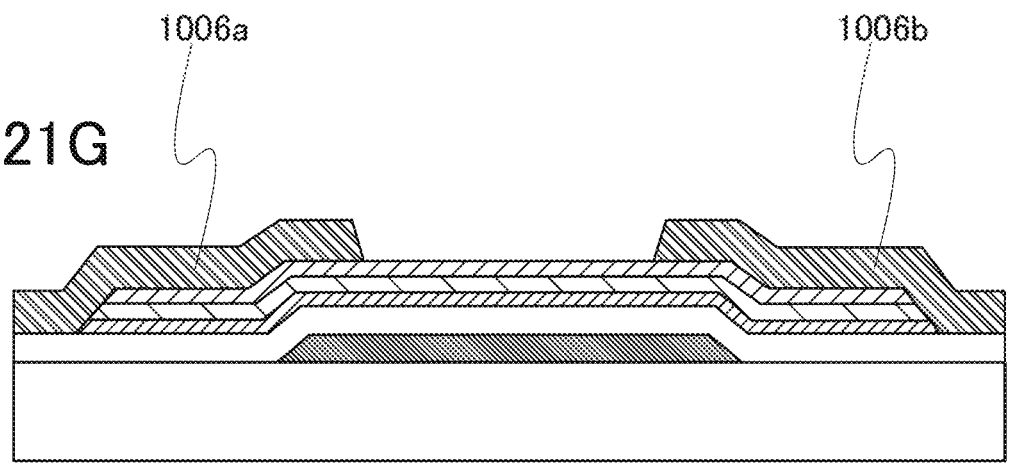
FIGS. 21A and 21B are cross-sectional schematic views illustrating the example of the method for manufacturing a transistor which can be used for the driver circuit in Embodiment 4.
Figure 21H:
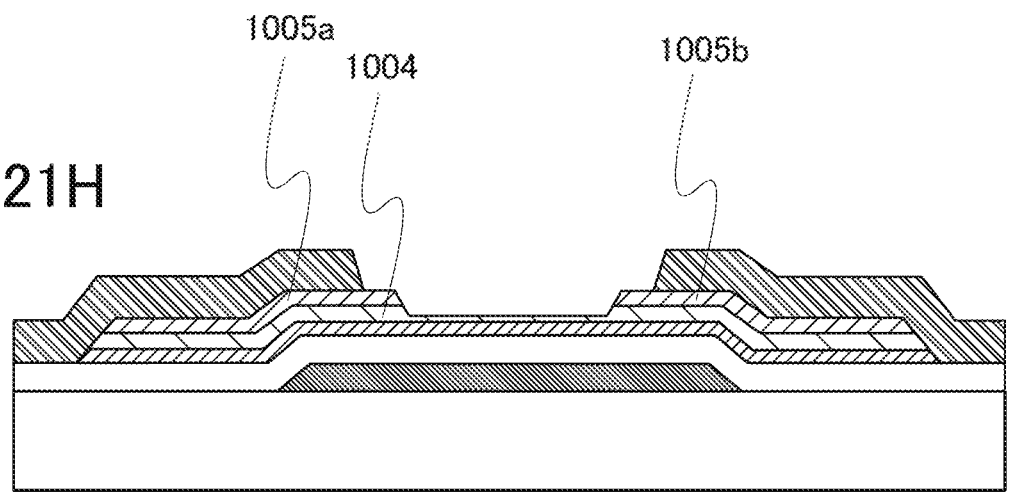

1011. Then, the conductive film 1011 is etched using the resist as a mask. In this case, the pair of electrodes 1006a and 1006b are formed, as illustrated in FIG. 21A.

Next, the semiconductor film 1010 and the amorphous semiconductor film 1009 are etched. By the etching, the buffer layer 1004 and the pair of semiconductor layers 1005a and 1005b are formed, as illustrated in FIG. 21B.

In this case, part of the buffer layer 1004 is etched, so that a depression is formed. The buffer layer 1004 is preferably formed to a thickness such that part of the amorphous semiconductor film 1009, which overlaps with the depression, remains. It is preferable that the thickness of a remaining portion (a portion overlapping with the depression) after the etching be approximately half the thickness before the etching. Note that the thickness before the etching is greater than or equal to 100 nm and less than or equal to 500 nm as described above, preferably greater than or equal to 150 nm and less than or equal to 400 nm, more preferably greater than or equal to 200 nm and less than or equal to 300 nm. The buffer layer 1004 serves as an etching stopper for the microcrystalline semiconductor layer 1003.

In this embodiment, a structure where end portions of the electrode 1006a and the electrode 1006b are not aligned with end portions of the semiconductor layer 1005a and the semiconductor layer 1005b can be used. Thus, a distance between the end portions of the electrode 1006a and the electrode 1006b is increased, so that a distance between one of the source electrode and the drain electrode and the other of the source electrode and the drain electrode is sufficiently large. Thus, leakage current can be reduced and short-circuit can be prevented. Further, since the end portions of the electrode 1006a and the electrode 1006b are not aligned with the end portions of the semiconductor layer 1005a and the semiconductor layer 1005b, an electric field does not easily concentrate on the end portions of the electrode 1006a and the electrode 1006b and the end portions of the semiconductor layer 1005a and the semiconductor layer 1005b. Therefore, a thin film transistor which has high reliability, small off-state current, and high withstand voltage can be formed.

Through the above steps, the thin film transistor illustrated in FIG. 18 can be manufactured.

Further, as illustrated in FIG. 18, a transistor having a microcrystalline semiconductor layer has higher reliability than a transistor having only an amorphous semiconductor layer. Thus, by using the transistor having a microcrystalline semiconductor layer in the driver circuit which is an embodiment of the present invention, malfunctions can be suppressed.

Note that this embodiment can be combined with any of the other embodiments as appropriate.

Embodiment 5

In this embodiment, electronic devices each using a display device which is an embodiment of the present invention for a display portion are described.

The display device which is an embodiment of the present invention can be used for display portions of a variety of electronic devices. Examples of electronic devices for which the display device which is an embodiment of the present invention can be used are cameras such as video cameras and digital cameras, goggle-type displays (head-mounted displays), navigation systems, audio reproducing devices (e.g., car audio equipment or audio component sets), laptops, game machines, mobile phones, portable information terminals (including mobile computers, mobile music players, a portable game machines, e-book readers, and devices which incorporate computers and have a plurality of functions by performing different kinds of data processing), image reproducing devices provided with recording media (specifically devices which reproduce the content of recording media such as DVDs (digital versatile disc) and have displays for displaying the reproduced images), and the like. Specific examples of such electronic devices are described with reference to FIGS. 22A to 22H and FIGS. 23A to 23C. FIGS. 22A to 22H and FIGS. 23A to 23C each illustrate an example of the structure of an electronic device of this embodiment.

Figure 22A:
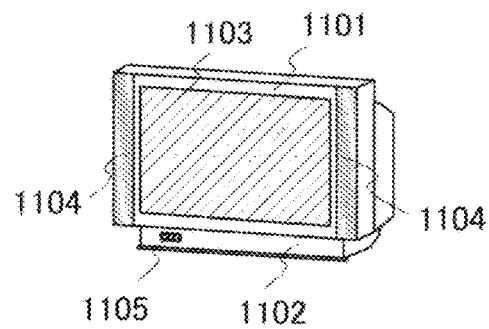
FIGS. 22A to 22H each illustrate an example of an electronic device in which a display device in Embodiment 5 can be used for a display portion.

FIG. 22A illustrates a display device, which includes a housing 1101, a support base 1102, a display portion 1103, speaker portions 1104, video input terminals 1105, and the like. The display device which is an embodiment of the present invention can be used for the display portion 1103. Note that the display device includes all display devices such as display devices for personal computers, for receiving TV broadcast, and for displaying advertisements, in its category.

Figure 22B:
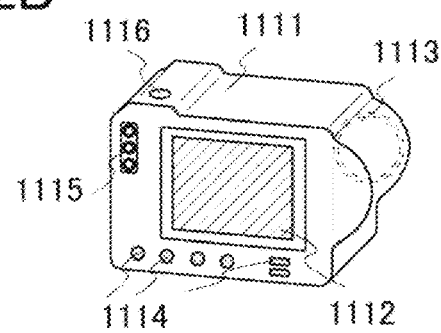

FIG. 22B illustrates a digital still camera, which includes a main body 1111, a display portion 1112, an image receiving portion 1113, operation keys 1114, an external connection port 1115, a shutter button 1116, and the like. The display device which is an embodiment of the present invention can be used for the display portion 1112.

Figure 22C:
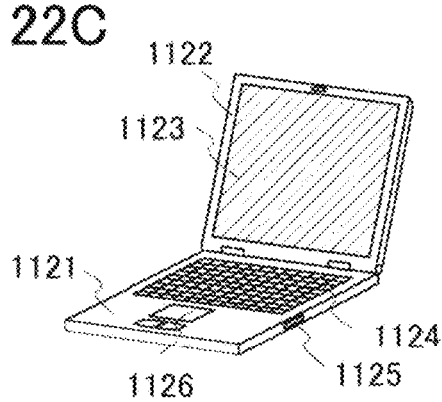

FIG. 22C illustrates a laptop, which includes a main body 1121, a housing 1122, a display portion 1123, a keyboard 1124, an external connection port 1125, a pointing device 1126, and the like. The display device which is an embodiment of the present invention can be used for the display portion 1123.

Figure 22D:
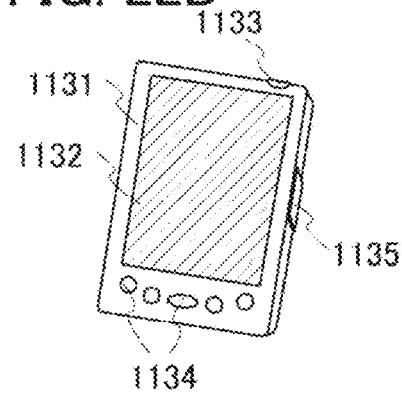

FIG. 22D illustrates a mobile computer, which includes a main body 1131, a display portion 1132, a switch 1133, operation keys 1134, an infrared port 1135, and the like. The display device which is an embodiment of the present invention can be used for the display portion 1132.

Figure 22E:
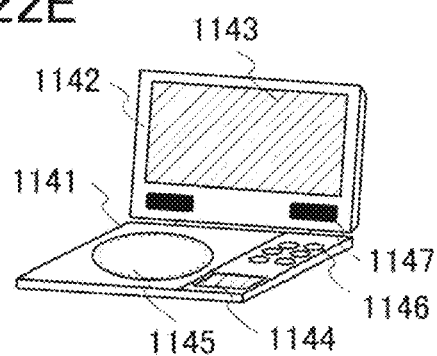

FIG. 22E illustrates a portable image reproducing device provided with a recording medium (specifically a DVD player), which includes a main body 1141, a housing 1142, a display portion A 1143, a display portion B 1144, a recording medium (e.g., a DVD) reading portion 1145, operation keys 1146, a speaker portion 1147, and the like. The display portion A 1143 mainly displays image data, and the display portion B 1144 mainly displays text data. The display device which is an embodiment of the present invention can be used for each of the display portion A 1143 and the display portion B 1144. Note that the image reproducing device provided with a recording medium includes a home-use game machine and the like in its category.

Figure 22F:
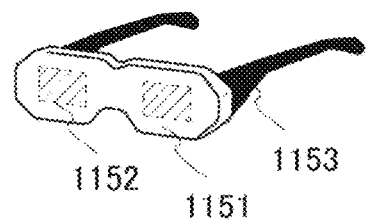

FIG. 22F illustrates a goggle-type display (a head-mounted display), which includes a main body 1151, a display portion 1152, and an arm portion 1153. The display device which is an embodiment of the present invention can be used for the display portion 1152.

Figure 22G:
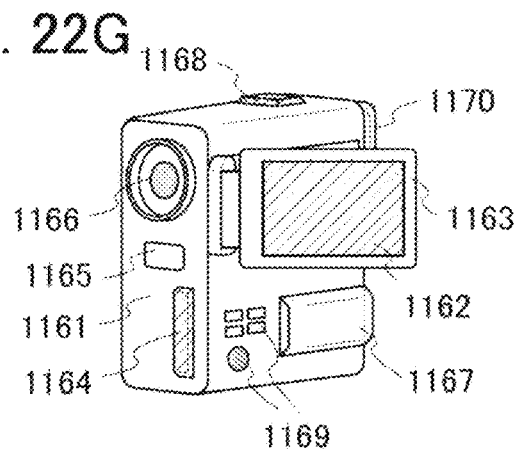

FIG. 22G illustrates a video camera, which includes a main body 1161, a display portion 1162, a housing 1163, an external connection port 1164, a remote control receiving portion 1165, an image receiving portion 1166, a battery 1167, an audio input portion 1168, operation keys 1169, and the like. The display device which is an embodiment of the present invention can be used for the display portion 1162.

Figure 22H:
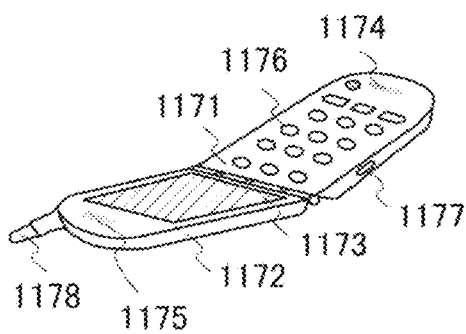

FIG. 22H illustrates a mobile phone, which includes a main body 1171, a housing 1172, a display portion 1173, an audio input portion 1174, an audio output portion 1175, operation keys 1176, an external connection port 1177, an antenna 1178, and the like. The display device which is an embodiment of the present invention can be used for the display portion 1173. Note that the display portion 1173 displays white text on a black screen, so that current consumption of the mobile phone can be suppressed.

Figure 23A:
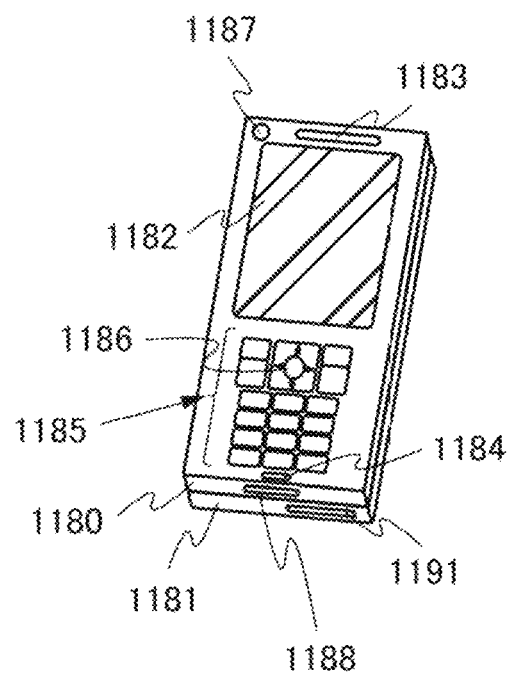
FIGS. 23A to 23C illustrate an example of an electronic device in which the display device in Embodiment 5 can be used for a display portion.
Figure 23B:
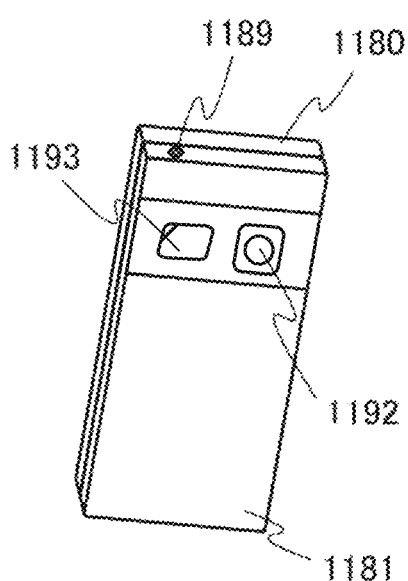
Figure 23C:
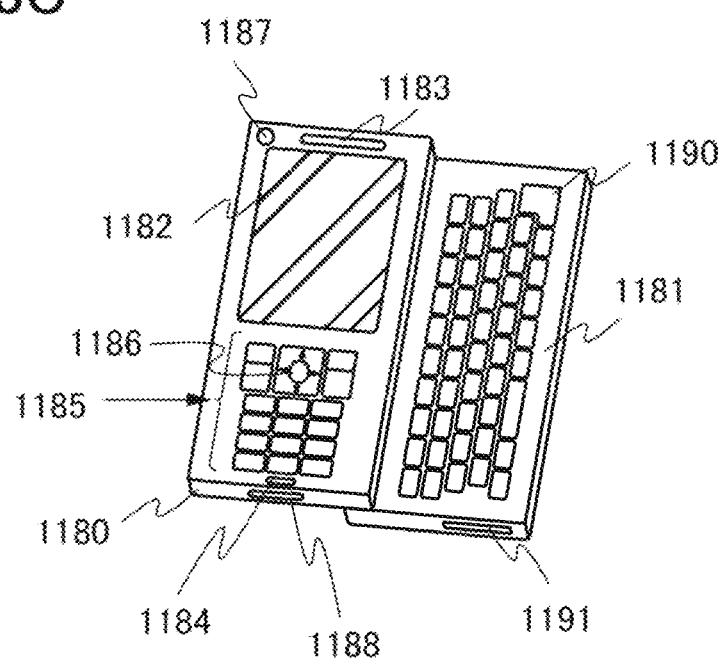

FIGS. 23A to 23C illustrate an example of a portable information terminal having a plurality of functions. FIG. 23A is a front view of the portable information terminal; FIG. 23B is a rear view of the portable information terminal; FIG. 23C is a development view of the portable information terminal. A portable information terminal whose example is illustrated in FIGS. 23A to 23C can have a plurality of functions. For example, in addition to a telephone function, such a portable information terminal can have a function of processing a variety of pieces of data by incorporating a computer.

The portable information terminal illustrated in FIGS. 23A to 23C includes two housings 1180 and 1181. The housing 1180 includes a display portion 1182, a speaker 1183, a microphone 1184, operation keys 1185, a pointing device 1186, a camera lens 1187, an external connection terminal 1188, an earphone terminal 1189, and the like. The housing 1181 includes a keyboard 1190, an external memory slot 1191, a camera lens 1192, a light 1193, and the like. In addition, an antenna is incorporated in the housing 1181.

Further, in addition to the above structure, a contactless IC chip, a small memory device, or the like may be incorporated.

The display device which is an embodiment of the present invention can be used for the display portion 1182 and a display direction changes as appropriate depending on the usage. Since the camera lens 1187 is provided on the same plane as the display portion 1182, videophone is possible. Further, still images and moving images can be taken with the camera lens 1192 and the light 1193 with the display portion 1182 used as a viewfinder. The speaker 1183 and the microphone 1184 can be used for videophone calls, recording, and playing sound, and the like as well as voice calls. With the operation keys 1185, operation of incoming and outgoing calls, simple information input for e-mail or the like, scrolling of a screen, cursor motion, and the like are possible. Further, the housings 1180 and 1181 which overlap with each other (FIG. 23A) can slide to be developed as illustrated in FIG. 23C so as to be used as the portable information terminal. In this case, smooth operation is possible by using the keyboard 1190 and the pointing device 1186. The external connection terminal 1188 can be connected to an AC adapter and a variety of cables such as a USB cable and can perform storing electricity and data communication with a personal computer or the like. Furthermore, a large amount of data can be stored and moved by inserting a recording medium into the external memory slot 1191.

Further, in addition to the above functions, an infrared communication function, a television reception function, or the like may be provided.

As described above, the display device which is an embodiment of the present invention can be used for the display portion of a variety of electronic devices as above.

Note that this embodiment can be combined with any of the other embodiments as appropriate.

This application is based on Japanese Patent Application serial no. 2008-157400 filed with Japan Patent Office on Jun. 17, 2008, the entire contents of which are hereby incorporated by reference.

What is claimed is:

1. A display device comprising:
a pixel portion comprising a first transistor; and
a signal line driver circuit comprising a second transistor, a third transistor, a fourth transistor, a fifth transistor, a sixth transistor, a seventh transistor, an eighth transistor, a ninth transistor, a tenth transistor, an eleventh transistor, and a twelfth transistor,
wherein a gate of the first transistor is electrically connected to a first wiring,
wherein one of a source and a drain of the second transistor is electrically connected to the first wiring,
wherein the other of the source and the drain of the second transistor is electrically connected to a second wiring,
wherein a gate of the second transistor is electrically connected to a gate of the fourth transistor,
wherein one of a source and a drain of the third transistor is electrically connected to the first wiring,
wherein a gate of the third transistor is electrically connected to a gate of the fifth transistor,
wherein one of a source and a drain of the fourth transistor is electrically connected to a third wiring,
wherein the other of the source and the drain of the fourth transistor is electrically connected to the second wiring,
wherein one of a source and a drain of the fifth transistor is electrically connected to the third wiring,
wherein the other of the source and the drain of the fifth transistor is electrically connected to a fourth wiring,
wherein one of a source and a drain of the sixth transistor is electrically connected to the gate of the second transistor,
wherein a gate of the sixth transistor is electrically connected to a fifth wiring,
wherein one of a source and a drain of the seventh transistor is electrically connected to the gate of the second transistor,
wherein the other of the source and the drain of the seventh transistor is electrically connected to the fourth wiring,
wherein a gate of the seventh transistor is electrically connected to one of a source and a drain of the eighth transistor,
wherein the other of the source and the drain of the eighth transistor is electrically connected to the fourth wiring,
wherein a gate of the eighth transistor is electrically connected to a sixth wiring,
wherein one of a source and a drain of the ninth transistor is electrically connected to the gate of the second transistor,
wherein the other of the source and the drain of the ninth transistor is electrically connected to the fourth wiring,
wherein a gate of the ninth transistor is electrically connected to the gate of the third transistor,
wherein one of a source and a drain of the tenth transistor is electrically connected to the gate of the third transistor,
wherein the other of the source and the drain of the tenth transistor is electrically connected to the fourth wiring,
wherein a gate of the tenth transistor is electrically connected to the gate of the second transistor,
wherein one of a source and a drain of the eleventh transistor is electrically connected to the gate of the third transistor,
wherein the other of the source and the drain of the eleventh transistor is electrically connected to the fourth wiring,
wherein a gate of the eleventh transistor is electrically connected to the sixth wiring, wherein one of a source and a drain of the twelfth transistor is electrically connected to the gate of the second transistor,
wherein the other of the source and the drain of the twelfth transistor is electrically connected to the fourth wiring,
wherein a gate of the twelfth transistor is electrically connected to a seventh wiring,
wherein a first output signal is output from the first wiring,
wherein a clock signal is input to the second wiring,
wherein a second output signal is output from the third wiring,
wherein a first potential is input to the fourth wiring,
wherein a first signal is input to the fifth wiring,
wherein a second signal is input to the sixth wiring,
wherein a third signal is input to the seventh wiring,
wherein the third transistor is configured to control a potential of the gate of the first transistor, and
wherein the sixth transistor is configured to control a potential of the gate of the second transistor.

2. The display device according to claim 1,
wherein the pixel portion further comprises a capacitor and a liquid crystal element,
wherein the capacitor is electrically connected to one of a source and a drain of the first transistor, and
wherein the liquid crystal element is electrically connected to the one of the source and the drain of the first transistor.

3. The display device according to claim 1,
wherein at least one of the second transistor, the third transistor, the fourth transistor, the fifth transistor, the sixth transistor, the seventh transistor, the eighth transistor, the ninth transistor, the tenth transistor, the eleventh transistor, and the twelfth transistor comprises:
a first conductive layer comprising a region configured to serve as a gate electrode;
a first insulating layer comprising a region configured to serve as a gate insulating film over the first conductive layer;
a first semiconductor layer comprising a region configured to serve as a channel formation region over the first insulating layer;
a second semiconductor layer over the first semiconductor layer;
a third semiconductor layer over the second semiconductor layer;
a fourth semiconductor layer over the second semiconductor layer;
a second conductive layer comprising a region configured to serve as a source electrode over the third semiconductor layer; and
a third conductive layer comprising a region configured to serve as a drain electrode over the fourth semiconductor layer.

4. The display device according to claim 3,
wherein the first conductive layer comprises a molybdenum film and a copper film,
wherein the first insulating layer is a stacked film comprising a plurality of insulating films comprising nitrogen, and
wherein each of the second conductive layer and the third conductive layer comprises a molybdenum film and an aluminum film.

5. A display device comprising:
a pixel portion comprising a first transistor; and
a signal line driver circuit comprising a second transistor, a third transistor, a fourth transistor, a fifth transistor, a sixth transistor, a seventh transistor, an eighth transistor, a ninth transistor, a tenth transistor, an eleventh transistor, a twelfth transistor, a thirteenth transistor, and a fourteenth transistor,
wherein a gate of the first transistor is electrically connected to a first wiring,
wherein one of a source and a drain of the second transistor is electrically connected to the first wiring,
wherein the other of the source and the drain of the second transistor is electrically connected to a second wiring,
wherein a gate of the second transistor is electrically connected to a gate of the fourth transistor,
wherein one of a source and a drain of the third transistor is electrically connected to the first wiring,
wherein a gate of the third transistor is electrically connected to a gate of the fifth transistor,
wherein one of a source and a drain of the fourth transistor is electrically connected to a third wiring,
wherein the other of the source and the drain of the fourth transistor is electrically connected to the second wiring,
wherein one of a source and a drain of the fifth transistor is electrically connected to the third wiring,
wherein the other of the source and the drain of the fifth transistor is electrically connected to a fourth wiring,
wherein one of a source and a drain of the sixth transistor is electrically connected to the gate of the second transistor,
wherein a gate of the sixth transistor is electrically connected to a fifth wiring,
wherein one of a source and a drain of the seventh transistor is electrically connected to the gate of the second transistor,
wherein the other of the source and the drain of the seventh transistor is electrically connected to the fourth wiring,
wherein a gate of the seventh transistor is electrically connected to one of a source and a drain of the eighth transistor,
wherein the other of the source and the drain of the eighth transistor is electrically connected to the fourth wiring,
wherein a gate of the eighth transistor is electrically connected to a sixth wiring,
wherein one of a source and a drain of the ninth transistor is electrically connected to the gate of the second transistor,
wherein the other of the source and the drain of the ninth transistor is electrically connected to the fourth wiring,
wherein a gate of the ninth transistor is electrically connected to the gate of the third transistor,
wherein one of a source and a drain of the tenth transistor is electrically connected to the gate of the third transistor,
wherein the other of the source and the drain of the tenth transistor is electrically connected to the fourth wiring,
wherein a gate of the tenth transistor is electrically connected to the gate of the second transistor,
wherein one of a source and a drain of the eleventh transistor is electrically connected to the gate of the third transistor,
wherein the other of the source and the drain of the eleventh transistor is electrically connected to the fourth wiring,
wherein a gate of the eleventh transistor is electrically connected to the sixth wiring,
wherein one of a source and a drain of the twelfth transistor is electrically connected to the gate of the second transistor, wherein the other of the source and the drain of the twelfth transistor is electrically connected to the fourth wiring,
wherein a gate of the twelfth transistor is electrically connected to a seventh wiring,
wherein one of a source and a drain of the thirteenth transistor is electrically connected to the first wiring,
wherein one of a source and a drain of the fourteenth transistor is electrically connected to the third wiring,
wherein a first output signal is output from the first wiring,
wherein a clock signal is input to the second wiring,
wherein a second output signal is output from the third wiring,
wherein a first potential is input to the fourth wiring,
wherein a first signal is input to the fifth wiring,
wherein a second signal is input to the sixth wiring,
wherein a third signal is input to the seventh wiring,
wherein the third transistor is configured to control a potential of the gate of the first transistor, and
wherein the sixth transistor is configured to control a potential of the gate of the second transistor.

6. The display device according to claim 5,
wherein the pixel portion further comprises a capacitor and a liquid crystal element,
wherein the capacitor is electrically connected to one of a source and a drain of the first transistor, and
wherein the liquid crystal element is electrically connected to the one of the source and the drain of the first transistor.

7. The display device according to claim 5,
wherein at least one of the second transistor, the third transistor, the fourth transistor, the fifth transistor, the sixth transistor, the seventh transistor, the eighth transistor, the ninth transistor, the tenth transistor, the eleventh transistor, the twelfth transistor, the thirteenth transistor, and the fourteenth transistor comprises:
a first conductive layer comprising a region configured to serve as a gate electrode;
a first insulating layer comprising a region configured to serve as a gate insulating film over the first conductive layer;
a first semiconductor layer comprising a region configured to serve as a channel formation region over the first insulating layer;
a second semiconductor layer over the first semiconductor layer;
a third semiconductor layer over the second semiconductor layer;
a fourth semiconductor layer over the second semiconductor layer;
a second conductive layer comprising a region configured to serve as a source electrode over the third semiconductor layer; and
a third conductive layer comprising a region configured to serve as a drain electrode over the fourth semiconductor layer.

8. The display device according to claim 7,
wherein the first conductive layer comprises a molybdenum film and a copper film,
wherein the first insulating layer is a stacked film comprising a plurality of insulating films comprising nitrogen, and
wherein each of the second conductive layer and the third conductive layer comprises a molybdenum film and an aluminum film.

9. A display device comprising:
a pixel portion comprising a first transistor; and
a signal line driver circuit comprising a second transistor, a third transistor, a fourth transistor, a fifth transistor, a sixth transistor, a seventh transistor, an eighth transistor, a ninth transistor, a tenth transistor, an eleventh transistor, a twelfth transistor, a thirteenth transistor, and a fourteenth transistor,
wherein a gate of the first transistor is electrically connected to a first wiring,
wherein one of a source and a drain of the second transistor is electrically connected to the first wiring,
wherein the other of the source and the drain of the second transistor is electrically connected to a second wiring,
wherein a gate of the second transistor is electrically connected to a gate of the fourth transistor,
wherein one of a source and a drain of the third transistor is electrically connected to the first wiring,
wherein a gate of the third transistor is electrically connected to a gate of the fifth transistor,
wherein one of a source and a drain of the fourth transistor is electrically connected to a third wiring,
wherein the other of the source and the drain of the fourth transistor is electrically connected to the second wiring,
wherein one of a source and a drain of the fifth transistor is electrically connected to the third wiring,
wherein the other of the source and the drain of the fifth transistor is electrically connected to a fourth wiring,
wherein one of a source and a drain of the sixth transistor is electrically connected to the gate of the second transistor,
wherein a gate of the sixth transistor is electrically connected to a fifth wiring,
wherein one of a source and a drain of the seventh transistor is electrically connected to the gate of the second transistor,
wherein the other of the source and the drain of the seventh transistor is electrically connected to the fourth wiring,
wherein a gate of the seventh transistor is electrically connected to one of a source and a drain of the eighth transistor,
wherein the other of the source and the drain of the eighth transistor is electrically connected to the fourth wiring,
wherein a gate of the eighth transistor is electrically connected to a sixth wiring,
wherein one of a source and a drain of the ninth transistor is electrically connected to the gate of the second transistor,
wherein the other of the source and the drain of the ninth transistor is electrically connected to the fourth wiring,
wherein a gate of the ninth transistor is electrically connected to the gate of the third transistor,
wherein one of a source and a drain of the tenth transistor is electrically connected to the gate of the third transistor,
wherein the other of the source and the drain of the tenth transistor is electrically connected to the fourth wiring,
wherein a gate of the tenth transistor is electrically connected to the gate of the second transistor,
wherein one of a source and a drain of the eleventh transistor is electrically connected to the gate of the third transistor,
wherein the other of the source and the drain of the eleventh transistor is electrically connected to the fourth wiring,
wherein a gate of the eleventh transistor is electrically connected to the sixth wiring, wherein one of a source and a drain of the twelfth transistor is electrically connected to the gate of the second transistor, wherein the other of the source and the drain of the twelfth transistor is electrically connected to the fourth wiring, wherein a gate of the twelfth transistor is electrically connected to a seventh wiring, wherein one of a source and a drain of the thirteenth transistor is electrically connected to the first wiring, wherein one of a source and a drain of the fourteenth transistor is electrically connected to the third wiring, wherein a gate of the thirteenth transistor is electrically connected to a gate of the fourteenth transistor, wherein a first output signal is output from the first wiring, wherein a clock signal is input to the second wiring, wherein a second output signal is output from the third wiring, wherein a first potential is input to the fourth wiring, wherein a first signal is input to the fifth wiring, wherein a second signal is input to the sixth wiring, wherein a third signal is input to the seventh wiring, wherein the third transistor is configured to control a potential of the gate of the first transistor, and wherein the sixth transistor is configured to control a potential of the gate of the second transistor.

10. The display device according to claim 9, wherein the pixel portion further comprises a capacitor and a liquid crystal element, wherein the capacitor is electrically connected to one of a source and a drain of the first transistor, and wherein the liquid crystal element is electrically connected to the one of the source and the drain of the first transistor.

11. The display device according to claim 9, wherein at least one of the second transistor, the third transistor, the fourth transistor, the fifth transistor, the sixth transistor, the seventh transistor, the eighth transistor, the ninth transistor, the tenth transistor, the eleventh transistor, the twelfth transistor, the thirteenth transistor, and the fourteenth transistor comprises:

a first conductive layer comprising a region configured to serve as a gate electrode;

a first insulating layer comprising a region configured to serve as a gate insulating film over the first conductive layer;

a first semiconductor layer comprising a region configured to serve as a channel formation region over the first insulating layer;

a second semiconductor layer over the first semiconductor layer;

a third semiconductor layer over the second semiconductor layer;

a fourth semiconductor layer over the second semiconductor layer;

a second conductive layer comprising a region configured to serve as a source electrode over the third semiconductor layer; and a third conductive layer comprising a region configured to serve as a drain electrode over the fourth semiconductor layer.

12. The display device according to claim 11, wherein the first conductive layer comprises a molybdenum film and a copper film, wherein the first insulating layer is a stacked film comprising a plurality of insulating films comprising nitrogen, and wherein each of the second conductive layer and the third conductive layer comprises a molybdenum film and an aluminum film.

* * * * *